US008642253B2

(12) United States Patent
Tsubaki

(10) Patent No.: US 8,642,253 B2
(45) Date of Patent: *Feb. 4, 2014

(54) RESIST COMPOSITION FOR NEGATIVE TONE DEVELOPMENT AND PATTERN FORMING METHOD USING THE SAME

(75) Inventor: Hideaki Tsubaki, Shizuoka (JP)

(73) Assignee: FUJIFILM Incorporated, Tokyo (JP)

( * ) Notice: Subject to any disclaimer, the term of this patent is extended or adjusted under 35 U.S.C. 154(b) by 128 days.

This patent is subject to a terminal disclaimer.

(21) Appl. No.: 12/941,386

(22) Filed: Nov. 8, 2010

(65) Prior Publication Data
US 2011/0045413 A1    Feb. 24, 2011

Related U.S. Application Data

(63) Continuation of application No. 12/664,117, filed as application No. PCT/JP2008/060799 on Jun. 12, 2008, now Pat. No. 7,851,140.

(30) Foreign Application Priority Data

Jun. 12, 2007    (JP) ................................. 2007-155083

(51) Int. Cl.
G03F 7/30       (2006.01)
G03F 7/32       (2006.01)

(52) U.S. Cl.
CPC G03F 7/30 (2013.01); G03F 7/325 (2013.01); Y10S 430/106 (2013.01); Y10S 430/111 (2013.01); Y10S 430/122 (2013.01); Y10S 430/123 (2013.01)
USPC ........ 430/325; 430/270.1; 430/905; 430/910; 430/921; 430/922

(58) Field of Classification Search
CPC .................................. G03F 7/30; G03F 7/325
USPC ............... 430/325, 270.1, 905, 910, 921, 922
See application file for complete search history.

(56) References Cited

U.S. PATENT DOCUMENTS

| | | | |
|---|---|---|---|
| 4,743,529 A | 5/1988 | Farid et al. | |
| 5,061,607 A | 10/1991 | Walls | |
| 5,738,975 A | 4/1998 | Nakano et al. | |
| 5,866,304 A | 2/1999 | Nakano et al. | |
| 6,660,459 B2 | 12/2003 | Babcock | |
| 6,872,503 B2 | 3/2005 | Wheland et al. | |
| 7,032,209 B2 | 4/2006 | Kobayashi | |
| 7,985,534 B2 | 7/2011 | Tsubaki | |
| 7,998,655 B2 | 8/2011 | Tsubaki | |
| 8,017,298 B2 | 9/2011 | Tsubaki | |
| 8,017,304 B2 | 9/2011 | Tarutani et al. | |
| 8,034,547 B2 | 10/2011 | Tsubaki et al. | |
| 8,071,272 B2 | 12/2011 | Tsubaki | |
| 8,088,557 B2 | 1/2012 | Tsubaki | |
| 8,227,183 B2 | 7/2012 | Tsubaki et al. | |
| 8,241,840 B2 | 8/2012 | Tsubaki et al. | |
| 2003/0022095 A1 | 1/2003 | Kai et al. | |
| 2003/0148211 A1 | 8/2003 | Kamabuchi et al. | |
| 2005/0227174 A1* | 10/2005 | Hatakeyama et al. | 430/270.1 |
| 2005/0266336 A1 | 12/2005 | Kodama | |
| 2006/0147836 A1 | 7/2006 | Hatakeyama et al. | |
| 2006/0154188 A1 | 7/2006 | Hirayama et al. | |
| 2006/0189138 A1 | 8/2006 | Nishimura et al. | |
| 2006/0257781 A1* | 11/2006 | Benoit et al. | 430/270.1 |
| 2007/0015084 A1* | 1/2007 | Rahman et al. | 430/270.1 |
| 2007/0054217 A1 | 3/2007 | Kodama et al. | |
| 2007/0087288 A1 | 4/2007 | Nishiyama et al. | |
| 2010/0009288 A1* | 1/2010 | Kato et al. | 430/270.1 |
| 2011/0045413 A1 | 2/2011 | Tsubaki | |
| 2011/0229832 A1 | 9/2011 | Kamimura et al. | |
| 2011/0250543 A1 | 10/2011 | Tsubaki | |
| 2011/0300485 A1 | 12/2011 | Tsubaki et al. | |
| 2011/0305992 A1 | 12/2011 | Tarutani et al. | |
| 2012/0088194 A1 | 4/2012 | Tsubaki | |
| 2012/0135355 A1 | 5/2012 | Tsubaki | |

FOREIGN PATENT DOCUMENTS

| | | |
|---|---|---|
| EP | 1 566 692 A1 | 8/2005 |
| EP | 1635218 A2 | 3/2006 |
| EP | 1 764 652 A2 | 3/2007 |
| JP | 6-138666 A | 5/1994 |
| JP | 06-194847 A | 7/1994 |
| JP | 07-049568 A | 2/1995 |
| JP | 07-199467 A | 8/1995 |
| JP | 7-261392 A | 10/1995 |
| JP | 2000-199953 A | 7/2000 |

(Continued)

OTHER PUBLICATIONS

Office Action dated Jun. 20, 2011 in U.S. Appl. No. 11/964,454.
International Search Report (PCT/ISA/210) issued for PCT/JP2008/060799, dated Jul. 8, 2008.
PCT/ISA/237 issued for PCT/JP2008/060799 dated Jul. 8, 2008.
Notification of Reasons for Refusal in counterpart Japanese Application No. 2009-519307, dated Mar. 30, 2010.
Sungkoo Lee, et al.; "Double Exposure Technology using silicon containing materials"; Advances in Resist Technology and Processing XXIII; Proc. of SPIE vol. 6153, 2006, pp. 1-7.
M. Maenhoudt, et al; "Double Patenting Scheme for sub-0.25 k1 single damascene structures at NA=0.75, =193nm" Optical Microlithography, XVII, Proceedings of SPIE vol. 5754, 2005; pp. 1508-1518.
Steven R. J. Brueck; "Extension of 193-nm immersion optical lithography to the 22-nm half-ptich node"; Optical Microlithography XVII, Proceedings of SPIE vol. 5377; 2004; pp. 1315-1322.

(Continued)

Primary Examiner — John Chu
(74) Attorney, Agent, or Firm — Sughrue Mion, PLLC

(57) ABSTRACT

To provide a resist composition for negative tone development, which can form a pattern having a good profile improved in the pattern undercut and moreover, can reduce the line edge roughness and enhance the in-plane uniformity of the pattern dimension, and a pattern forming method using the same.
A resist composition for negative tone development, comprising (A) a resin capable of increasing the polarity by the action of an acid to increase the solubility in a positive tone developer and decrease the solubility in a negative tone developer, (B) a compound capable of generating an acid having an acid dissociation index pKa of −4.0 or less upon irradiation with an actinic ray or radiation, and (C) a solvent; and a pattern forming method using the same.

19 Claims, 9 Drawing Sheets

(56) References Cited

FOREIGN PATENT DOCUMENTS

| | | |
|---|---|---|
| JP | 2001-109154 A | 4/2001 |
| JP | 2001-215731 A | 8/2001 |
| JP | 2003-76019 A | 3/2003 |
| JP | 2003-162061 A | 6/2003 |
| JP | 2003-231673 A | 8/2003 |
| JP | 2004-012554 A | 1/2004 |
| JP | 2004-026789 A | 1/2004 |
| JP | 2005-221721 A | 8/2005 |
| JP | 2006-84530 A | 3/2006 |
| JP | 2006-091421 A | 4/2006 |
| JP | 2006-156422 A | 6/2006 |
| JP | 2006-227174 A | 8/2006 |
| JP | 2006-258925 A | 9/2006 |
| JP | 2006-350212 A | 12/2006 |
| JP | 2007-140188 A | 6/2007 |

OTHER PUBLICATIONS

Extended European Search Report dated Jan. 3, 2011 in EP Application No. 08765543.7.

Office Action dated Jan. 9, 2013 in U.S. Appl. No. 13/588,762.

\* cited by examiner

FIG. 6
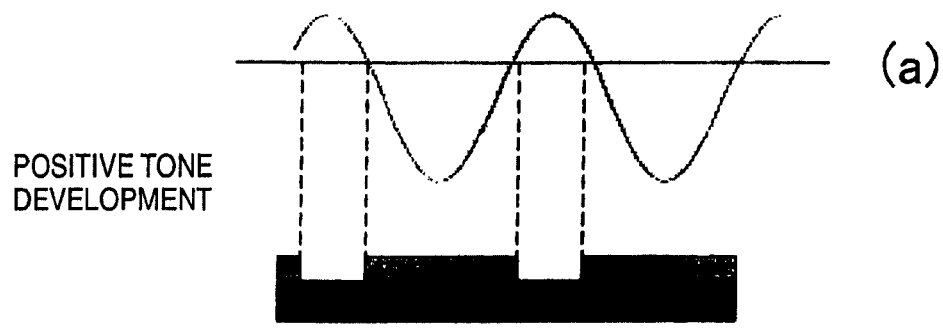
(a) POSITIVE TONE DEVELOPMENT
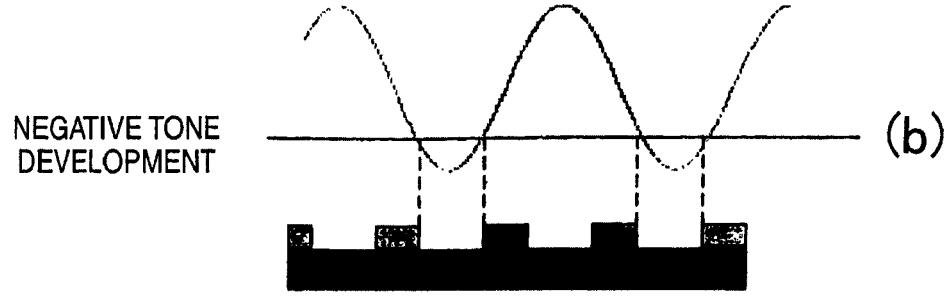
(b) NEGATIVE TONE DEVELOPMENT

RESIST COMPOSITION FOR NEGATIVE TONE DEVELOPMENT AND PATTERN FORMING METHOD USING THE SAME

CROSS-REFERENCE TO RELATED PATENT APPLICATIONS

This is a Continuation of application Ser. No. 12/644,117, filed Dec. 11, 2009, which is a National Stage entry of PCT/JP2008/060799, filed Jun. 12, 2008, and claims priority from Japanese Patent Application No. 2007-155083, filed Jun. 12, 2007. The entire disclosures of the prior applications are hereby incorporated by reference.

TECHNICAL FIELD

The present invention relates to a resist composition for negative tone development, which is used in the process of producing a semiconductor such as IC, in the production of a circuit board for liquid crystal, thermal head and the like, and in the lithography process of other photo-fabrication processes, and a pattern forming method using the same. More specifically, the present invention relates to a resist composition for negative tone development, which is suitably usable in performing exposure by an ArF exposure device or immersion-type projection exposure device using a light source that emits far ultraviolet light at a wavelength of 300 nm or less, and a pattern forming method using the same.

BACKGROUND ART

Since the advent of a resist for KrF excimer laser (248 nm), an image forming method called chemical amplification is used as an image forming method for a resist so as to compensate for sensitivity reduction caused by light absorption. For example, the image forming method by positive tone chemical amplification is an image forming method of decomposing an acid generator in the exposed area upon exposure to produce an acid, converting an alkali-insoluble group into an alkali-soluble group by using the generated acid as a reaction catalyst in the baking after exposure (PEB: Post Exposure bake), and removing the exposed area by alkali development.

Along with miniaturization of a semiconductor device, the trend is moving into a shorter wavelength of the exposure light source and a higher numerical aperture (high NA) of the projection lens, and an exposure machine using an ArF excimer laser with a wavelength of 193 nm as a light source has been so far developed. As commonly well known, these factors can be expressed by the following formulae:

(Resolution)=$k_1 \cdot (\lambda/NA)$ (Depth of focus)=$\pm k_2 \cdot \lambda/NA^2$ wherein $\lambda$ is the wavelength of the exposure light source, NA is the numerical aperture of the projection lens, and $k_1$ and $k_2$ are coefficients related to the process.

A so-called immersion method of filling a high refractive-index liquid (hereinafter sometimes referred to as an "immersion liquid") between the projection lens and the sample has been conventionally advocated as a technique for raising the resolution.

As for the "effect of immersion", assuming that $NA_0 = \sin \theta$, the above-described resolution and depth of focus in the immersion can be expressed by the following formulae:

(Resolution)=$k_1 \cdot (\lambda_0/n)/NA_0$ (Depth of focus)=$\pm k_2 \cdot (\lambda_0/n)/NA_0^2$ wherein $\lambda_0$ is the wavelength of exposure light in air, n is the refractive index of the immersion liquid based on air, and $\theta$ is the convergence half-angle of the beam.

That is, the effect of immersion is equal to use of an exposure wavelength of 1/n. In other words, in the case of a projection optical system with the same NA, the depth of focus can be made n times larger by the immersion. This is effective for all pattern profiles and can be combined with the super-resolution technology under study at present, such as phase-shift method and modified illumination method.

A double exposure technology and a double patterning technology are being advocated as a technique for more enhancing the resolution. These technologies are to make small $k_1$ in the above-described formula of resolution and are positioned as a resolution-increasing technique.

In the conventional pattern formation of an electronic device such as semiconductor device, a mask or reticle pattern in a size of 4 to 5 times larger than the pattern intended to form is reduced and transferred on an exposure target such as wafer by using a reduction projection exposure apparatus.

However, the dimensional miniaturization brings about a problem that in the conventional exposure system, lights irradiated on adjacent patterns interfere with each other to decrease the optical contrast. Therefore, in such a technique, it is devised to divide the exposure mask design into two or more parts and synthesize an image by independently exposing respective masks. In this double exposure system where the exposure mask design is divided, the image of the design must be again synthesized on an exposure target (wafer) and therefore, the division of the mask design must be devised so that the pattern on the reticle can be faithfully reproduced on the exposure target.

Studies on applying the effect of these double exposure systems to the transfer of a fine image pattern of a semiconductor device are introduced, for example, in Patent Document 1.

Also, the recent progress of the double exposure technology is reported, for example, in Non-Patent Documents 1, 2 and 3.

However, when the pattern formation is performed by merely applying a conventional resist composition to a conventional resist process, there arises a problem that sufficient exposure margin or depth of focus cannot be obtained, because in these double exposure systems, the pattern formation needs to be performed in the vicinity of resolution limit of the resist.

In other words, if a pattern forming process as described, for example, in Patent Document 2 where a resist composition containing a resin capable of increasing the polarity upon exposure is applied on a substrate and the resist film is exposed and developed to dissolve the exposed area with an alkali developer, or a pattern forming process as described, for example, in Patent Document 3 where a resist composition containing a resin capable of increasing the molecular weight upon exposure is applied on a substrate and the resist film is exposed and developed to dissolve the unexposed area with an alkali developer, is applied to the double exposure process, a sufficiently high resolving performance cannot be obtained.

With respect to the developer for g-line, i-line, KrF, ArF, EB or EUV lithography, an aqueous alkali developer of 2.38 mass % TMAH (tetramethylammonium hydroxide) is being used at present for general purposes.

Other than the above-described developer, for example, Patent Document 4 describes a developer for developing a resist material containing a copolymer of a styrene-based monomer and an acryl-based monomer and dissolving the exposed portion, where the developer contains an aliphatic linear ether-based solvent or aromatic ether-based solvent and a ketone-based solvent having a carbon number of 5 or more; Patent Document 5 describes a developer for developing a resist material whose molecular weight is decreased as a result of breakage of the polymer chain upon irradiation with radiation, thereby dissolving the exposed portion, where the developer contains at least two or more acetic acid groups, ketone groups, ether groups or phenyl groups and has a molecular weight of 150 or more; and Patent Document 6 describes a developer for developing the unexposed portion of a resist material mainly composed of a photosensitive polyhydroxy ether resin obtained by the reaction of a polyhydroxy ether resin with a glycidyl (meth)acrylate, where the developer is an aromatic compound having a carbon number of 6 to 12 or a mixed solvent containing 50 mass % or more of an aromatic compound having a carbon number of 6 to 12.

Forming a pattern with overall good performance is of course preferred, but it is actually very difficult to find out an appropriate combination of a resist composition, a developer, a rinsing solution and the like required therefor, and improvements are being demanded. In particular, the resolved line width of the resist becomes finer, and this involves requirements to improve the profile such as pattern undercut, improve the line edge roughness performance of line pattern, and further improve the in-plane uniformity of pattern dimension.

Furthermore, the thing that is provided by the above-described combinations of a resist composition and a developer is only a system of forming a pattern by combining a specific resist composition with a high-polarity alkali developer or a developer containing a low-polarity organic solvent. That is, as shown in FIG. 1, in the case of a positive tone system (a combination of a resist composition and a positive tone developer), a material for performing pattern formation by selectively dissolving and removing a region having strong light irradiation intensity out of the spatial frequency of an optical image is merely provided. On the other hand, as for the combination of a negative tone system (a resist composition and a negative tone developer), a material system for performing pattern formation by selectively dissolving and removing a region having a weak light irradiation intensity is merely provided.

The term "positive tone developer" as used herein indicates a developer that selectively dissolves and removes the exposed area not lower than a predetermined threshold value shown by a solid line in FIG. 1, and the "negative tone developer" indicates a developer that selectively dissolves and removes the exposed area not higher than the predetermined threshold value. A development step using a positive tone developer is called positive tone development (sometimes referred to as a positive tone development step), and a development step using a negative tone developer is called negative tone development (sometimes referred to as a negative tone development step).

On the other hand, a double developing technique as a double patterning technology for enhancing the resolution is described in Patent Document 7. In this example, an image forming method by chemical amplification in general is utilized, and by making use of a property that the polarity of a resin in a resist composition when exposed becomes a high polarity in a high light intensity region and becomes a low polarity in a low light intensity region, a high exposure region of a specific resist film is dissolved with a high-polarity developer, thereby effecting positive tone development, while a low exposure region is dissolved with a low-polarity developer, thereby effecting negative tone development. More specifically, as shown in FIG. 2, a region not lower than an exposure dose E2 of irradiated light 1 is dissolved using an aqueous alkali solution as the positive tone developer, and a region not higher than an exposure dose E1 is dissolved using a specific organic solvent as the negative tone developer, whereby, as shown in FIG. 2, a region with a medium exposure dose (between E2 and E1) is allowed to remain without being developed and an L/S pattern 3 having a pitch half the pitch of the exposure mask 2 is formed on a wafer 4.

However, it is very difficult to select an optimal combination of a resist composition and a negative tone developer, and in the example above, there is a problem that developability when using a negative tone developer is bad.

Furthermore, in forming a fine pattern by double development, merely giving good resolution on use of a negative tone or positive tone developer alone is insufficient, but the resist is required to exhibit good pattern resolution for both a negative tone developer and a positive tone developer.

Patent Document 1: JP-A-2006-156422 (the term "JP-A" as used herein means an "unexamined published Japanese patent application")
Patent Document 2: JP-A-2001-109154
Patent Document 3: JP-A-2003-76019
Patent Document 4: JP-A-2001-215731
Patent Document 5: JP-A-2006-227174
Patent Document 6: JP-A-6-194847
Patent Document 7: JP-A-2000-199953
Non-Patent Document 1: SPIE Proc 5754, 1508 (2005)
Non-Patent Document 2: SPIE Proc 5377, 1315 (2004)
Non-Patent Document 3: SPIE Proc 61531k-1 (2006)

DISCLOSURE OF THE INVENTION

Problems that the Invention is to Solve

An object of the present invention is to solve those problems and for stably forming a high-precision fine pattern and thereby producing a highly integrated electronic device with high precision, provide a resist composition for negative tone development, which can form a pattern having a good profile improved in the pattern undercut and moreover, can reduce the line edge roughness and enhance the in-plane uniformity of the pattern dimension, and a pattern forming method using the same.

Means for Solving the Problems

The present invention has the following constructions, and the above-described object of the present invention can be attained by these constructions.

(1) A resist composition for negative tone development, comprising:
(A) a resin capable of increasing a polarity by an action of an acid to increase a solubility in a positive tone developer and decrease a solubility in a negative tone developer;
(B) a compound capable of generating an acid having an acid dissociation index pKa of −4.0 or less upon irradiation with an actinic ray or radiation; and
(C) a solvent.

(2) The resist composition for negative tone development as described in (1),
wherein (B) the compound capable of generating an acid having an acid dissociation index pKa of −4.0 or less upon irradiation with an actinic ray or radiation is a compound capable of generating an acid represented by the following formula (P-1):

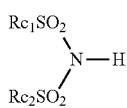

(P-1)

wherein each of $Rc_1$ and $Rc_2$ independently represents an organic group, and $Rc_1$ and $Rc_2$ may combine with each other to form a ring.

(3) The resist composition for negative tone development as described in (1) or (2), wherein the negative tone development is performed using a negative tone developer containing at least one kind of a solvent selected from organic solvents having a vapor pressure at 20° C. of 5 kPa or less.

(4) A pattern forming method, comprising:

(i) a step of applying a resist composition for negative tone development, which contains (A) a resin capable of increasing a polarity by an action of an acid to increase a solubility in a positive tone developer and decrease a solubility in a negative tone developer, (B) a compound capable of generating an acid represented by the following formula (P-1) upon irradiation with an actinic ray or radiation, and (C) a solvent;

(ii) an exposure step; and (iv) a step of performing development by using a negative tone developer:

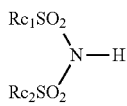

(P-1)

wherein each of $Rc_1$ and $Rc_2$ independently represents an organic group, and $Rc_1$ and $Rc_2$ may combine with each other to form a ring.

(5) The pattern forming method as described in (4), further comprising:

(iii) a step of performing development by using a positive tone developer.

Advantage of the Invention

According to the present invention, a resist composition for negative tone development, which can form a pattern having a good profile improved in the pattern undercut and moreover, can reduce the line edge roughness and enhance the in-plane uniformity of the pattern dimension, and a pattern forming method using the same can be provided.

BRIEF DESCRIPTION OF THE DRAWINGS

FIG. 6 is a schematic view showing the relationship among positive tone development, negative tone development and exposure dose in the method of the present invention.

Figure 1:
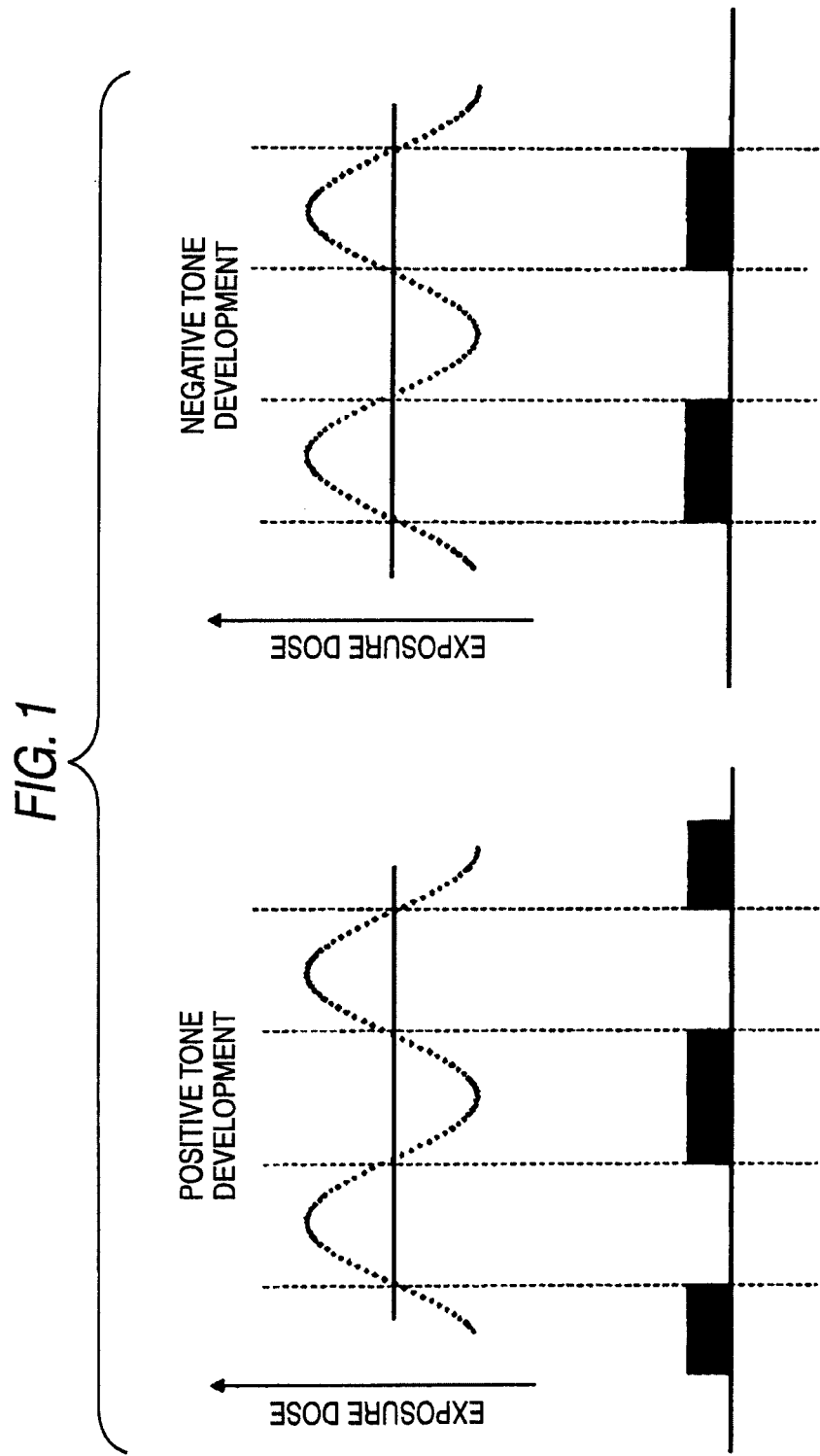
FIG. 1 is a schematic view showing the relationship among positive tone development, negative tone development and exposure dose in a conventional method.
Figure 2:
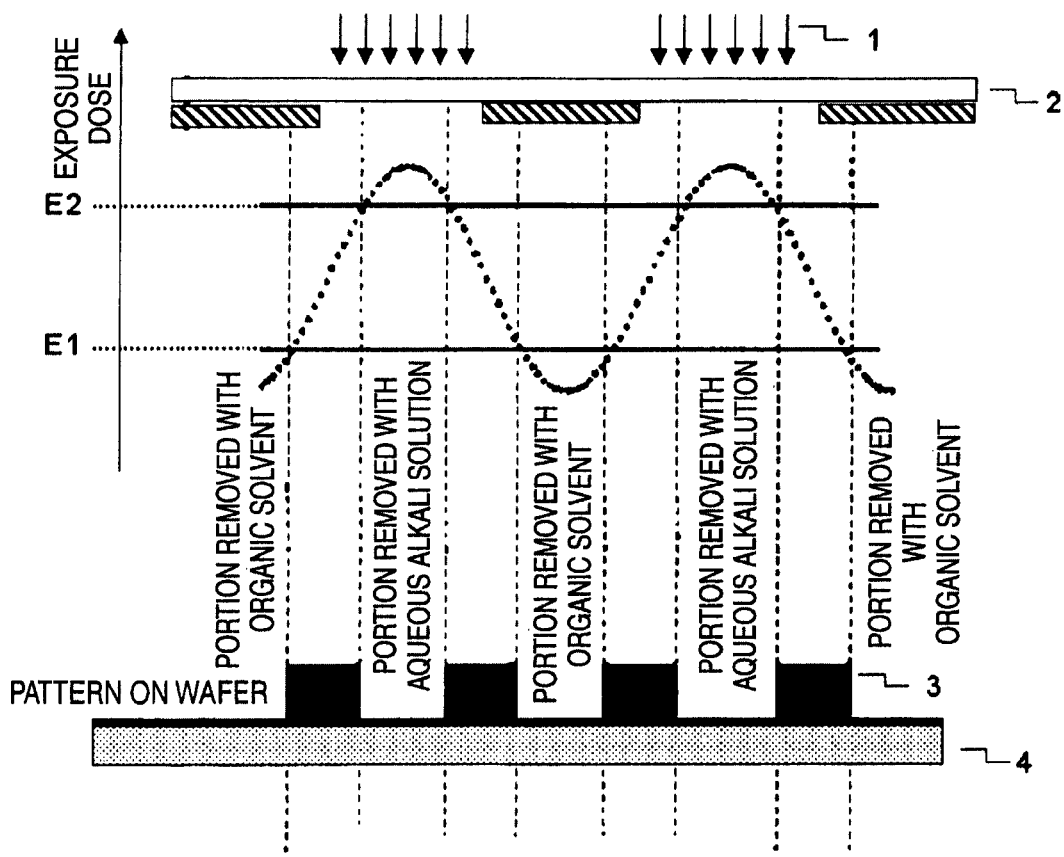
FIG. 2 is a schematic view showing the pattern forming method using positive tone development and negative tone development in combination.

| DESCRIPTION OF REFERENCE NUMERALS AND SIGNS | |
|---|---|
| 1 | Irradiation Light |
| 2 | Exposure mask |
| 3 | Pattern |
| 4 | Wafer |

BEST MODE FOR CARRYING OUT THE INVENTION

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

First, the terms used in the context of the present invention are described. The pattern forming system includes a positive tone system and a negative tone system and in either system, a change in the solubility of a resist film in a developer due to a chemical reaction triggered by light irradiation is utilized. A system where the light-irradiated part dissolves in a developer is called a positive tone system, and a system where the light-unirradiated part dissolves in a developer is called a negative tone system. The developer used here includes two types, that is, a negative tone developer and a positive tone developer. The positive tone developer is a developer that selectively dissolves and removes the exposed area not lower than a predetermined threshold value shown by a solid line in FIG. 1, and the negative tone developer is a developer that selectively dissolves and removes the exposed area not higher than the above-described threshold value. A development step using a positive tone developer is called positive tone development (sometimes referred to as a positive tone development step), and a development step using a negative tone developer is called negative tone development (sometimes referred to as a negative tone development step). Multiple development (sometimes referred to as a multiple development step) is a development system combining a development step using the positive tone developer and a development step using the negative tone developer. In the present invention, a resist composition used for negative tone development is referred to as a resist composition for negative tone development, and a resist composition used for multiple development is referred to as a resist composition for multiple development. In the following, the composition simply denoted as a "resist composition" indicates a resist composition for negative tone development. The rinsing solution for negative tone development indicates an organic solvent-containing rinsing solution used in a washing step after the negative tone development step.

Figure 3:
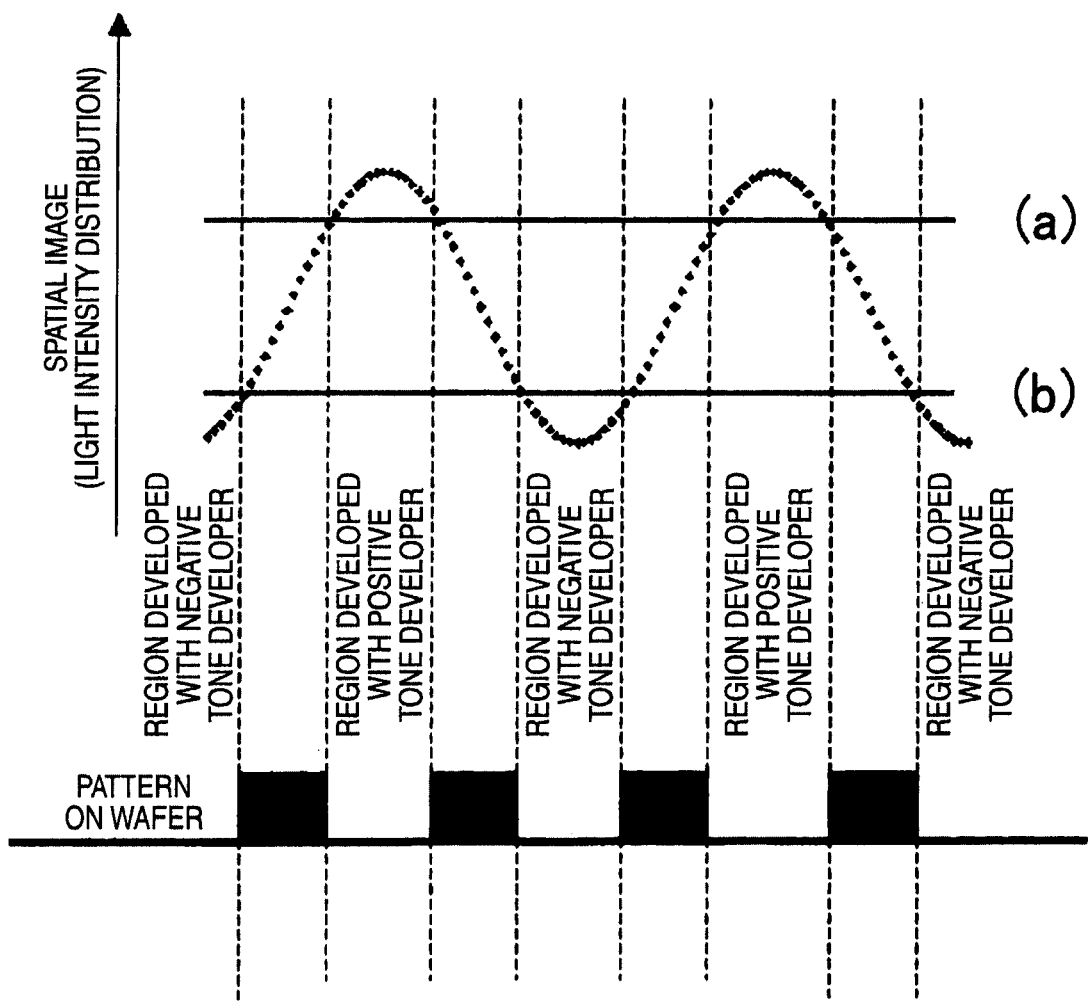
FIG. 3 is a schematic view showing the relationship among positive tone development, negative tone development and exposure dose.

The present invention provides, as a technique for raising the resolution, a new pattern forming method by a combination of a developer (negative tone developer) for selectively dissolving and removing the exposed area not higher than a predetermined threshold value (b) as shown in FIG. 3 and a resist composition for negative tone development, which contains a resin capable of increasing the polarity by the action of an acid and forms a film whose solubility in a positive tone developer (preferably an alkali developer) increases and solubility in a negative tone developer (preferably an organic developer) decreases upon irradiation with an actinic ray or radiation.

The resist composition for negative tone development of the present invention exhibits excellent development properties also for a developer (positive tone developer) that selectively dissolves and removes the exposed area not lower than a predetermined threshold value (a), and pattern formation by multiple development can be performed by combining a developer (positive tone developer) for selectively dissolving and removing the exposed area not lower than a predetermined threshold value (a) and a developer (negative tone developer) for selectively dissolving and removing the exposed area not higher than a predetermined threshold value (b), with the resist composition for negative tone development.

That is, as shown in FIG. 3, when a pattern element on an exposure mask is projected on a wafer by light irradiation, the region having a strong light irradiation intensity (the exposed area not lower than a predetermined threshold value (a)) is dissolved and removed using a positive tone developer, and the region having a weak light irradiation intensity (the exposed area not higher than a predetermined threshold value (b)) is dissolved and removed using a negative tone developer, whereby a pattern with a resolution as high as 2 times the frequency of the optical spatial image (light intensity distribution) can be obtained.

Accordingly, the resist composition for negative tone development of the present invention can be suitably used also as a resist composition for multiple development.

The pattern forming process necessary for practicing the present invention comprises the following steps:

(i) a step of applying a resist composition for negative tone development, comprising (A) a resin capable of increasing the polarity by the action of an acid to increase the solubility in a positive tone developer and decrease the solubility in a negative tone developer, (B) a compound capable of generating an acid having an acid dissociation index pKa of −4.0 or less upon irradiation with an actinic ray or radiation, and (C) a solvent, (ii) an exposure step, and (iv) a step of performing development by using a negative tone developer.

The pattern forming method of the present invention preferably further comprises (vi) a step of washing the resist film with a rinsing solution containing an organic solvent.

The pattern forming method of the present invention preferably further comprises (iii) a step of performing development by using a positive tone developer.

The pattern forming method of the present invention preferably comprises (v) a heating step after the exposure step (ii).

In the pattern forming method of the present invention, the exposure step (ii) may be performed a plurality of times.

In the pattern forming method of the present invention, the heating step (v) may be performed a plurality of times.

In practicing the present invention, a resist composition for negative tone development, comprising (A) a resin capable of increasing the polarity by the action of an acid to increase the solubility in a positive tone developer and decrease the solubility in a negative tone developer, (B) a compound capable of generating an acid having an acid dissociation index pKa of −4.0 or less upon irradiation with an actinic ray or radiation, and (C) a solvent, as well as (Ab) a negative tone developer (preferably an organic developer) are necessary.

In practicing the present invention, (Ac) a positive tone developer (preferably an alkali developer) is preferably further used.

In practicing the present invention, (Ad) an organic solvent-containing rinsing solution for negative tone development is preferably further used.

In the case of performing a pattern forming process using two kinds of developers, that is, a positive tone developer and a negative tone developer, the order of developments is not particularly limited, but it is preferred to perform development by using a positive tone developer or a negative tone developer after first exposure and then perform negative tone or positive tone development by using a developer different from that in the first development. After the negative tone development, the resist film is preferably washed with an organic solvent-containing rinsing solution for negative tone development.

The pattern forming system includes (a) a system utilizing a chemical reaction such as polarity conversion and (b) a system utilizing production of an intermolecular bond, such as crosslinking reaction or polymerization reaction.

In a resist material system where the molecular weight of the resin increases by the intermolecular bonding such as crosslinking reaction or polymerization reaction, it is very difficult to formulate a system allowing one resist material to work positively for one developer and work negatively for another developer.

In the present invention, one resist composition acts as a positive tone resist for a positive tone developer and at the same time, acts as a negative tone resist for a negative tone developer.

In the present invention, an alkali developer (aqueous) can be used as the positive tone developer, and an organic developer containing an organic solvent can be used as the negative tone developer.

Also, the resist composition is a "resin composition that contains a resin capable of increasing the polarity by the action of an acid and forms a film whose solubility in a positive tone developer increases and solubility in a negative tone developer decreases upon irradiation with an actinic ray or radiation".

The resist composition of the present invention contains a resin capable of increasing the polarity by the action of an acid and when irradiated with an actinic ray or radiation, not only causes a decrease of the solubility in a negative tone developer but also brings about both an increase of the solubility in an alkali developer and a decrease of the solubility in an organic solvent-containing developer.

In the present invention, the matter of importance is to control the "threshold value" of exposure dose (the exposure dose for solubilizing or insolubilizing the film by a developer in the light-irradiated region). The "threshold value" is the minimum exposure dose for solubilizing the film by a positive tone developer and the minimum exposure dose for insolubilizing the film by a negative tone developer so as to obtain a desired line width at the time of performing pattern formation.

The "threshold value" can be determined as follows.

That is, the "threshold value" is the minimum exposure dose for solubilizing the film by a positive tone developer and the minimum exposure dose for insolubilizing the film by a negative tone developer so as to obtain a desired line width at the time of performing pattern formation.

More strictly, the threshold value is defined as follows.

Figure 4:
FIG. 4 is a graph showing the relationship between exposure dose and residual film curve when a positive tone developer or a negative tone developer is used.

The residual film ratio of the resist film to the exposure dose is measured and at this time, as shown in FIG. 4, the exposure dose giving a residual film ratio of 0% for the positive tone developer is designated as a threshold value (a) and the exposure dose giving a residual film ratio of 100% for the negative tone developer is designated as a threshold value (b).

Figure 5:
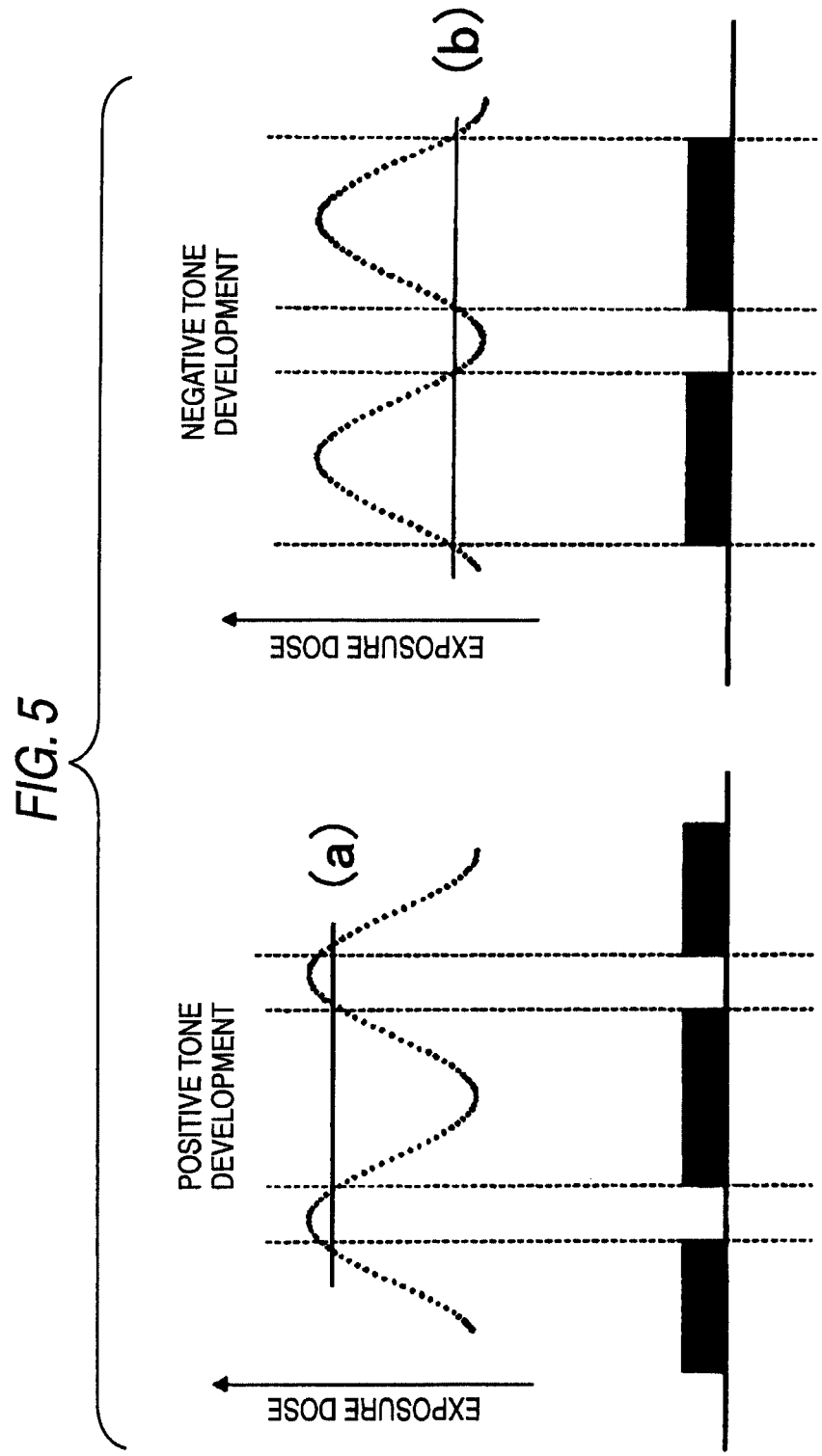
FIG. 5 is a schematic view showing the relationship among positive tone development, negative tone development and exposure dose in the method of the present invention.

For example, as shown in FIG. 5, the threshold value (a) of the exposure dose for solubilizing the film by a positive tone developer is set to be higher than the threshold value (b) for solubilizing the film by a negative tone developer, whereby pattern formation can be achieved by one exposure operation. That is, as shown in FIG. 6, after a resist is applied on a wafer and exposed, the portion not lower than the threshold value (a) of the exposure dose is dissolved with a positive tone developer and subsequently, the portion not higher than the threshold value (b) of the exposure dose is dissolved with a negative tone developer, whereby pattern formation can be performed by one exposure operation.

In this case, as for the order of development with a positive tone developer and development with a negative tone developer, either development may be performed earlier. After the negative tone development, when the resist film is washed with a rinsing solution containing an organic solvent, more successful pattern formation can be achieved.

The method for controlling the threshold value includes a method of controlling the material-related parameters of the resist composition and the developer or controlling the parameters related to the process.

As for the material-related parameter, control of various physical values related to solubility of the resist composition in the developer and the organic solvent, such as SP value (solubility parameter) and LogP value, is effective. Specific examples of the parameter include, for the polymer contained in the resist composition, the weight average molecular weight, the molecular weight dispersity, the monomer compositional ratio, the polarity of monomer, the monomer sequence, the polymer blend and the addition of low molecular additive, and for the developer, include the concentration of developer, the addition of low molecular additive and the addition of surfactant.

Also, specific examples of the process-related parameter include the film formation temperature, the film formation time, the temperature and time of post-heating after exposure, the temperature at development, the development time, the nozzle system (puddle method) of developing apparatus, and the rinsing method after development.

Accordingly, for obtaining a good pattern in the pattern forming method using negative tone development as well as in the pattern forming method by multiple development using negative tone development and positive tone development in combination, it is important to combine the above-described material-related parameters and process parameters while appropriately controlling these parameters.

The pattern forming process using two kinds of developers, namely, a positive tone developer and a negative tone developer, may be a process where the exposure is performed once as described above or where the exposure is performed two or more times. That is, development using a positive tone developer or a negative tone developer is performed after first exposure, and negative tone or positive tone development using a developer different from that in the first development is performed after second exposure.

Figure 7:
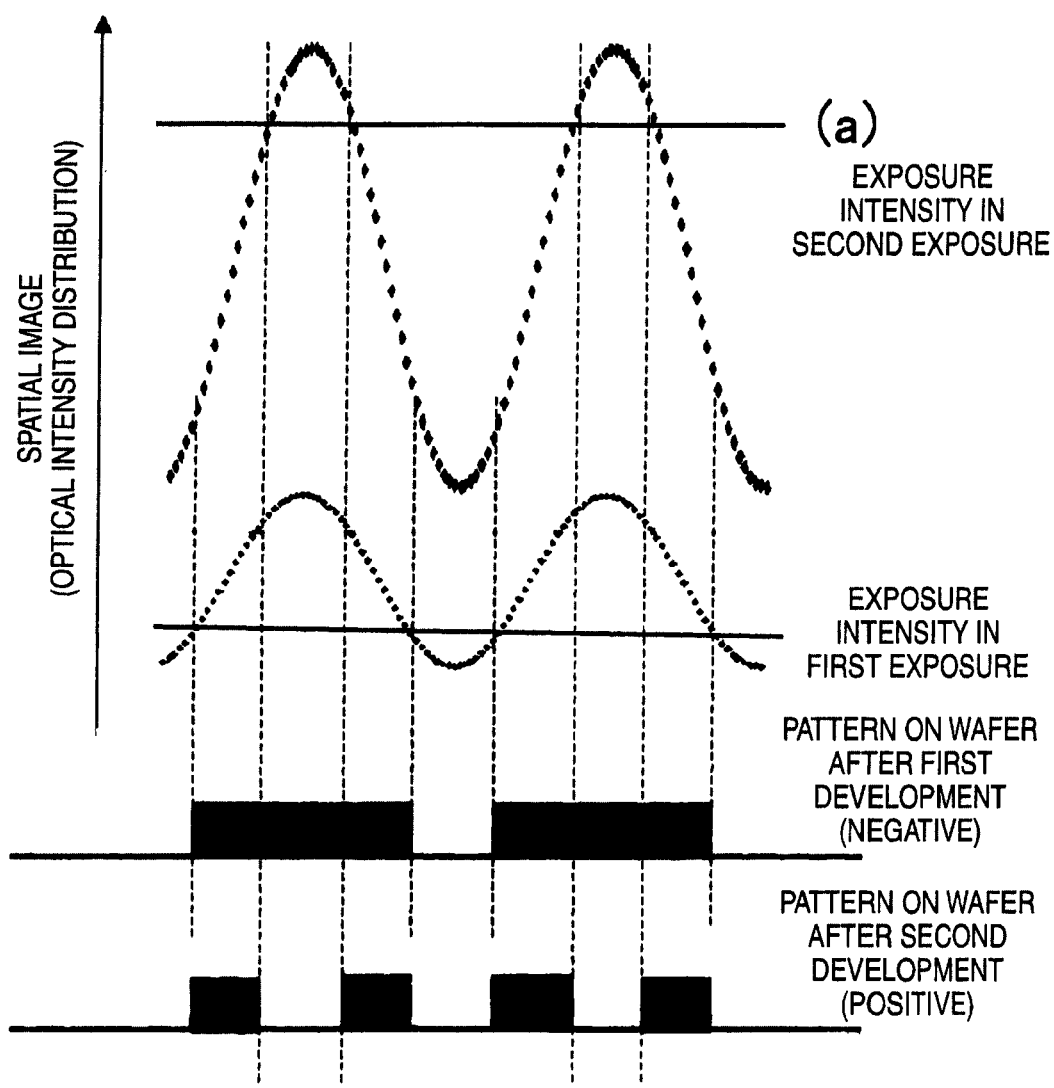
FIG. 7 is a schematic view showing the relationship among positive tone development, negative tone development and exposure dose in the method of the present invention.

When exposure is performed two or more times, this is advantageous in that the latitude of control of the threshold value in the development after first exposure as well as control of the threshold value in the development after second exposure increases. In the case of performing the exposure two or more times, the second exposure dose is preferably set to be larger than the first exposure dose. Because, as shown in FIG. 7, in the second development, the threshold value is determined based on the amount to which the history of first and second exposure doses is added, and when the second exposure dose is sufficiently larger than the first exposure dose, the effect of the first exposure dose is reduced and depending on the case, can be neglected.

The exposure dose (Eo1 [mJ/cm$^2$]) in the step of performing the first exposure is preferably 5 [mJ/cm$^2$] or more smaller than the exposure dose (Eo2 [mJ/cm$^2$]) in the step of performing the second exposure. In this case, the history of the first exposure can be made to less affect the process of performing pattern formation by the second exposure.

For changing the first exposure dose and the second exposure dose, a method of adjusting the above-described various parameters related to the material and process is effective. In particular, control of the temperature in the first heating step as well as the temperature in the second heating step is effective. That is, in order to make the first exposure dose smaller than the second exposure dose, it is effective to set the temperature in the first heating step to be higher than the temperature in the second heating step.

The threshold value (a) in the positive tone development is determined as follows in the actual lithography process.

A film composed of a resist composition whose solubility in a positive tone developer increases and solubility in a negative tone developer decreases upon irradiation with an actinic ray or radiation is formed on a substrate, and the resist film is exposed through a photomask having a desired pattern size under desired illumination conditions. At this time, the exposure is performed by varying the exposure focus in 0.05 [μm] steps and the exposure dose in 0.5 [mJ/cm$^2$] steps. After the exposure, the resist film is heated at a desired temperature for a desired time and then developed with an alkali developer in a desired concentration for a desired time. After the development, the line width of the pattern is measured using CD-SEM, and the exposure dose A [mJ/cm$^2$] and focus position for forming a desired line width are determined. Subsequently, the intensity distribution of an optical image when irradiating the above-described photomask with a specific exposure dose A [mJ/cm$^2$] and a specific focus position is computed. The computation can be performed using a simulation software (Prolith, ver. 9.2.0.15, produced by KLA). Details of the computation method are described in Chris. A. Mack, Inside PROLITH, Chapter 2, "Aerial Image Formation", FINLE Technologies, Inc.

Figure 8:
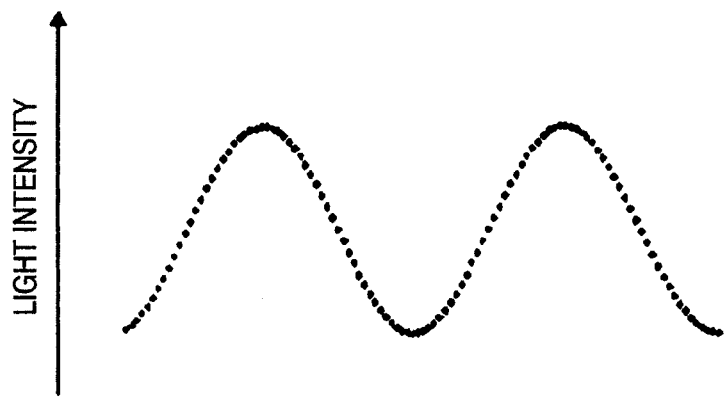
FIG. 8 is a view showing the spatial intensity distribution of an optical image.

As a result of computation, for example, the spatial intensity distribution shown in FIG. 8 of an optical image is obtained.

Figure 9:
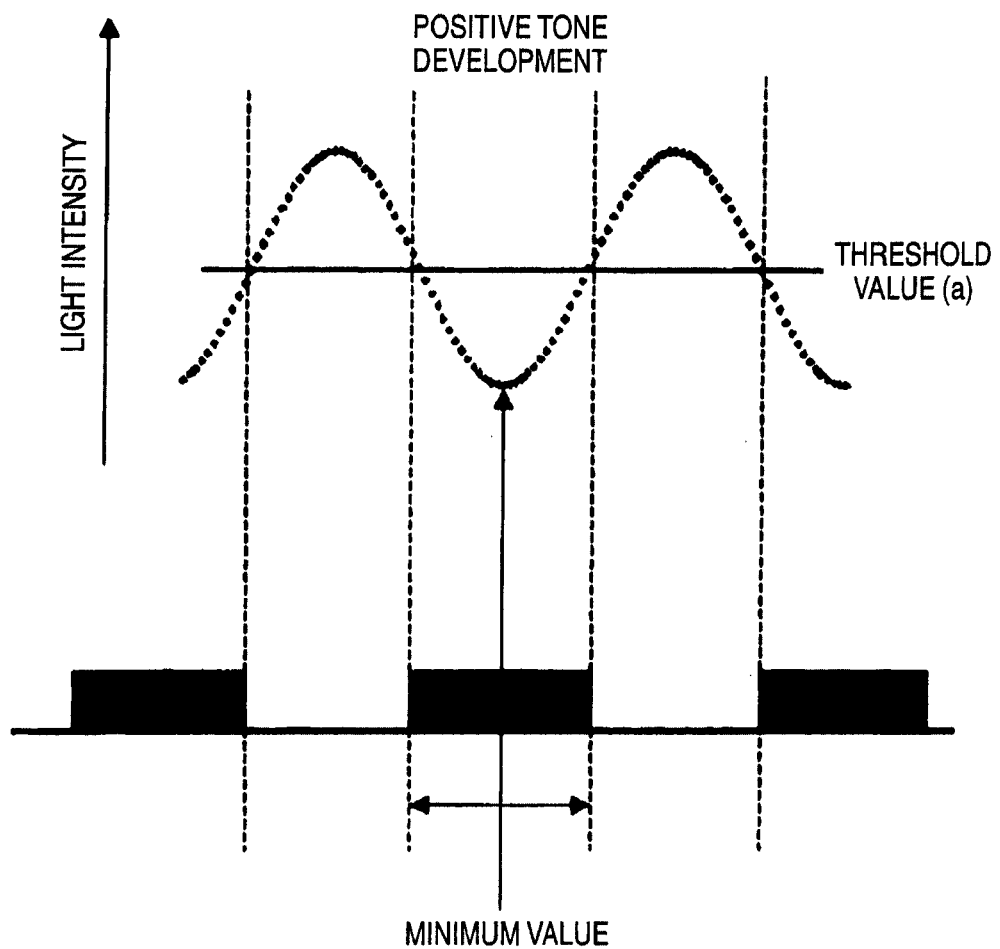
FIG. 9 is a schematic view showing the relationship among positive tone development, threshold value (a) and light intensity.

Here, as shown in FIG. 9, the light intensity at a position after shifting the spatial position by ½ of the obtained pattern line width from the minimum value in the spatial intensity distribution of an optical image is defined as the threshold value (a).

The threshold value (b) in the negative tone development is determined as follows in the actual lithography process.

A film composed of a resist composition that contains a resin capable of increasing the polarity by the action of an acid and forms a film whose solubility in a positive tone developer increases and solubility in a negative tone developer decreases upon irradiation with an actinic ray or radiation is formed on a substrate, and the resist film is exposed through a photomask having a desired pattern size under desired illumination conditions. At this time, the exposure is performed by varying the exposure focus in 0.05 [μm] steps and the exposure dose in 0.5 [mJ/cm²] steps. After the exposure, the resist film is heated at a desired temperature for a desired time and then developed with an organic developer in a desired concentration for a desired time. After the development, the line width of the pattern is measured using CD-SEM, and the exposure dose A [mJ/cm²] and focus position for forming a desired line width are determined. Subsequently, the intensity distribution of an optical image when irradiating the above-described photomask with a specific exposure dose A [mJ/cm²] and a specific focus position is computed. The computation is performed using a simulation software (Prolith, produced by KLA).

Figure 10:
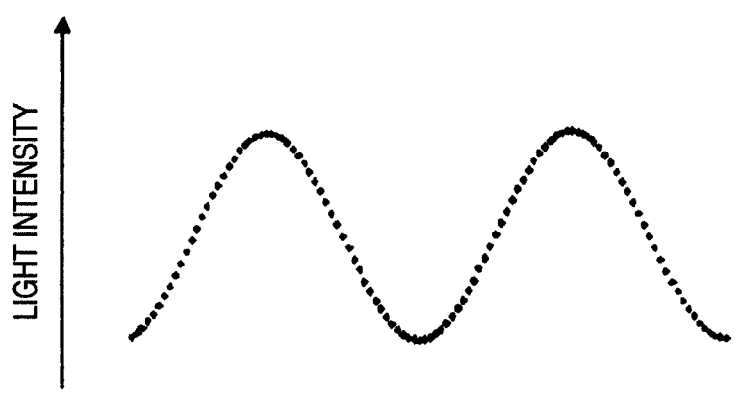
FIG. 10 is a schematic view showing the spatial intensity distribution of an optical image.

For example, a spatial intensity distribution shown in FIG. 10 of an optical image is obtained.

Figure 11:
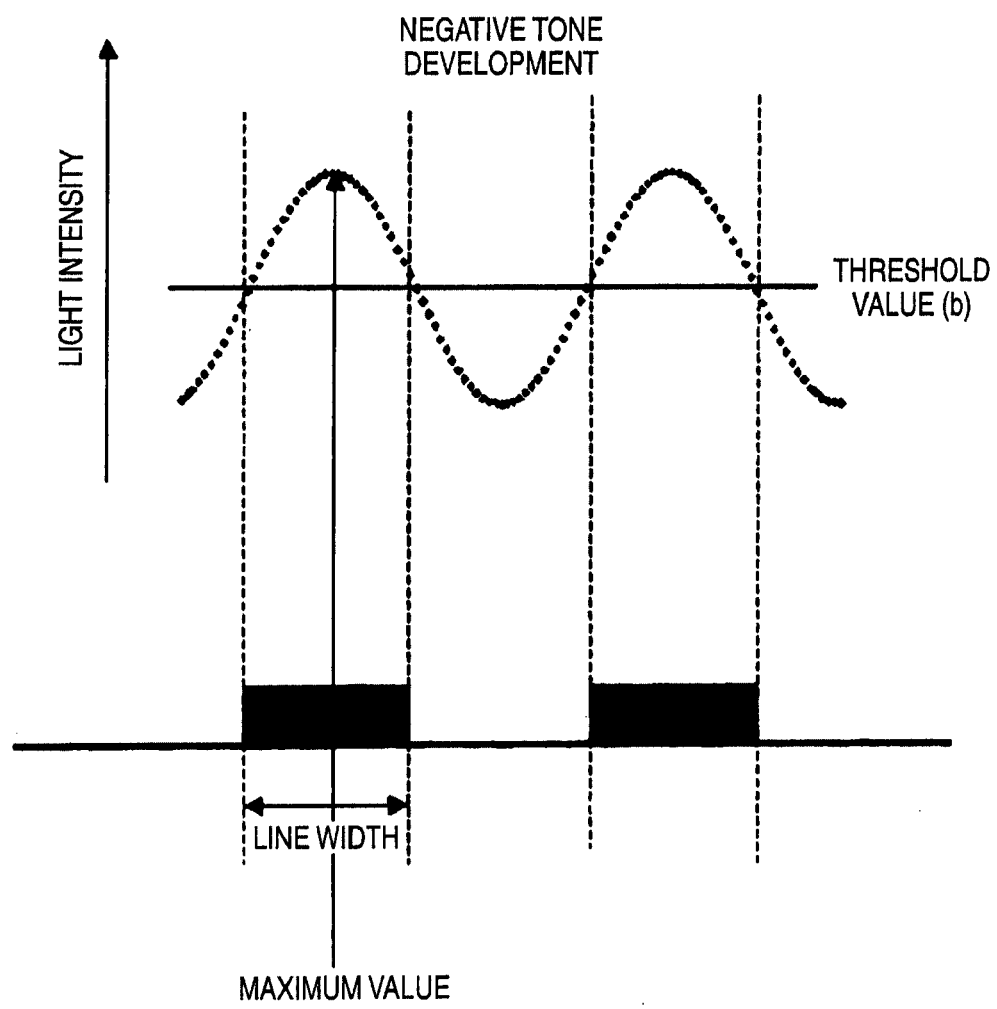
FIG. 11 is a schematic view showing the relationship among negative tone development, threshold value (b) and light intensity.

Here, as shown in FIG. 11, the light intensity at a position after shifting the spatial position by ½ of the obtained pattern line width from the maximum value in the spatial intensity distribution of an optical image is defined as the threshold value (b).

The threshold value (a) is preferably from 0.1 to 100 [mJ/cm²], more preferably from 0.5 to 50 [mJ/cm²], still more preferably from 1 to 30 [mJ/cm²]. The threshold value (b) is preferably from 0.1 to 100 [mJ/cm²], more preferably from 0.5 to 50 [mJ/cm²], still more preferably from 1 to 30 [mJ/cm²]. The difference between threshold values (a) and (b) is preferably from 0.1 to 80 [mJ/cm²], more preferably from 0.5 to 50 [mJ/cm²], still more preferably from 1 to 30 [mJ/cm²].

In the present invention, the film formed on a substrate is a film formed by applying a resist composition for negative tone development, comprising (A) a resin capable of increasing the polarity by the action of an acid to increase the solubility in a positive tone developer and decrease the solubility in a negative tone developer, (B) a compound capable of generating an acid having an acid dissociation index pKa of −4.0 or less upon irradiation with an actinic ray or radiation, and (C) a solvent.

The resist composition which can be used in the present invention is described below.

(A) Resin Capable of Increasing the Polarity by the Action of an Acid to Increase the Solubility in a Positive Tone Developer and Decrease the Solubility in a Negative Tone Developer The resin capable of increasing the polarity by the action of an acid to increase the solubility in a positive tone developer and decrease the solubility in a negative tone developer, which is used in the resist composition of the present invention, is a resin having a group capable of decomposing by the action of an acid to produce an alkali-soluble group (hereinafter sometimes referred to as an "acid-decomposable group"), on either one or both of the main chain and the side chain of the resin (sometimes referred to as an "acid-decomposable resin" or a "resin (A)"). The resin is preferably a resin having a monocyclic or polycyclic alicyclic hydrocarbon structure and being capable of increasing the polarity by the action of an acid to increase the solubility in an alkali developer and decrease the solubility in an organic solvent (hereinafter sometimes referred to as an "alicyclic hydrocarbon-based acid-decomposable resin"). The reason therefor is not clearly known but is considered to be attributable to the fact that the polarity of the resin is greatly changed between before and after irradiation of an actinic ray or radiation and the dissolution contrast thereby rises in performing the development by using a positive tone developer (preferably an alkali developer) and a negative tone developer (preferably an organic solvent). Furthermore, the resin having a monocyclic or polycyclic alicyclic hydrocarbon structure has high hydrophobicity and is considered to exhibit enhanced developability when the region of weak light irradiation intensity is developed with a negative tone developer (preferably an organic solvent).

The resist composition for negative tone development of the present invention containing the resin (A) can be suitably used in the case of irradiating ArF excimer laser light.

The acid-decomposable resin contains a repeating unit having an acid-decomposable group.

The acid-decomposable group is preferably a group obtained by replacing a hydrogen atom of an alkali-soluble group by a group capable of leaving by the action of an acid.

Examples of the alkali-soluble group include groups having a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

The alkali-soluble group is preferably a carboxyl group, a fluorinated alcohol group (preferably a hexafluoroisopropanol group) or a sulfonic acid group.

Examples of the group capable of leaving by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The alicyclic hydrocarbon-based acid-decomposable resin is preferably a resin containing at least one member selected from the group consisting of a repeating unit having an alicyclic hydrocarbon-containing partial structure represented by any one of the following formulae (pI) to (pV) and a repeating unit represented by the following formula (II-AB).

(pI)

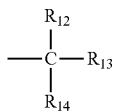
(pII)

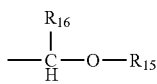
(pIII)

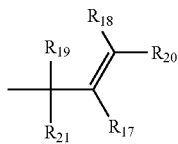
(pIV)

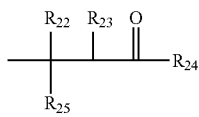
(pV)

In formulae (pI) to (pV), $R_{11}$ represents a methyl group, an ethyl group, an n-propyl group, an isopropyl group, an n-butyl group, an isobutyl group or a sec-butyl group.

Z represents an atomic group necessary for forming a cycloalkyl group together with the carbon atom.

Each of $R_{12}$ to $R_{16}$ independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

Each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

Each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group. $R_{23}$ and $R_{24}$ may combine with each other to form a ring.

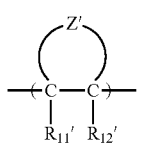
(II-AB)

In formula (II-AB), each of $R_{11}'$ and $R_{12}'$ independently represents a hydrogen atom, a cyano group, a halogen atom or an alkyl group.

Z' represents an atomic group for forming an alicyclic structure containing the two bonded carbon atoms (C—C).

Formula (II-AB) is preferably the following formula (II-AB1) or (II-AB2):

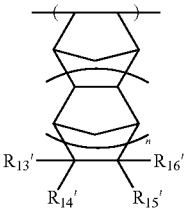
(II-AB1)

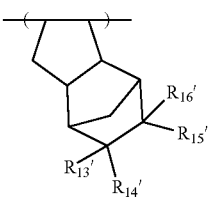
(II-AB2)

In formulae (II-AB1) and (II-AB2), each of $R_{13}'$ to $R_{16}'$ independently represents a hydrogen atom, a halogen atom, a cyano group, —COOH, —COOR$_5$, an acid-decomposable group, —C(=O)—X-A'-R$_{17}'$, an alkyl group or a cycloalkyl group, and at least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

Examples of the linear or branched alkyl group having a carbon number of 1 to 4 of $R_{12}$ to $R_{25}$ in formulae (pI) to (pV) include a methyl group, an ethyl group, an n-propyl group, an isopropyl group, an n-butyl group, an isobutyl group and a sec-butyl group.

The cycloalkyl group of $R_{12}$ to $R_{25}$ and the cycloalkyl group formed by Z together with the carbon atom may be monocyclic or polycyclic. Specific examples thereof include a group having a carbon number of 5 or more and having a monocyclo, bicyclo, tricyclo or tetracyclo structure or the like. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

Examples of the substituent which the alkyl group and cycloalkyl group each may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like each may further have include a hydroxyl group, a halogen atom and an alkoxy group.

The structures represented by formulae (pI) to (pV) each can be used for the protection of an alkali-soluble group. Examples of the alkali-soluble group include various groups known in this technical field.

Specific examples thereof include a structure where the hydrogen atom of a carboxyl group, a sulfonic acid group, a phenolic hydroxyl group or a thiol group is replaced by the structure represented by any one of formulae (pI) to (pV). Among these, preferred is a structure where the hydrogen atom of a carboxyl group or a sulfonic acid group is replaced by the structure represented by any one of formulae (pI) to (pV).

The repeating unit having an alkali-soluble group protected by the structure represented by any one of formulae (pI) to (pV) is preferably a repeating unit represented by the following formula (pA):

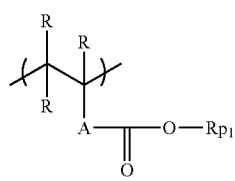

(pA)

In the formula, R represents a hydrogen atom, a halogen atom or a linear or branched alkyl group having a carbon number of 1 to 4, and each R may be the same as or different from every other R.

A represents a single bond, or a sole group or a combination of two or more groups selected from the group consisting of an alkylene group, an ether group, a thioether group, a carbonyl group, an ester group, an amido group, a sulfonamido group, a urethane group and a urea group, and is preferably a single bond.

Rp$_1$ represents a group represented by any one of formulae (pI) to (pV).

The repeating unit represented by formula (pA) is more preferably a repeating unit composed of a 2-alkyl-2-adamantyl(meth)acrylate or a dialkyl(1-adamantyl)methyl(meth)acrylate.

Specific examples of the repeating unit having an acid-decomposable group are set forth below, but the present invention is not limited thereto.

(In the formulae, Rx represents H, CH$_3$ or CH$_2$OH, and each of Rxa and Rxb independently represents an alkyl group having a carbon number of 1 to 4.)

1

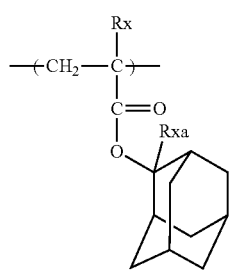

2

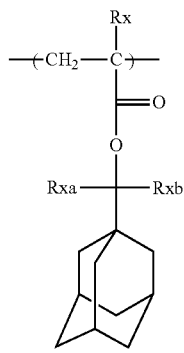

3

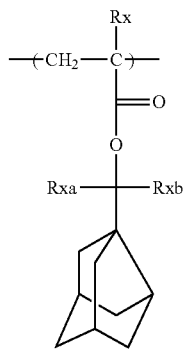

4

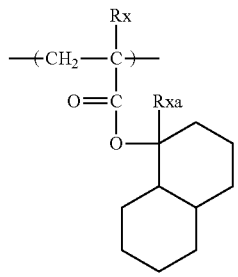

5

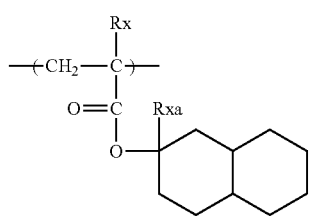

6

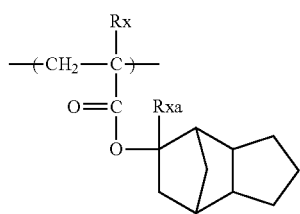

7

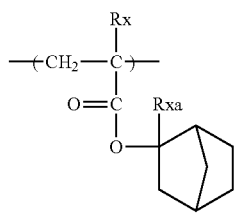

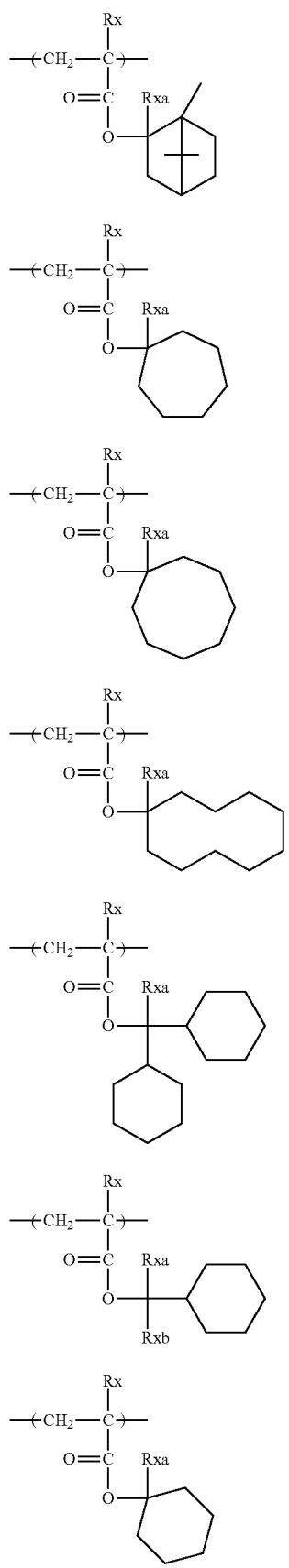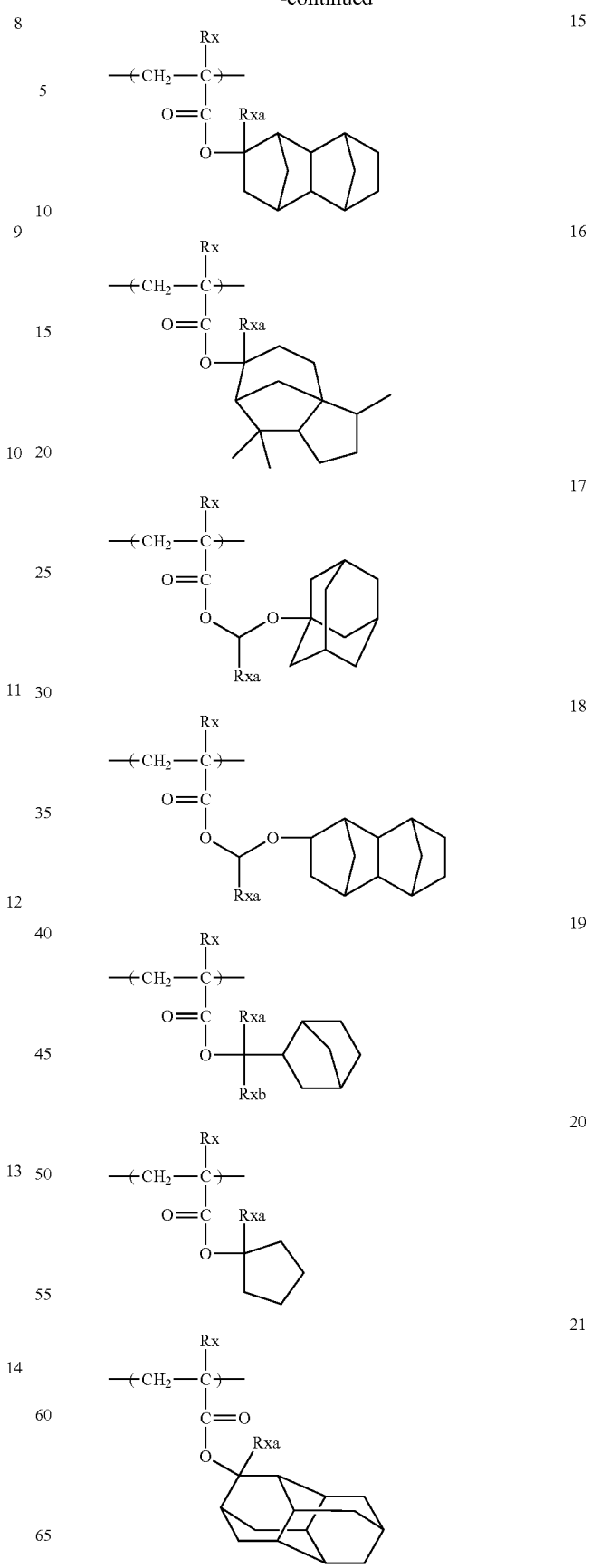

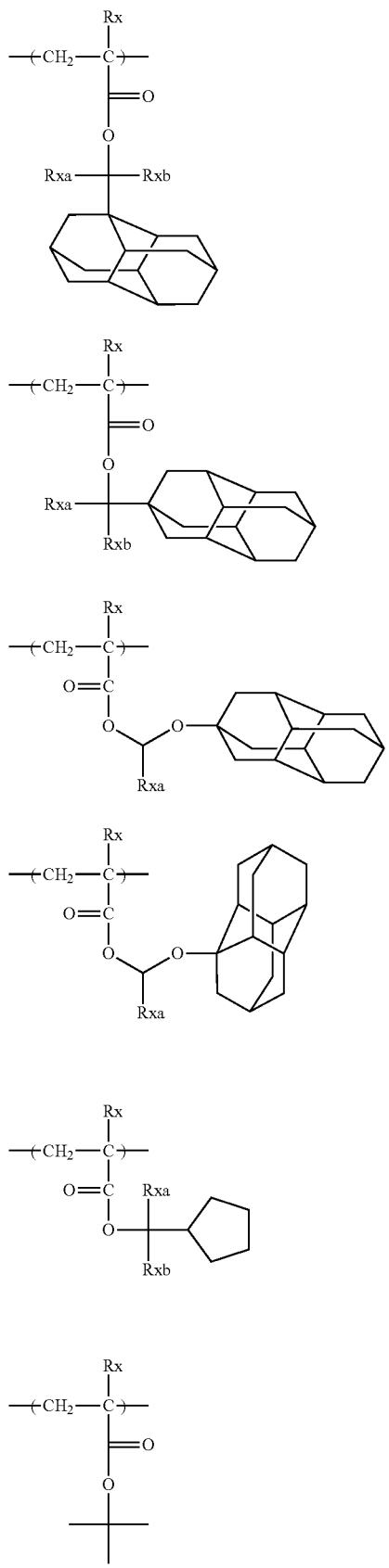

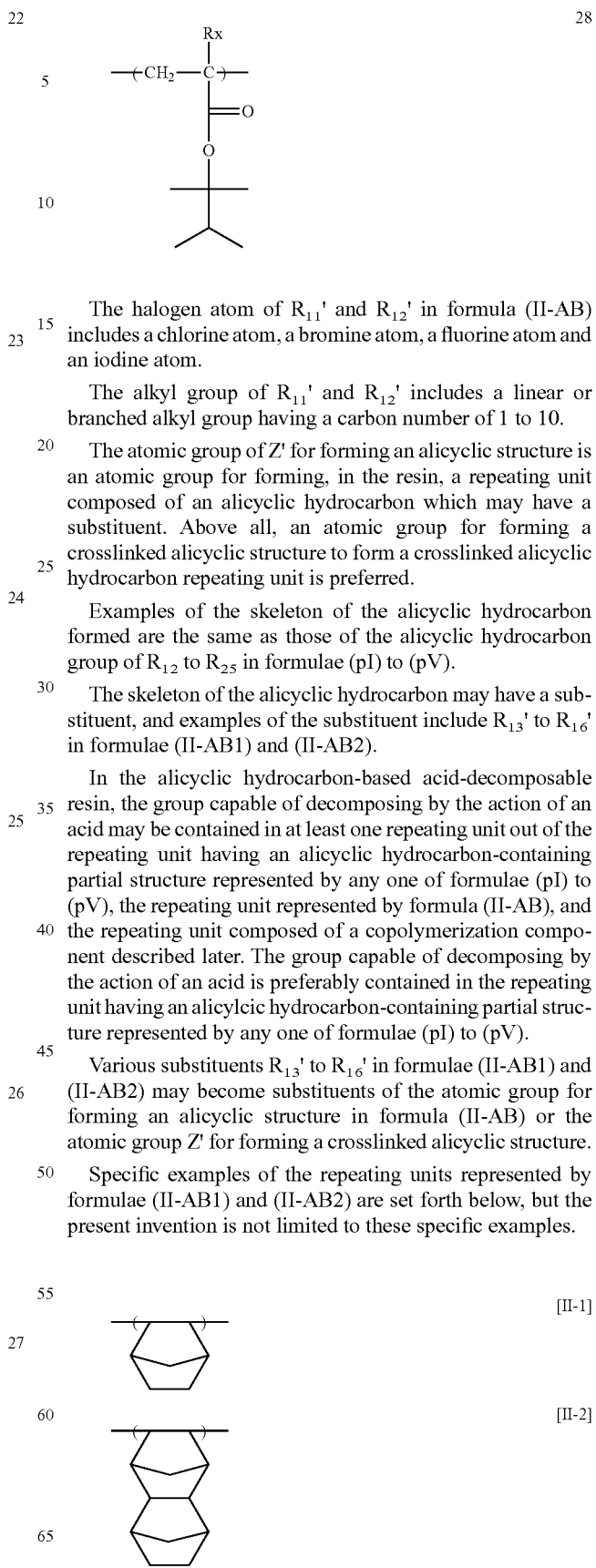

The halogen atom of $R_{11}'$ and $R_{12}'$ in formula (II-AB) includes a chlorine atom, a bromine atom, a fluorine atom and an iodine atom.

The alkyl group of $R_{11}'$ and $R_{12}'$ includes a linear or branched alkyl group having a carbon number of 1 to 10.

The atomic group of $Z'$ for forming an alicyclic structure is an atomic group for forming, in the resin, a repeating unit composed of an alicyclic hydrocarbon which may have a substituent. Above all, an atomic group for forming a crosslinked alicyclic structure to form a crosslinked alicyclic hydrocarbon repeating unit is preferred.

Examples of the skeleton of the alicyclic hydrocarbon formed are the same as those of the alicyclic hydrocarbon group of $R_{12}$ to $R_{25}$ in formulae (pI) to (pV).

The skeleton of the alicyclic hydrocarbon may have a substituent, and examples of the substituent include $R_{13}'$ to $R_{16}'$ in formulae (II-AB1) and (II-AB2).

In the alicyclic hydrocarbon-based acid-decomposable resin, the group capable of decomposing by the action of an acid may be contained in at least one repeating unit out of the repeating unit having an alicyclic hydrocarbon-containing partial structure represented by any one of formulae (pI) to (pV), the repeating unit represented by formula (II-AB), and the repeating unit composed of a copolymerization component described later. The group capable of decomposing by the action of an acid is preferably contained in the repeating unit having an alicylcic hydrocarbon-containing partial structure represented by any one of formulae (pI) to (pV).

Various substituents $R_{13}'$ to $R_{16}'$ in formulae (II-AB1) and (II-AB2) may become substituents of the atomic group for forming an alicyclic structure in formula (II-AB) or the atomic group $Z'$ for forming a crosslinked alicyclic structure.

Specific examples of the repeating units represented by formulae (II-AB1) and (II-AB2) are set forth below, but the present invention is not limited to these specific examples.

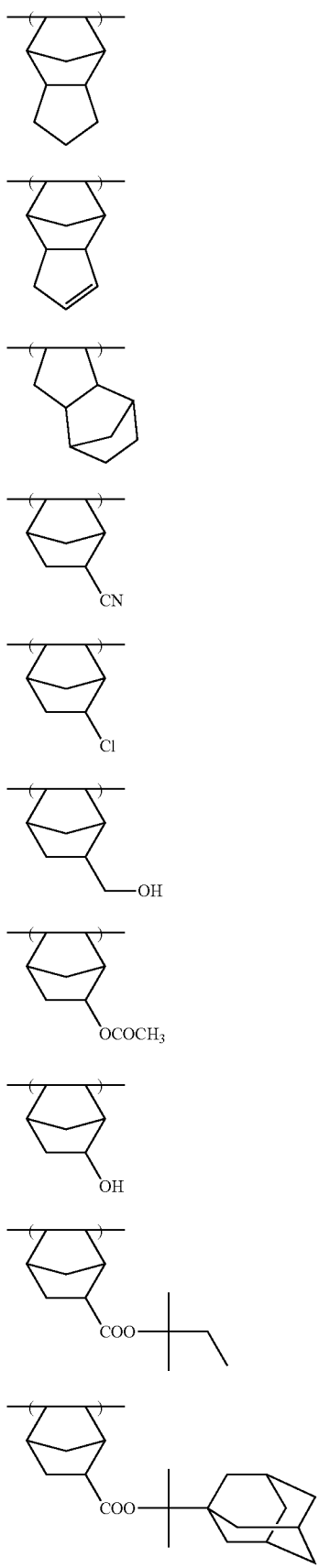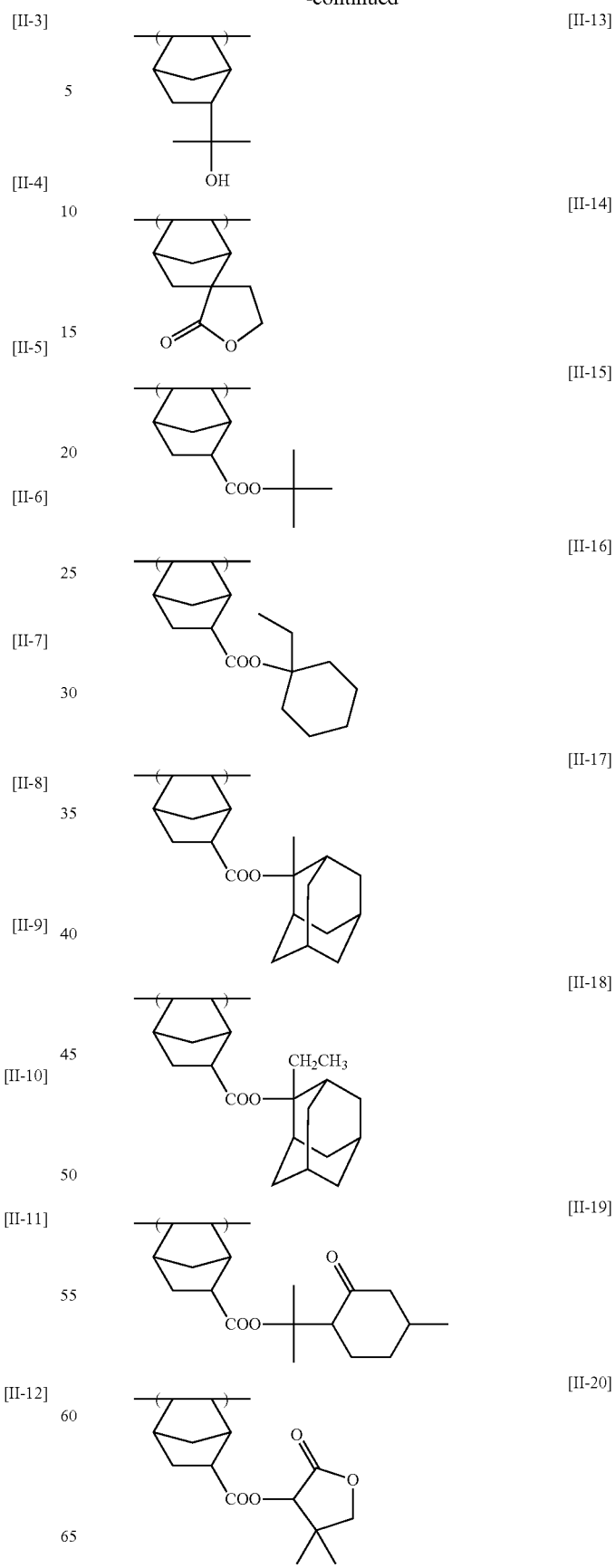

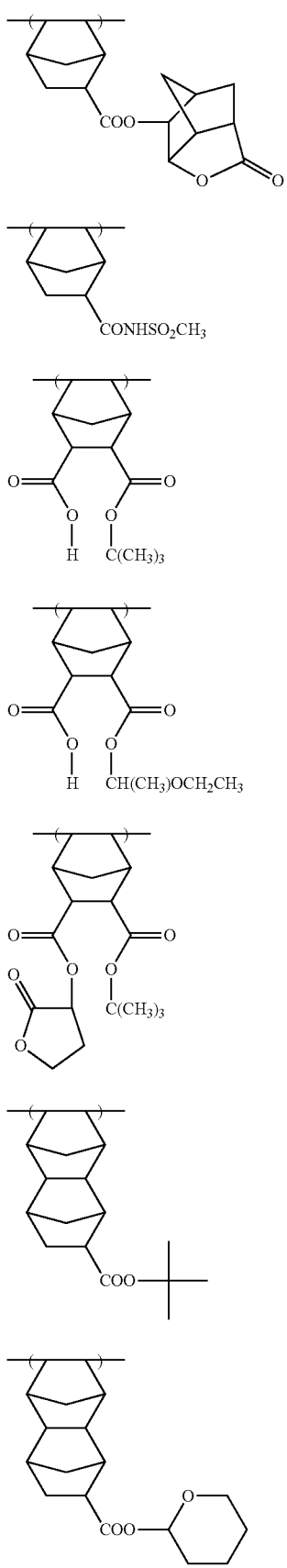
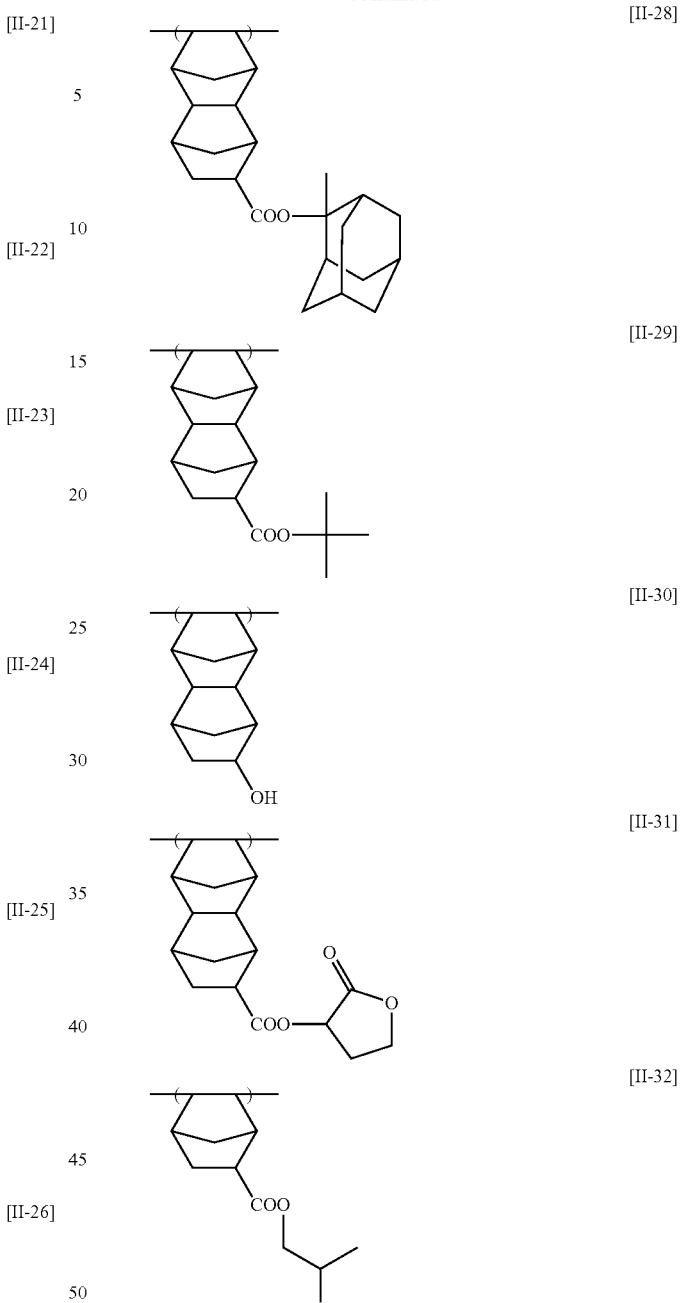

The alicyclic hydrocarbon-based acid-decomposable resin preferably has a lactone group. As for the lactone group, any group may be used as long as it has a lactone structure, but a group having a 5- to 7-membered ring lactone structure is preferred. The 5- to 7-membered ring lactone structure is preferably condensed with another ring structure in the form of forming a bicyclo or spiro structure. The resin more preferably has a repeating unit containing a group having a lactone structure represented by any one of the following formulae (LC1-1) to (LC1-16). The group having a lactone structure may be bonded directly to the main chain. Among these lactone structures, preferred are groups represented by formulae (LC1-1), (LC1-4), (LC1-5), (LC1-6), (LC1-13) and (LC1-14). By virtue of using a specific lactone structure, the line edge roughness and development defect are improved.

LC1-1 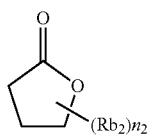
LC1-2 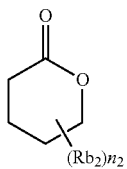
LC1-3 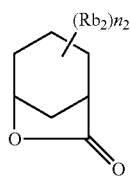
LC1-4 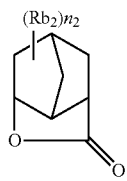
LC1-5 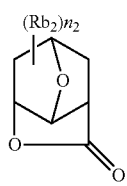
LC1-6 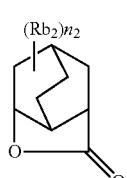
LC1-7 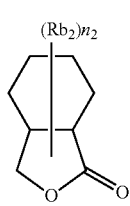
LC1-8 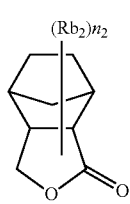
LC1-9 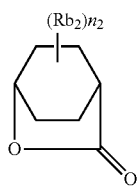
LC1-10 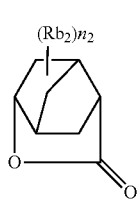
LC1-11 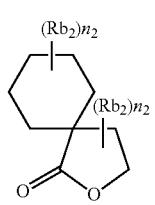
LC1-12 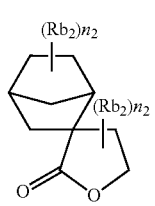
LC1-13 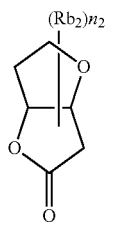
LC1-14 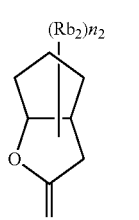
LC1-15 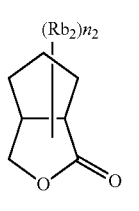

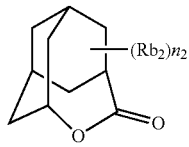

LC1-16

The lactone structure moiety may or may not have a substituent (Rb$_2$). Preferred examples of the substituent (Rb$_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. n$_2$ represents an integer of 0 to 4. When n$_2$ is an integer of 2 or more, each substituent Rb$_2$ may be the same as or different from every other substituents Rb$_2$ and also, the plurality of substituents (Rb$_2$) may combine with each other to form a ring.

Examples of the repeating unit containing a group having a lactone structure represented by any one of formulae (LC1-1) to (LC1-16) include a repeating unit where at least one of R$_{13}$' to R$_{16}$' in formula (II-AB1) or (II-AB2) has a group represented by any one of formulae (LC1-1) to (LC1-16) (for example, R$_5$ of —COOR$_5$ is a group represented by any one of formulae (LC1-1) to (LC1-16)), and a repeating unit represented by the following formula (AI):

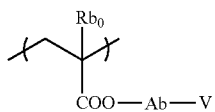

(AI)

In formula (AI), Rb$_0$ represents a hydrogen atom, a halogen atom or an alkyl group having a carbon number of 1 to 4.

Preferred examples of the substituent which the alkyl group of Rb$_0$ may have include a hydroxyl group and a halogen atom.

The halogen atom of Rb$_0$ includes a fluorine atom, a chlorine atom, a bromine atom and an iodine atom.

Rb$_0$ is preferably a hydrogen atom, a methyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group formed by combining these groups and is preferably a single bond or a linking group represented by -Ab$_1$-CO$_2$—. Ab$_1$ represents a linear or branched alkylene group, or a monocyclic or polycyclic cycloalkylene group and is preferably a methylene group, an ethylene group, a cyclohexylene group, an adamantylene group or a norbornylene group.

V represents a group represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit having a lactone structure are set forth below, but the present invention is not limited thereto.

(In the formulae, Rx is H, CH$_3$, CH$_2$OH or CF$_3$.)

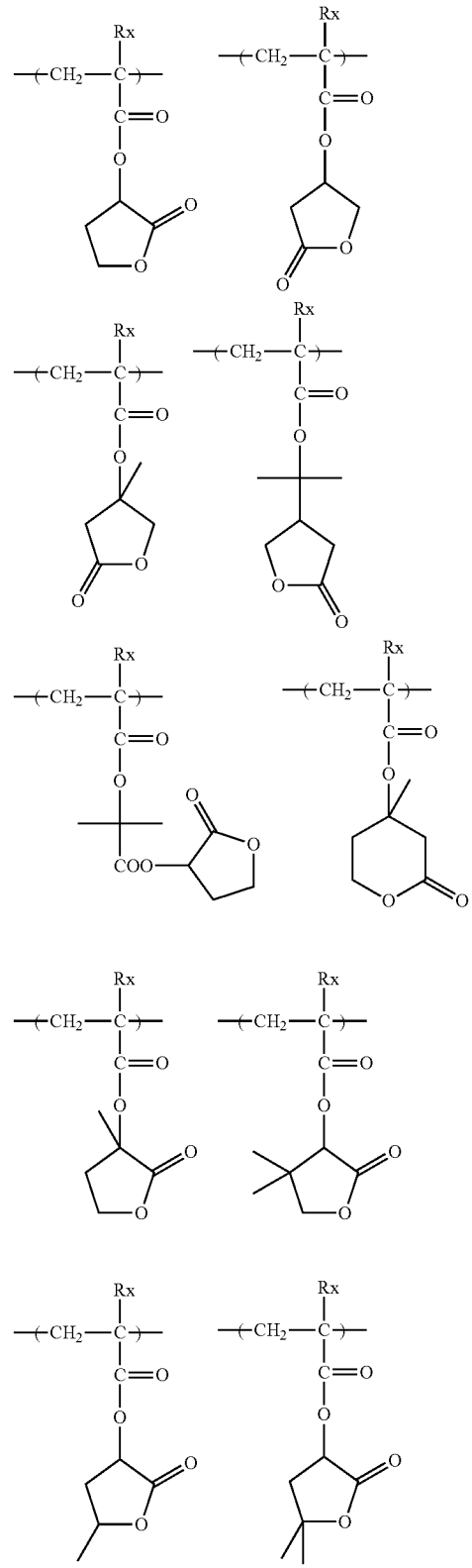

-continued
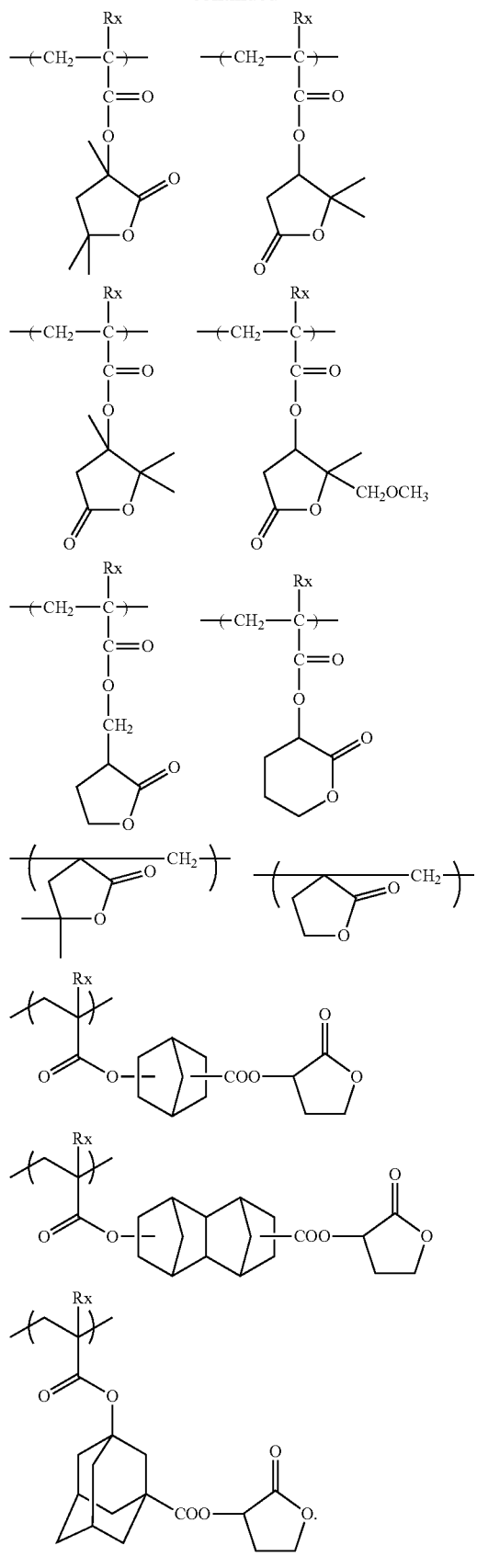
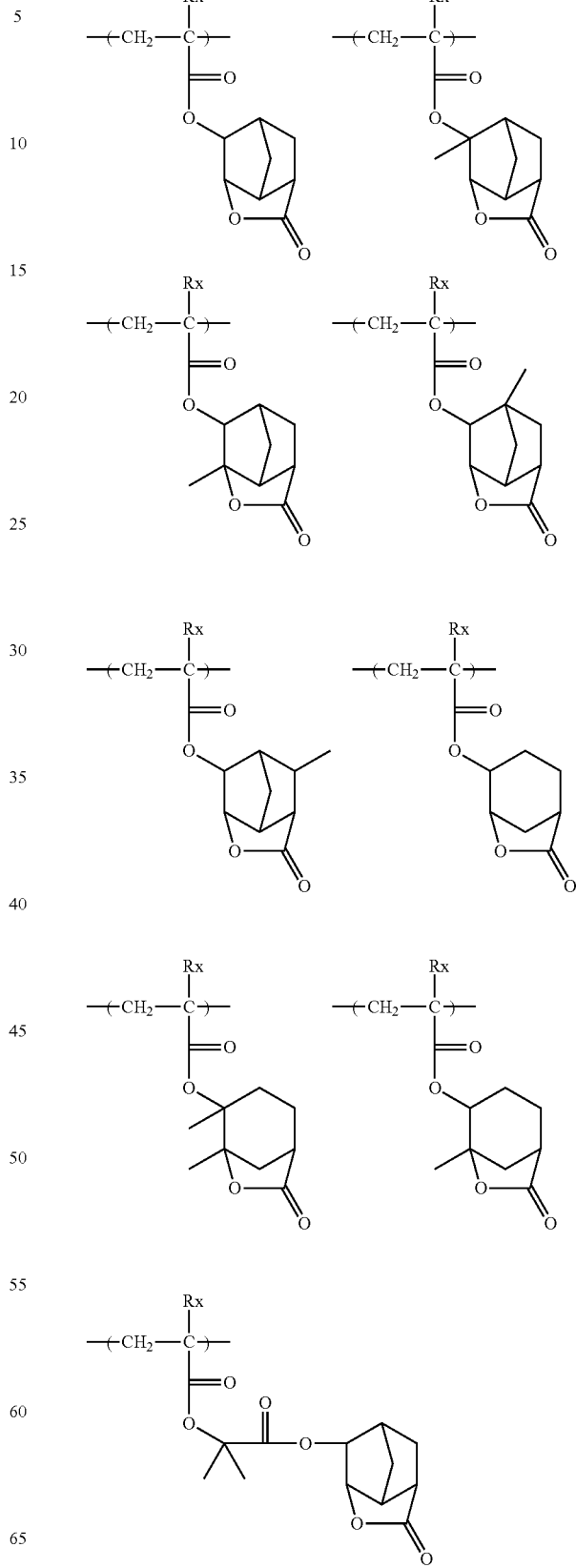
(In the formulae, Rx is H, CH₃, CH₂OH or CF₃.)

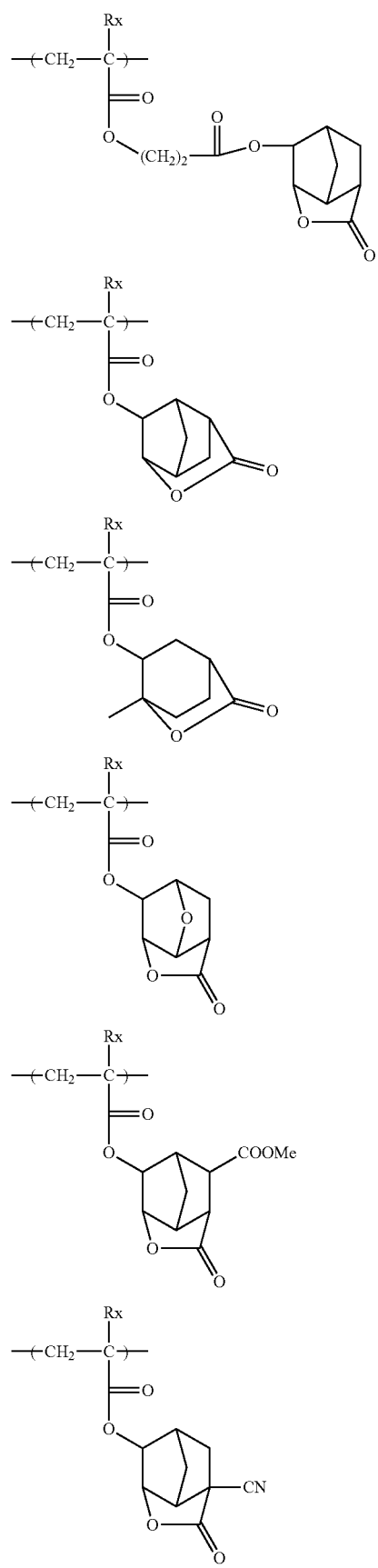
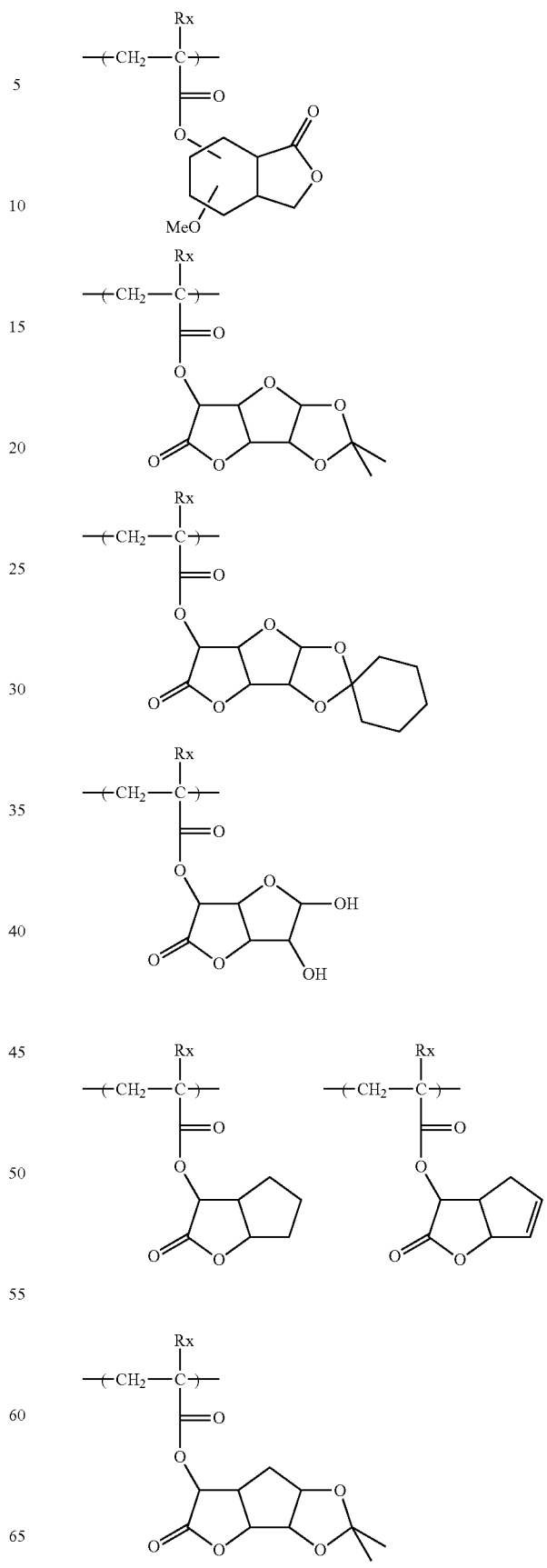

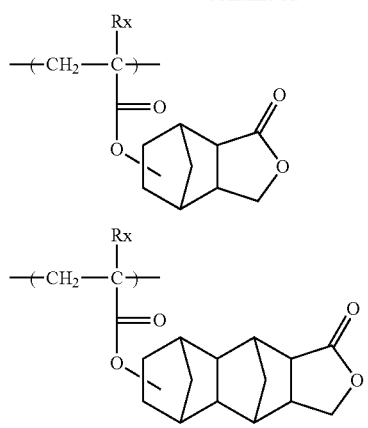

(In the formulae, Rx is H, CH$_3$, CH$_2$OH or CF$_3$.)

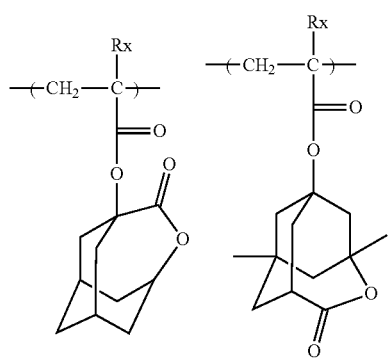

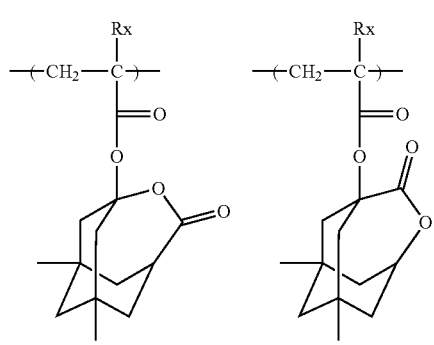

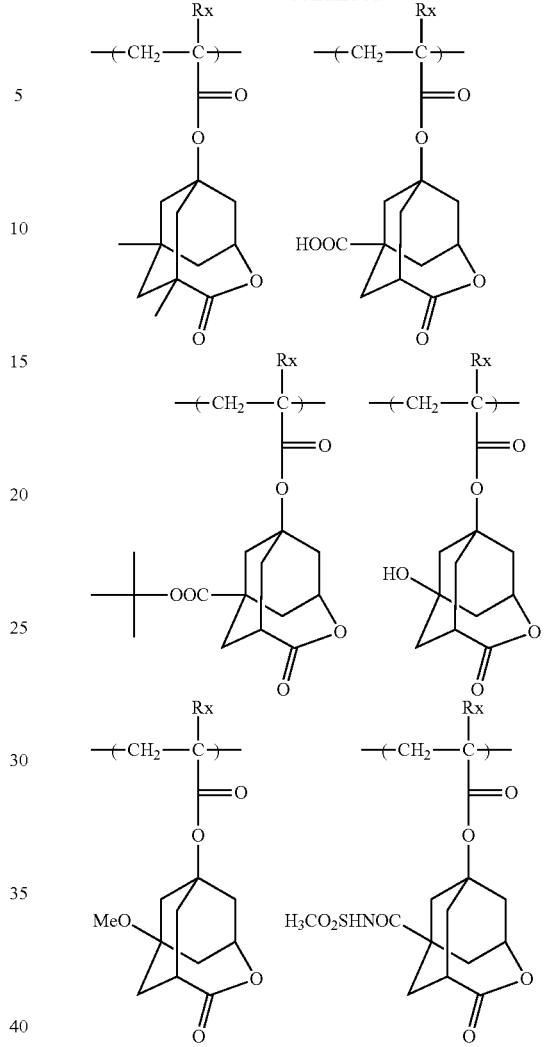

The alicyclic hydrocarbon-based acid-decomposable resin preferably has a repeating unit containing an organic group having a polar group, more preferably a repeating unit having an alicyclic hydrocarbon structure substituted by a polar group. Thanks to this repeating unit, the adherence to substrate and the affinity for developer are enhanced. The alicyclic hydrocarbon structure of the polar group-substituted alicyclic hydrocarbon structure is preferably an adamantyl group, a diamantyl group or a norbornane group. The polar group is preferably a hydroxyl group or a cyano group.

The polar group-substituted alicyclic hydrocarbon structure is preferably a partial structure represented by the following formulae (VIIa) to (VIId):

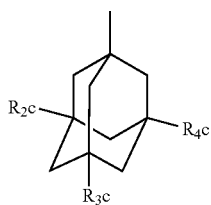

(VIIa)

(VIIb)

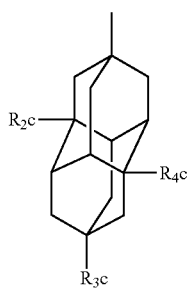

(VIIc)

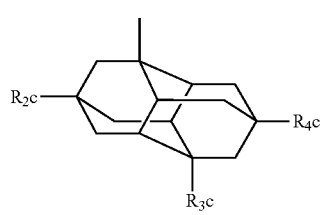

(VIId)

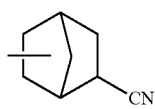

In formulae (VIIa) to (VIIc), each of $R_{2c}$ to $R_{4c}$ independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred.

In formula (VIIa), it is more preferred that two members out of $R_{2c}$ to $R_{4c}$ are a hydroxyl group and the remaining is a hydrogen atom.

Examples of the repeating unit having a group represented by any one of formulae (VIIa) to (VIId) include a repeating unit where at least one of $R_{13}'$ to $R_{16}'$ in formula (II-AB1) or (II-AB2) has a group represented by any one of formulae (VIIa) to (VIId) (for example, $R_5$ of —COOR$_5$ is a group represented by any one of formulae (VIIa) to (VIId)), and repeating units represented by the following formulae (AIIa) to (AIId):

(AIIa)

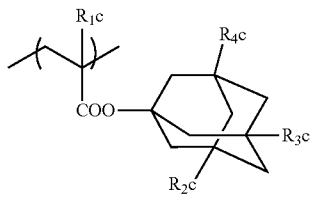

(AIIb)

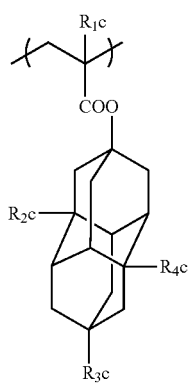

(AIIc)

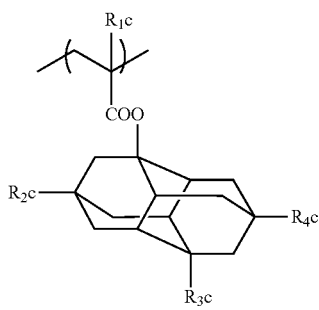

(AIId)

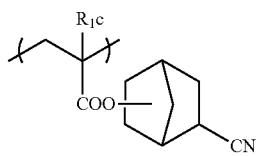

In formulae (AIIa) to (AIId), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formulae (VIIa) to (VIIc).

Specific examples of the repeating units represented by formulae (AIIa) to (AIId) are set forth below, but the present invention is not limited thereto.

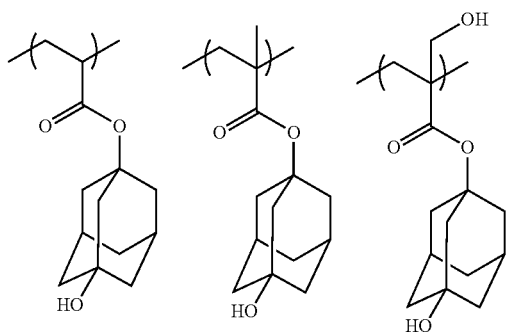

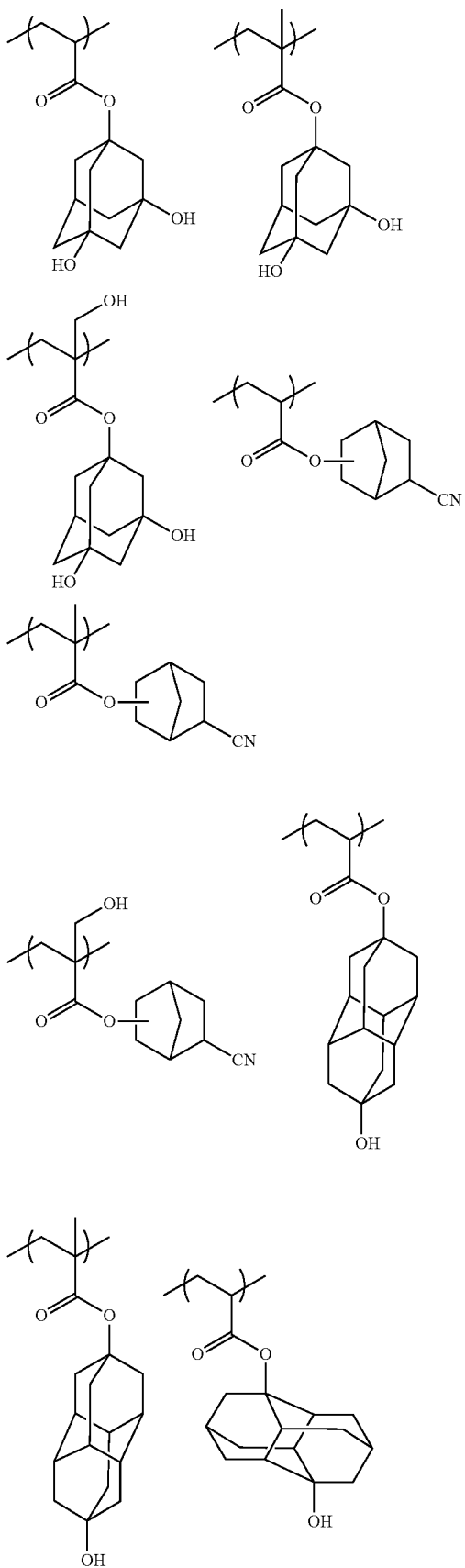

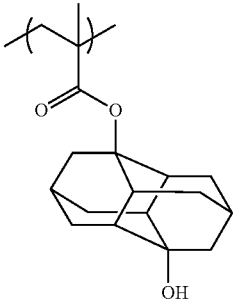

The alicyclic hydrocarbon-based acid-decomposable resin may contain a repeating unit represented by the following formula (VIII):

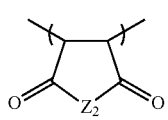

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

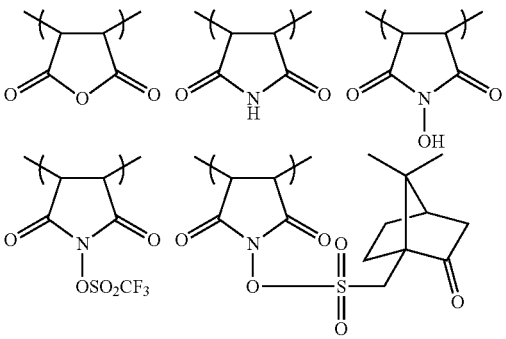

The alicyclic hydrocarbon-based acid-decomposable resin preferably contains a repeating unit having an alkali-soluble group, more preferably a repeating unit having a carboxyl group. By virtue of containing this repeating unit, the resolution increases in the usage of forming contact holes. As for the repeating unit having a carboxyl group, a repeating unit where a carboxyl group is directly bonded to the resin main chain, such as repeating unit by an acrylic acid or a methacrylic acid, a repeating unit where a carboxyl group is bonded to the resin main chain through a linking group, and a repeating unit where a carboxyl group is introduced into the terminal of the polymer chain by using a polymerization initiator or chain transfer agent having an alkali-soluble group at the polymerization, all are preferred. The linking group may have a monocyclic or polycyclic hydrocarbon structure. A repeating unit by an acrylic acid or a methacrylic acid is more preferred.

The alicyclic hydrocarbon-based acid-decomposable resin may further contain a repeating unit having from 1 to 3 groups represented by formula (F1). Thanks to this repeating unit, the performance in terms of line edge roughness is enhanced.

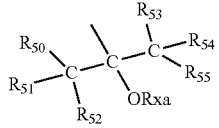

(F1)

In formula (F1), each of $R_{50}$ to $R_{55}$ independently represents a hydrogen atom, a fluorine atom or an alkyl group, provided that at least one of $R_{50}$ to $R_{55}$ is a fluorine atom or an alkyl group with at least one hydrogen atom being replaced by a fluorine atom.

Rxa represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group.

It is preferred that all of $R_{50}$ to $R_{55}$ are a fluorine atom.

The organic group represented by Rxa is preferably an acid-decomposable protective group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F1a):

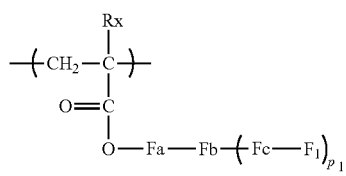

(F1a)

In formula (F1a), Rx represents a hydrogen atom, a halogen atom or an alkyl group (preferably having a carbon number of 1 to 4). Preferred examples of the substituent which the alkyl group of Rx may have include a hydroxyl group and a halogen atom.

Fa represents a single bond or a linear or branched alkylene group and is preferably a single bond.

Fb represents a monocyclic or polycyclic hydrocarbon group.

Fc represents a single bond or a linear or branched alkylene group and is preferably a single bond or a methylene group.

$F_1$ represents a group represented by formula (F1).

$p_1$ represents a number of 1 to 3.

The cyclic hydrocarbon group in Fb is preferably a cyclopentylene group, a cyclohexylene group or a norbornylene group.

Specific examples of the repeating unit having a group represented by formula (F1) are set forth below, but the present invention is not limited thereto.

The alicyclic hydrocarbon-based acid-decomposable resin may further contain a repeating unit having an alicyclic hydrocarbon structure and not exhibiting acid decomposability. Thanks to this repeating unit, the dissolving out of low molecular components from the resist film to the immersion liquid at the immersion exposure can be reduced. Examples of such a repeating unit include repeating units by 1-adamantyl(meth)acrylate, tricyclodecanyl(meth)acrylate and cyclohexyl(meth)acrylate.

The alicyclic hydrocarbon-based acid-decomposable resin may contain, in addition to the above-described repeating units, various repeating units for the purpose of controlling dry etching resistance, suitability for standard developer, adherence to substrate, resist profile and properties generally required of the resist, such as resolution, heat resistance and sensitivity.

Examples of such a repeating unit include, but are not limited to, repeating units corresponding to the monomers described below.

Thanks to this repeating unit, the performance required of the alicyclic hydrocarbon-based acid-decomposable resin, particularly (1) solubility in coating solvent,
(2) film-forming property (glass transition temperature),
(3) solubility in positive tone developer and negative tone developer,
(4) film loss (selection of hydrophilic, hydrophobic or alkali-soluble group),
(5) adherence of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adherence to substrate, resist profile and performances generally required of the resist, such as resolution, heat resistance and sensitivity.

The preferred embodiment of the alicyclic hydrocarbon-based acid-decomposable resin includes the followings:

(1) a resin containing a repeating unit having an alicyclic hydrocarbon-containing partial structure represented by any one of formulae (pI) to (pV) (side chain type), preferably a resin containing a (meth)acrylate repeating unit having a structure represented by any one of formulae (pI) to (pV), and (2) a resin containing a repeating unit represented by formula (II-AB) (main chain type).

The resin of (2) further includes, for example:

(3) a resin having a repeating unit represented by formula (II-AB), a maleic anhydride derivative-based repeating unit, and a (meth)acrylate-based repeating unit (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 20 to 70 mol %, more preferably from 20 to 50 mol %, still more preferably from 25 to 40 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

In the alicyclic hydrocarbon-based acid-decomposable resin, the content of the repeating unit containing a group having a lactone structure is preferably from 10 to 70 mol %, more preferably from 20 to 60 mol %, still more preferably from 25 to 40 mol %, based on all repeating structural units.

In the alicyclic hydrocarbon-based acid-decomposable resin, the content of the repeating unit having a polar group-containing organic group is preferably from 1 to 40 mol %, more preferably from 5 to 30 mol %, still more preferably from 5 to 20 mol %, based on all repeating structural units.

The content of the repeating structural unit based on the monomer as the further copolymerization component in the resin can also be appropriately set according to the desired resist performance but in general, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

In the case where the resist composition for negative tone development of the present invention is used for ArF exposure, the resin preferably has no aromatic group in view of transparency to ArF light.

The alicyclic hydrocarbon-based acid-decomposable resin is preferably a resin where all repeating units are composed of a (meth)acrylate-based repeating unit. In this case, all of the repeating units may be a methacrylate-based repeating unit, all of the repeating units may be an acrylate-based repeating unit, or all of the repeating units may be a mixture of methacrylate-based repeating unit/acrylate-based repeating unit, but the acrylate-based repeating unit preferably accounts for 50 mol % or less of all repeating units.

The alicyclic hydrocarbon-based acid-decomposable resin is preferably a copolymer having at least three kinds of repeating units, that is, a (meth)acrylate-based repeating unit having a lactone structure, a (meth)acrylate-based repeating unit having an organic group substituted by at least either a hydroxyl group or a cyano group, and a (meth)acrylate-based repeating unit having an acid-decomposable group.

The copolymer is preferably a ternary copolymerization polymer containing from 20 to 50 mol % of the repeating unit having an alicyclic hydrocarbon-containing partial structure represented by any one of formulae (pI) to (pV), from 20 to 50 mol % of the repeating unit having a lactone structure and from 5 to 30 mol % of the repeating unit having a polar group-substituted alicyclic hydrocarbon structure, or a quaternary copolymerization polymer further containing from 0 to 20 mol % of other repeating units.

In particular, the resin is preferably a ternary copolymerization polymer containing from 20 to 50 mol % of an acid-decomposable group-containing repeating unit represented by any one of the following formulae (ARA-1) to (ARA-7), from 20 to 50 mol % of a repeating unit containing a group having a lactone structure represented by any one of the following formulae (ARL-1) to (ARL-7), and from 5 to 30 mol % of a repeating unit having a polar group-substituted alicyclic hydrocarbon structure represented by any one of the following formulae (ARH-1) to (ARH-3), or a quaternary copolymerization polymer further containing from 5 to 20 mol % of a repeating unit having a carboxyl group or a structure represented by formula (F1) or a repeating unit having an alicyclic hydrocarbon structure and not exhibiting acid decomposability.

(In the formulae, $Rxy_1$ represents a hydrogen atom or a methyl group, each of $Rxa_1$ and $Rxb_1$ independently represents a methyl group or an ethyl group, and $Rxc_1$ represents a hydrogen atom or a methyl group).

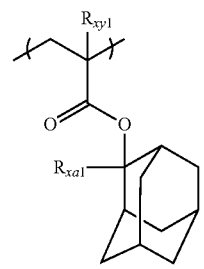

(ARA-1)

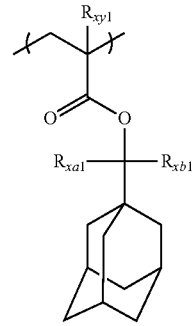

(ARA-2)

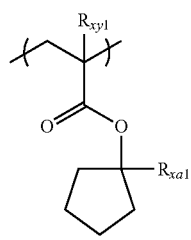 (ARA-3)
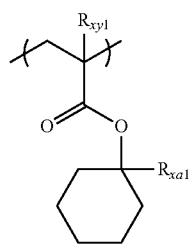 (ARA-4)
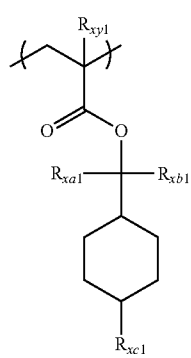 (ARA-5)
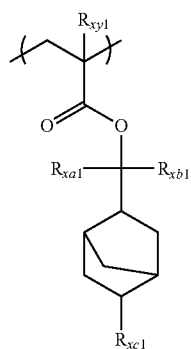 (ARA-6)
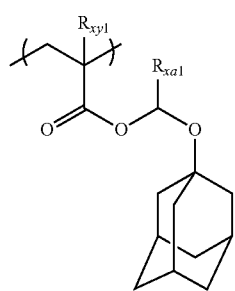 (ARA-7)
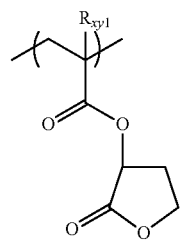 (ARL-1)
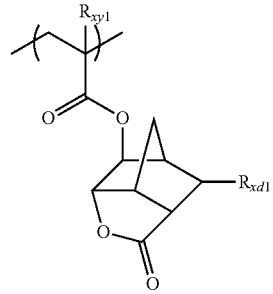 (ARL-2)
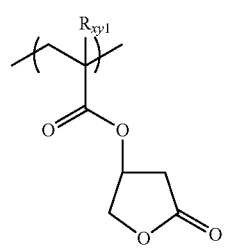 (ARL-3)
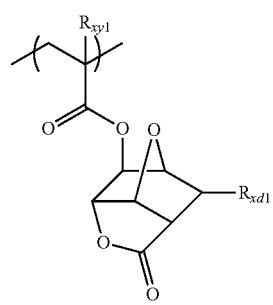 (ARL-4)
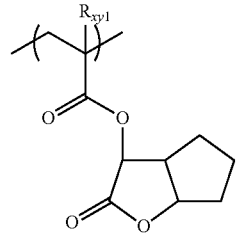 (ARL-5)
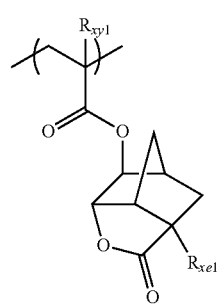 (ARL-6)
(In the formulae, $Rxy_1$ represents a hydrogen atom or a methyl group, $Rxd_1$ represents a hydrogen atom or a methyl group, and $Rxe_1$ represents a trifluoromethyl group, a hydroxyl group or a cyano group).

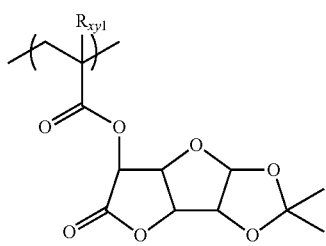
(ARL-7)

(In the formulae, $R_{xy1}$ represents a hydrogen atom or a methyl group).

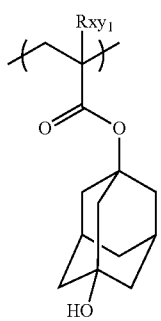
ARH-1

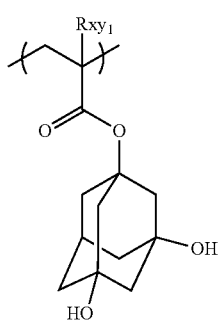
ARH-2

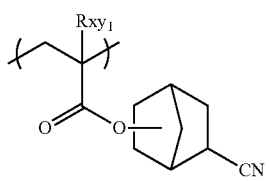
ARH-3

The alicyclic hydrocarbon-based acid-decomposable resin can be synthesized by an ordinary method (for example, radical polymerization). Examples of the synthesis method in general include a batch polymerization method of dissolving the monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane and diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the resist composition of the present invention. By the use of this solvent, production of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is recovered by a method such as powder or solid recovery. The concentration of the solute such as monomer and polymerization initiator in the reaction solution is from 5 to 50 mass %, preferably from 10 to 30 mass %. The reaction temperature is usually from 10 to 150° C., preferably from 30 to 120° C., more preferably from 60 to 100° C.

The purification may be performed by the same method as that for the resin (D) described later, and a normal method, for example, a liquid-liquid extraction method of combining water washing with an appropriate solvent to remove residual monomers or oligomer components, a purification method in a solution sate, such as ultrafiltration of extracting and removing only polymers having a molecular weight lower than a specific molecular weight, a reprecipitation method of adding dropwise the resin solution in a poor solvent to solidify the resin in the poor solvent and thereby remove residual monomers and the like, or a purification method in a solid state, such as washing of the resin slurry with a poor solvent after separation by filtration, may be employed.

The weight average molecular weight of the resin (A) is preferably from 1,000 to 200,000, more preferably from 1,000 to 20,000, still more preferably from 1,000 to 15,000, in terms of polystyrene by the GPC method. By virtue of setting the weight average molecular weight to be from 1,000 to 200,000, the heat resistance, dry etching resistance and developability can be prevented from deterioration and also, the film-forming property can be prevented from deteriorating due to rise of the viscosity.

The polydispersity (molecular weight distribution) is usually from 1 to 5, preferably from 1 to 3, more preferably from 1.2 to 3.0, still more preferably from 1.2 to 2.0. As the polydispersity is smaller, the resolution and resist profile are more excellent, the side wall of the resist pattern is smoother, and the property in terms of roughness is more improved.

In the resist composition of the present invention, the amount of all resins for use in the present invention blended in the entire composition is preferably from 50 to 99.9 mass %, more preferably from 60 to 99.0 mass %, based on the entire solid content.

In the present invention, one kind of a resin may be used or a plurality of kinds of resins may be used in combination.

The alicyclic hydrocarbon-based acid-decomposable resin preferably contains no fluorine and silicon atoms in view of compatibility with the resin (D).

(B) Compound Capable of Generating an Acid Upon Irradiation with an Actinic Ray or Radiation The resist composition of the present invention contains a compound capable of generating an acid having an acid dissociation index pKa of −4.0 or less upon irradiation with an actinic ray or radiation (sometimes referred to as a "component (B)").

As for the compound (B), use of a compound capable of generating an acid having a pKa of −6.5 or less is preferred, use of a compound capable of generating an acid having a pKa of −8.5 or less is more preferred, and use of a compound capable of generating an acid having a pKa of −10.5 or less is still more preferred.

In the present invention, the acid dissociation index pKa indicates an acid dissociation index pKa in an aqueous solution, and the "acid dissociation index" is the logarithm of the reciprocal of the acid dissociation constant and is described, for example, in Kagaku Binran (Chemical Handbook) II, 4th revised edition, compiled by The Chemical Society of Japan, Maruzen Co., Ltd., Maruzen (1993). As this value is lower, the acid strength is larger. Specifically, the acid dissociation index pKa in an aqueous solution can be measured in practice with an aqueous infinite dilution solution by measuring the acid dissociation constant at 25° C. Alternatively, a value based on a data base containing Hammett's substituent constants and values known in publications can be computed using the following Software Package 1. The pKa values referred to in the present invention all are a value determined by computation using this software package.

Software Package 1: Advanced Chemistry Development (ACD/Labs) Software V8.14 for Solaris (1994-2007 ACD/Labs)

By virtue of containing a compound capable of generating an acid having an acid dissociation index pKa of −4.0 or less (preferably an acid represented by formula (P-1)) upon irradiation with an actinic ray or radiation, a pattern improved in the line edge roughness and endowed with a good profile (prevented from an undercut in the lower part of the resist pattern) can be obtained in the pattern formation by negative tone development using a negative tone developer (preferably an organic solvent). The reason therefor is not clearly known but is presumed as follows.

In an acid having an acid dissociation index pKa of −4.0 or less, a sufficiently large amount of negative charge of the anion in the photo-acid generator is delocalized on the anion and therefore, the photo-acid generator is prevented from clustering together accompanying the electrostatic interaction, which fulfills an important role in obtaining good dissolution properties of the resist composition in the process of negative tone development using a negative tone developer (preferably an organic solvent), as a result, good pattern formability can be obtained.

Furthermore, a certain kind of an organic substrate has a tendency that the acid decomposition reaction of the acid-decomposable group in the resin (A) by an acid generated from the photo-acid generator is inhibited in the exposed area by some action and the resin (A) excessively dissolves in the negative tone developer (preferably an organic solvent) to readily cause an undercut in the lower part of the resist pattern at the substrate interface, whereas the compound capable of generating an acid having an acid dissociation index pKa of −4.0 or less (preferably an acid represented by formula (P-1)) for use in the present invention has sufficiently high acid strength and allows the reaction with the acid-decomposable group to satisfactorily proceed even in a portion where the acid decomposition reaction of the resin (A) is inhibited, such as substrate interface.

The compound capable of generating an acid having an acid dissociation index pKa of −4.0 or less is preferably a compound capable of generating an acid represented by the following formula (P-1):

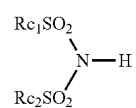

(P-1)

In formula (P-1), each of $Rc_1$ and $Rc_2$ independently represents an organic group, and $Rc_1$ and $Rc_2$ may combine with each other to form a ring.

In formula (P-1), the organic group of $Rc_1$ and $Rc_2$ is, for example, an alkyl group or an aryl group, preferably an alkyl group with at least the 1-position being substituted by a fluorine atom or a fluoroalkyl group, or a phenyl group substituted by a fluorine atom, a fluoroalkyl group or a nitro group. The alkyl group is preferably an alkyl group having a carbon number of 1 to 8, to which an alkoxy group, an alkoxycarbonyl group, an alkylthio group, an acylamino group, an oxoalkyl group, an alkylsulfonyloxy group, an alkylsulfonyl group, an alkylsulfonylamino group, an arylsulfonyl group, an alkylarylsulfonyl group, a cycloalkylarylsulfonyl group or an alkylaminosulfonyl group represented by $(Rx_1)(Rx_2)NSO_2$— may be bonded through a single bond or a divalent linking group. In the formula, each of $Rx_1$ and $Rx_2$ represents an alkyl group having a carbon number of 2 or more and is preferably not substituted by fluorine. $Rx_1$ and $Rx_2$ may combine to form a monocyclic or polycyclic ring structure. The monocyclic or polycyclic ring structure formed by combining $Rx_1$ and $Rx_2$ may further have a substituent. When the organic group of $Rc_1$ and $Rc_2$ has a fluorine atom or a fluoroalkyl group, the negative charge in the anion structure of the compound (B) is more delocalized and the effect of the present invention is enhanced. The organic group of $Rc_1$ and $Rc_2$ is more preferably a perfluoroalkyl group having a carbon number of 1 to 8, still more preferably a perfluoroalkyl group having a carbon number of 1 to 4, yet still more preferably a trifluoromethyl group.

Another preferred embodiment of the organic group of $Rc_1$ and $Rc_2$ is a fluorine-substituted alkyl group having a carbon number of 2 to 6, to which an alkylsulfonyl group or an alkylaminosulfonyl group above is bonded. Above all, an alkyl group having a carbon number of 2 to 3, to which an alkylsulfonyl group or an alkylaminosulfonyl group above is bonded and in which a fluorine atom is substituted on the carbon atom bonded at least to the $SO_2$-site, is preferred (more preferably a perfluoroalkyl group).

A still another preferred embodiment of the organic group of $Rc_1$ and $Rc_2$ is a group where $Rc_1$ and $Rc_2$ are combined with each other to form a ring. The group formed by combining $Rc_1$ and $Rc_2$ with each other includes an alkylene group and an arylene group and is preferably a perfluoroalkylene group having a carbon number of 2 to 4, more preferably a perfluoropropylene group. When those groups are combined to form a ring, this is preferred because the negative charge is more delocalized as compared with a case of not forming a ring and the effect of the present invention is more enhanced.

The organic group of $Rc_1$ and $Rc_2$ or the ring formed by combining $Rc_1$ and $Rc_2$ with each other may further have a substituent. The further substituent is preferably a substituent having an aromatic ring, a cyclic hydrocarbon structure or a heteroatom-containing cyclic hydrocarbon structure. By the introduction of the further substituent, diffusivity of the acid generated can be controlled and the balance with other resist performances such as sensitivity and resolution becomes good.

Specific preferred examples of the acid represented by formula (P-1) are set forth below, but the present invention is not limited thereto.

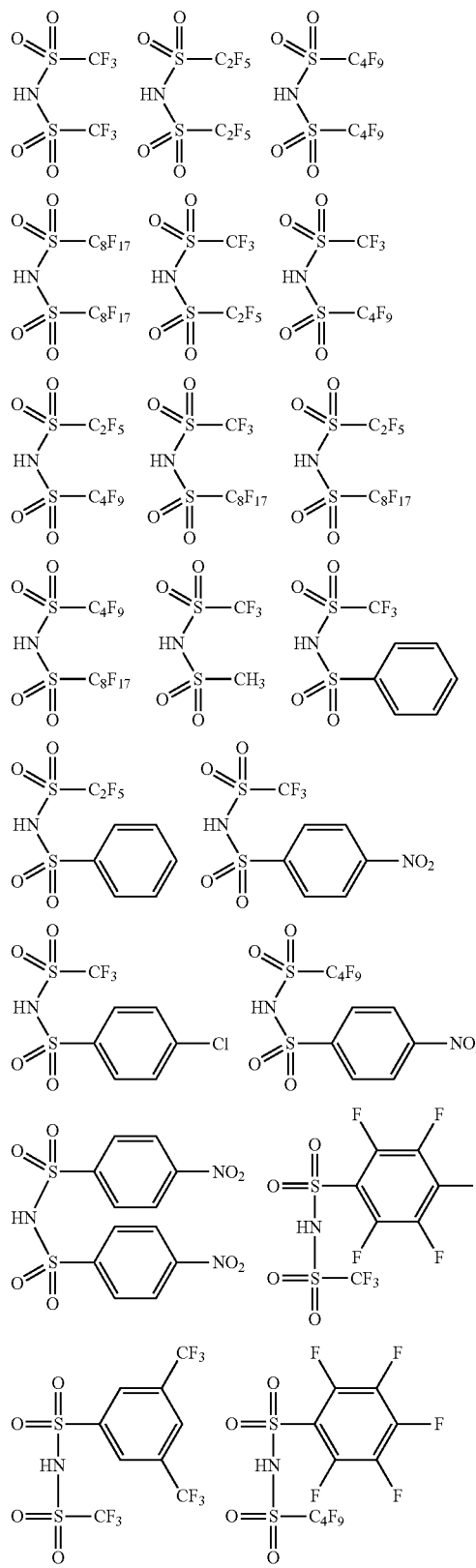

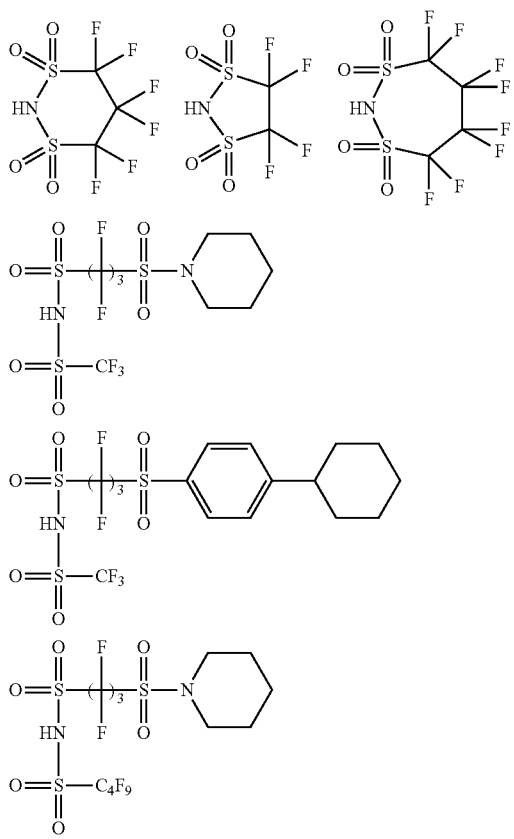

The compound capable of generating an acid represented by formula (P-1) upon irradiation with an actinic ray or radiation is preferably one member selected from sulfonium salt and iodonium salt compounds of the acid represented by formula (P-1) or one member selected from ester compounds of the acid represented by formula (P-1), more preferably a compound represented by any one of formulae (B1) to (B5).

(B1)

(B2)

(B3)

(B4)

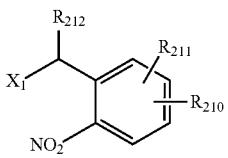
(B5)

In formula (B1), each of $R_{201}$, $R_{202}$ and $R_{203}$ independently represents an organic group.

X⁻ represents an anion after removing hydrogen atom from the acid represented by formula (P-1).

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (B1a), (B1b) and (B1c) which are described later.

The compound may be a compound having a plurality of structures represented by formula (B1). For example, the compound may be a compound having a structure where at least one of $R_{201}$ to $R_{203}$ in the compound represented by formula (B1) is bonded to at least one of $R_{201}$ to $R_{203}$ in another compound represented by formula (B1).

The component (B1) is more preferably a compound (B1a), (B1b) or (B1c) described below.

The compound (B1a) is an arylsulfonium compound where at least one of $R_{201}$ to $R_{203}$ in formula (B1) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. In the case where the arylsulfonium compound has two or more aryl groups, these two or more aryl groups may be the same or different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 15, or a linear, branched or cyclic alkoxy group having a carbon number of 1 to 12, more preferably an alkyl group having a carbon number of 1 to 4 or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (B1b) is described below.

The compound (B1b) is a compound where each of $R_{201}$ to $R_{203}$ in formula (B1) independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

Each of $R_{201}$ to $R_{203}$ is independently preferably an alkyl group, a cycloalkyl group, an allyl group or a vinyl group, more preferably a linear, branched or cyclic 2-oxoalkyl group, still more preferably a linear or branched 2-oxoalkyl group.

The alkyl group as $R_{201}$ to $R_{203}$ may be either linear or branched and is preferably a linear or branched alkyl group having a carbon number of 1 to 20 (e.g., methyl, ethyl, propyl, butyl, pentyl). The alkyl group as $R_{201}$ to $R_{203}$ is more preferably a linear or branched 2-oxoalkyl group or an alkoxycarbonylmethyl group.

The cycloalkyl group as $R_{201}$ to $R_{203}$ is preferably a cycloalkyl group having a carbon number of 3 to 10 (e.g., cyclopentyl, cyclohexyl, norbornyl). The cycloalkyl group as $R_{201}$ to $R_{203}$ is more preferably a cyclic 2-oxoalkyl group.

The linear, branched or cyclic 2-oxoalkyl group as $R_{201}$ to $R_{203}$ is preferably a group having >C=O at the 2-position of the above-described alkyl or cycloalkyl group. The linear, branched or cyclic 2-oxoalkyl group as $R_{201}$ to $R_{203}$ may have a double bond in the chain.

The alkoxy group in the alkoxycarbonylmethyl group as $R_{201}$ to $R_{203}$ is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, an alkoxy group having a carbon number of 1 to 5), a hydroxyl group, a cyano group or a nitro group.

The compound (B1c) is a compound represented by the following formula (B1c), and this is a compound having an arylacylsulfonium salt structure.

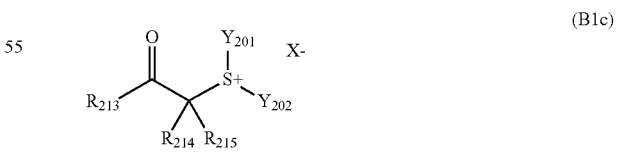
(B1c)

In formula (B1c), $R_{213}$ represents an aryl group which may be substituted, and is preferably a phenyl group or a naphthyl group.

Preferred examples of the substituent on $R_{213}$ include an alkyl group, an alkoxy group, an acyl group, a nitro group, a hydroxyl group, an alkoxycarbonyl group and a carboxy group.

Each of $R_{214}$ and $R_{215}$ independently represents a hydrogen atom, an alkyl group or a cycloalkyl group.

Each of $Y_{201}$ and $Y_{202}$ independently represents an alkyl group, a cycloalkyl group, an aryl group or a vinyl group.

$R_{213}$ and $R_{214}$ may combine to form a ring structure, $R_{214}$ and $R_{215}$ may combine to form a ring structure, and $Y_{201}$ and $Y_{202}$ may combine to form a ring structure. The ring structure formed may contain an oxygen atom, a sulfur atom, an ester bond or an amide bond. Examples of the group formed by combining each pair of $R_{213}$ and $R_{214}$, $R_{214}$ and $R_{215}$, and $Y_{201}$ and $Y_{202}$ include a butylene group and a pentylene group.

$X^-$ represents a sulfonate anion after removing hydrogen atom from the acid represented by formula (P-1).

The alkyl group as $R_{214}$ and $R_{215}$ is preferably a linear or branched alkyl group having a carbon number of 1 to 20.

The cycloalkyl group as $R_{214}$ and $R_{215}$ is preferably a cycloalkyl group having a carbon number of 3 to 20.

The alkyl group as $Y_{201}$ and $Y_{202}$ is preferably a linear or branched alkyl group having a carbon number of 1 to 20. The alkyl group as $Y_{201}$ and $Y_{202}$ is preferably a linear or branched 2-oxoalkyl group. The alkyl group as $Y_{201}$ and $Y_{202}$ may be substituted by an alkoxycarbonyl group, a carbonyl group or the like.

The cycloalkyl group as $Y_{201}$ and $Y_{202}$ is preferably a cycloalkyl group having a carbon number of 3 to 20. The cycloalkyl group as $Y_{201}$ and $Y_{202}$ is preferably a cyclic 2-oxoalkyl group.

The linear, branched or cyclic 2-oxoalkyl group as $Y_{201}$ and $Y_{202}$ includes a group having $>C=O$ at the 2-position of the alkyl or cycloalkyl group as $Y_{201}$ and $Y_{202}$.

Each of $Y_{201}$ and $Y_{202}$ is preferably an alkyl group having a carbon number of 4 or more, more preferably from 4 to 16, still more preferably from 4 to 12.

At least either one of $R_{214}$ and $R_{215}$ is preferably an alkyl group, and more preferably, both of $R_{214}$ and $R_{215}$ are an alkyl group.

In formula (B2), each of $R_{204}$ and $R_{205}$ independently represents an aryl, alkyl or cycloalkyl group which may have a substituent.

$X^-$ represents an anion after removing hydrogen atom from the acid represented by formula (P-1).

The aryl group of $R_{204}$ and $R_{205}$ in formula (B2) is preferably a phenyl group or a naphthyl group, more preferably a phenyl group.

The alkyl group as $R_{204}$ and $R_{205}$ may be either linear or branched and is preferably a linear or branched alkyl group having a carbon number of 1 to 10 (e.g., methyl, ethyl, propyl, butyl, pentyl).

The cycloalkyl group as $R_{204}$ and $R_{205}$ is preferably a cycloalkyl group having a carbon number of 3 to 10 (e.g., cyclopentyl, cyclohexyl, norbornyl).

Examples of the substituent which $R_{204}$ and $R_{205}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

In formula (B3), A represents a substituted or unsubstituted alkylene, alkenylene or arylene group.

$X_1$ represents a monovalent group after removing hydrogen atom from the acid represented by formula (P-1).

In formula (B4), $R_{208}$ represents a substituted or unsubstituted alkyl, cycloalkyl or aryl group.

$R_{209}$ represents an alkyl group, a cyano group, an oxoalkyl group or an alkoxycarbonyl group and is preferably a halogen-substituted alkyl group or a cyano group.

$X_1$ represents a monovalent group after removing hydrogen atom from the acid represented by formula (P-1).

In formula (B5), each of $R_{210}$ and $R_{211}$ independently represents a hydrogen atom, an alkyl group, a cyano group, a nitro group or an alkoxycarbonyl group and is preferably a halogen-substituted alkyl group, a nitro group or a cyano group.

$R_{212}$ represents a hydrogen atom, an alkyl group, a cyano group or an alkoxycarbonyl group.

$X_1$ represents a monovalent group after removing hydrogen atom from the acid represented by formula (P-1).

The compound represented by formula (B1) is preferred, and compounds represented by formulae (B1a) to (B1c) are more preferred.

The compound (B) preferably has a triphenylsulfonium structure.

The compound (B) is preferably a triphenylsulfonium salt compound having a fluorine-unsubstituted alkyl or cycloalkyl group in the cation moiety.

Out of the compounds capable of generating an acid represented by formula (P-1) upon irradiation with an actinic ray or radiation, preferred examples are set forth below, but the present invention is not limited thereto.

A2-II-1

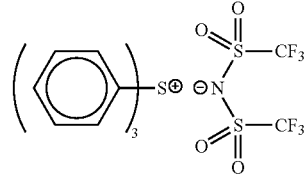

A2-II-2

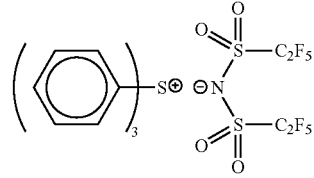

A2-II-3

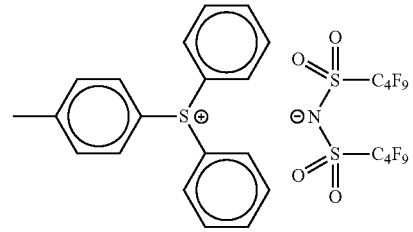

A2-II-4

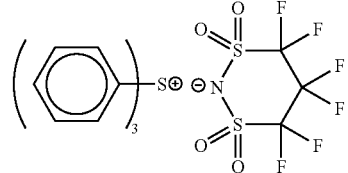

-continued

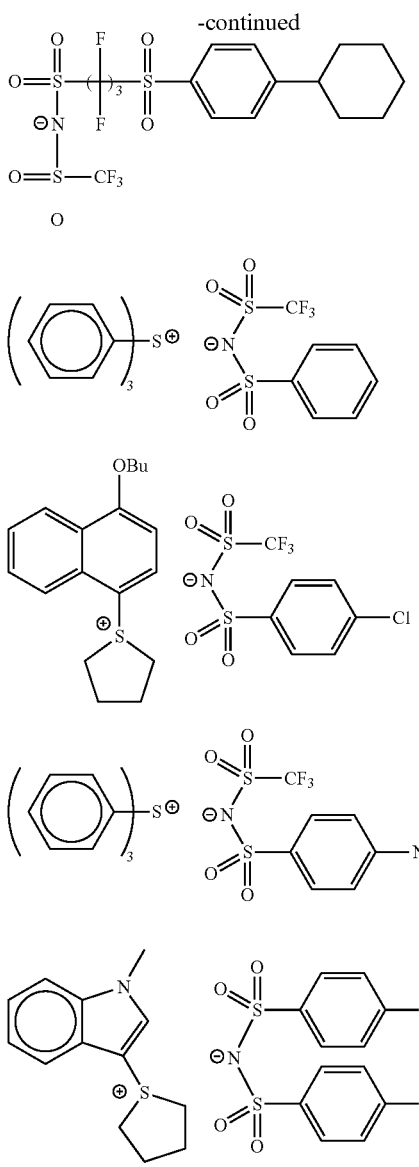

A2-II-18

A2-II-19

A2-II-20

A2-II-21

The compound capable of generating an acid represented by formula (P-1) is obtained by reacting a corresponding 2-halogen-substituted ketone and a sulfide compound in the absence of a catalyst or in the presence of a silver catalyst to synthesize a sulfonium skeleton and salt-exchanging the sulfonium skeleton with a corresponding anion. In another synthesis method, a corresponding ketone derivative is reacted with a trialkylsilyl halogenide under basic conditions and thereby converted into a silyl enol ether which is reacted with a sulfoxide to synthesize a sulfonium skeleton, and the sulfonium skeleton is salt-exchanged with a corresponding anion, whereby the compound is obtained.

The content of the compound (B) is preferably from 0.1 to 20 mass %, more preferably from 0.5 to 10 mass %, still more preferably from 1 to 7 mass %, based on the entire solid content of the resist composition.

As for the compound (B), one kind may be used alone or two or more kinds may be used in combination.

In using two or more kinds of compounds in combination, the compound (B) may also be used in combination with other acid generators.

In the case of using two or more kinds of compounds in combination, the ratio of acid generators used is, in terms of the molar ratio (compound (B)/other acid generators), usually from 99/1 to 20/80, preferably from 99/1 to 40/60, more preferably from 99/1 to 50/50.

The acid generator which can be used in combination may be appropriately selected from a photo-initiator for cationic photopolymerization, a photo-initiator for radical photopolymerization, a photodecoloring agent for dyes, a photodiscoloring agent, a known compound used for microresist or the like and capable of generating an acid upon irradiation with an actinic ray or radiation, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

(C) Solvent

Examples of the solvent which can be used at the time of preparing the photosensitive composition by dissolving the above-described components include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6- dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used includes a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent not containing a hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are more preferred.

The mixing ratio (by mass) of the solvent containing a hydroxyl group to the solvent not containing a hydroxyl group is usually from 1/99 to 99/1, preferably from 10/90 to 90/10, more preferably from 20/80 to 60/40. A mixed solvent in which the solvent not containing a hydroxyl group is contained in an amount of 50 mass % or more is particularly preferred in view of coating uniformity.

The solvent is preferably a mixed solvent of two or more kinds of solvents containing propylene glycol monomethyl ether acetate.

(D) Resin Having at Least Either a Fluorine Atom or a Silicon Atom

The resist composition of the present invention preferably contains (D) a resin having at least either a fluorine atom or a silicon atom.

In the resin (D), the fluorine atom or silicon atom may be present in the main chain of the resin or may be substituted on the side chain.

The resin (D) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being replaced by a fluorine atom and may further other substituents.

The fluorine atom-containing cycloalkyl group is a monocyclic or polycyclic cycloalkyl group with at least one hydrogen atom being replaced by a fluorine atom and may further have other substituents.

The fluorine atom-containing aryl group is an aryl group (e.g., phenyl, naphthyl) with at least one hydrogen atom being replaced by a fluorine atom and may further have other substituents.

Specific examples of the fluorine atom-containing alkyl group, fluorine atom-containing cycloalkyl group and fluorine atom-containing aryl group are set forth below, but the present invention is not limited thereto.

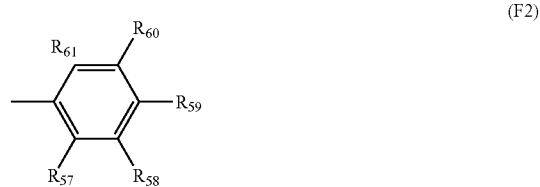

(F2)

(F3)

(F4)

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being replaced by a fluorine atom. It is preferred that $R_{57}$ to $R_{61}$ and $R_{65}$ to $R_{67}$ all are a fluorine atom. Each of $R_{62}$, $R_{63}$ and $R_{68}$ is preferably an alkyl group (preferably having a carbon number of 1 to 4) with at least one hydrogen atom being replaced by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoroethyl group, pentafluoropropyl group, pentafluoroethyl group, heptafluorobutyl group, hexafluoroisopropyl group, heptafluoroisopropyl group, hexafluoro(2- methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The resin (D) is preferably a resin having an alkylsilyl structure (preferably a trialkylsilyl group) or a cyclic siloxane structure, as a silicon atom-containing partial structure.

Specific examples of the alkylsilyl structure and cyclic siloxane structure include groups represented by the following formulae (CS-1) to (CS-3):

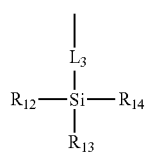
(CS-1)

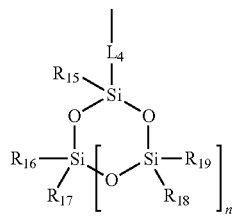
(CS-2)

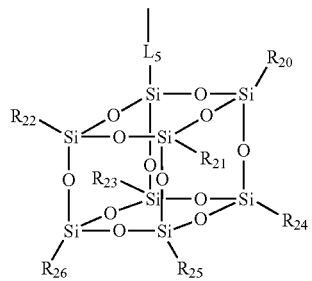
(CS-3)

In formulae (CS-1) to (CS-3), each of $R_{12}$ to $R_{26}$ independently represents a linear alkyl group (preferably having a carbon number of 1 to 20), a branched alkyl group or a cycloalkyl group (preferably having a carbon number of 3 to 20).

Each of $L_3$ to $L_5$ represents a single bond or a divalent linking group. The divalent linking group is a sole group or a combination of two or more groups selected from the group consisting of an alkylene group, a phenylene group, an ether group, a thioether group, a carbonyl group, an ester group, an amide group, a ureylene group and a urea group.

n represents an integer of 1 to 5.

The resin (D) includes a resin containing at least one member selected from the group consisting of repeating units represented by the following formulae (C-I) to (C-V):

(C-I)

(C-II)

(C-III)

(C-IV)

(C-V)

In formulae (C-I) to (C-V), each of $R_1$ to $R_3$ independently represents a hydrogen atom, a fluorine atom, a linear or branched alkyl group (preferably having a carbon number of 1 to 4), or a linear or branched fluorinated alkyl group (preferably having a carbon number of 1 to 4).

Each of $W_1$ and $W_2$ represents an organic group having at least either a fluorine atom or a silicon atom.

Each $R_4$ to $R_7$ independently represents a hydrogen atom, a fluorine atom, a linear or branched alkyl group (preferably having a carbon number of 1 to 4), or a linear or branched fluorinated alkyl group (preferably having a carbon number of 1 to 4), provided that at least one of $R_4$ to $R_7$ represents a fluorine atom. $R_4$ and $R_5$, or $R_6$ and $R_7$ may form a ring.

$R_8$ represents a hydrogen atom or a linear or branched alkyl group (preferably having a carbon number of 1 to 4).

$R_9$ represents a linear or branched alkyl group (preferably having a carbon number of 1 to 4), or a linear or branched fluorinated alkyl group (preferably having a carbon number of 1 to 4).

Each of $L_1$ and $L_2$ represents a single bond or a divalent linking group and has the same meaning as $L_3$ to $L_5$ above.

Q represents a monocyclic or polycyclic aliphatic group, that is, an atomic group for forming an alicyclic structure, including the two bonded carbon atoms (C—C).

Each of $R_{30}$ and $R_{31}$ independently represents a hydrogen or fluorine atom.

Each of $R_{32}$ and $R_{33}$ independently represents an alkyl group, a cycloalkyl group, a fluorinated alkyl group or a fluorinated cycloalkyl group.

Here, the repeating unit represented by formula (C-V) has at least one fluorine atom in at least one member out of $R_{30}$, $R_{31}$, $R_{32}$ and $R_{33}$.

The resin (D) preferably has a repeating unit represented by formula (C-I), more preferably a repeating unit represented by any one of the following formulae (C-Ia) to (C-Id):

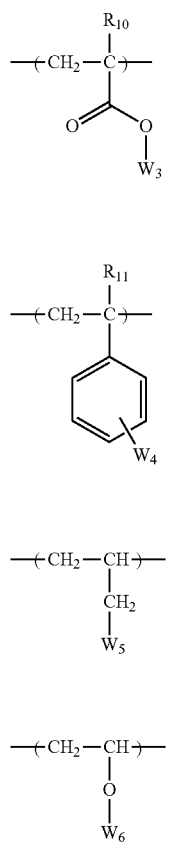

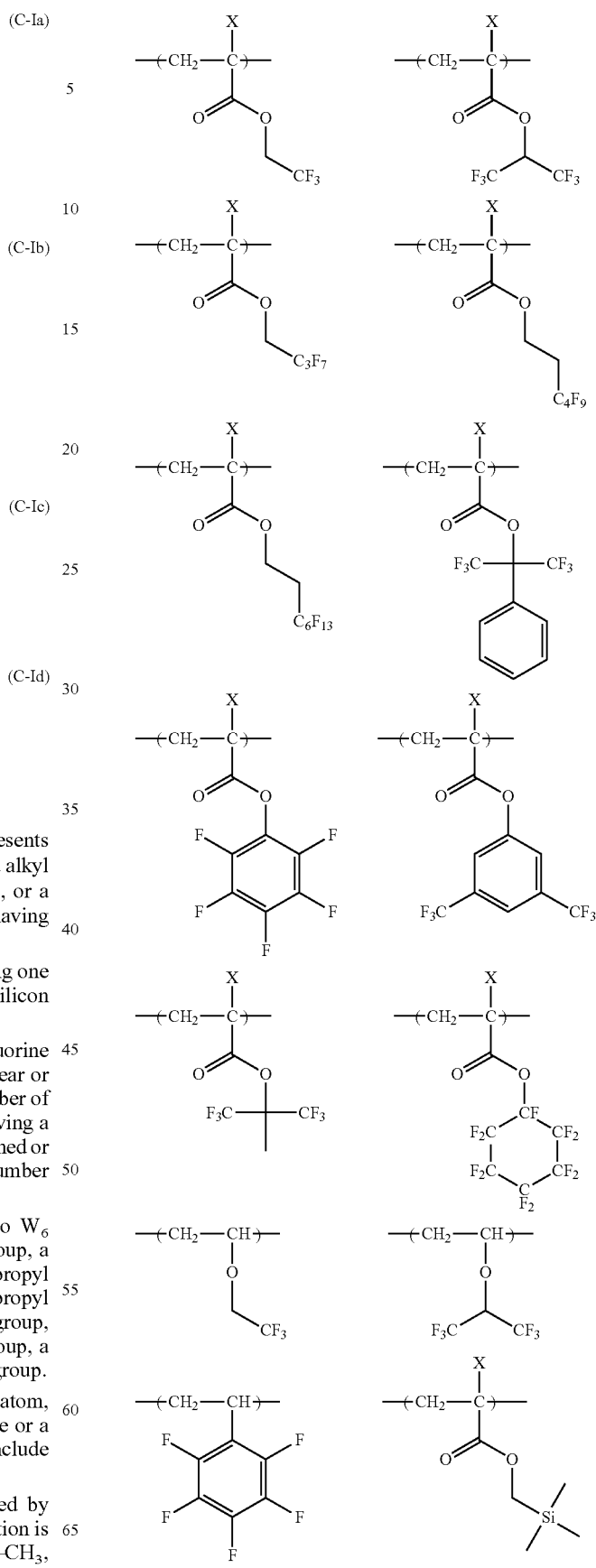

In formulae (C-Ia) to (C-Id), each of $R_{10}$ and $R_{11}$ represents a hydrogen atom, a fluorine atom, a linear or branched alkyl group (preferably having a carbon number of 1 to 4), or a linear or branched fluorinated alkyl group (preferably having a carbon number of 1 to 4).

Each of $W_3$ to $W_6$ represents an organic group having one or more atoms of at least either a fluorine atom or a silicon atom.

When $W_1$ to $W_6$ are an organic group having a fluorine atom, the organic group is preferably a fluorinated linear or branched alkyl group (preferably having a carbon number of 1 to 20), a fluorinated cycloalkyl group (preferably having a carbon number of 3 to 20), or a fluorinated linear, branched or cyclic alkyl ether group (preferably having a carbon number of 1 to 20).

Examples of the fluorinated alkyl group of $W_1$ to $W_6$ include a trifluoroethyl group, a pentafluoropropyl group, a hexafluoroisopropyl group, a hexafluoro(2-methyl)isopropyl group, a heptafluorobutyl group, a heptafluoroisopropyl group, an octafluoroisobutyl group, a nonafluorohexyl group, a nonafluoro-tert-butyl group, a perfluoroisopentyl group, a perfluorooctyl group and a perfluoro(trimethyl)hexyl group.

When $W_1$ to $W_6$ are an organic group having a silicon atom, the organic group preferably has an alkylsilyl structure or a cyclic siloxane structure. Specific examples thereof include the groups represented by formulae (CS-1) to (CS-3).

Specific examples of the repeating unit represented by formula (C-I) are set forth below, but the present invention is not limited thereto. X represents a hydrogen atom, —$CH_3$, —F or —$CF_3$.

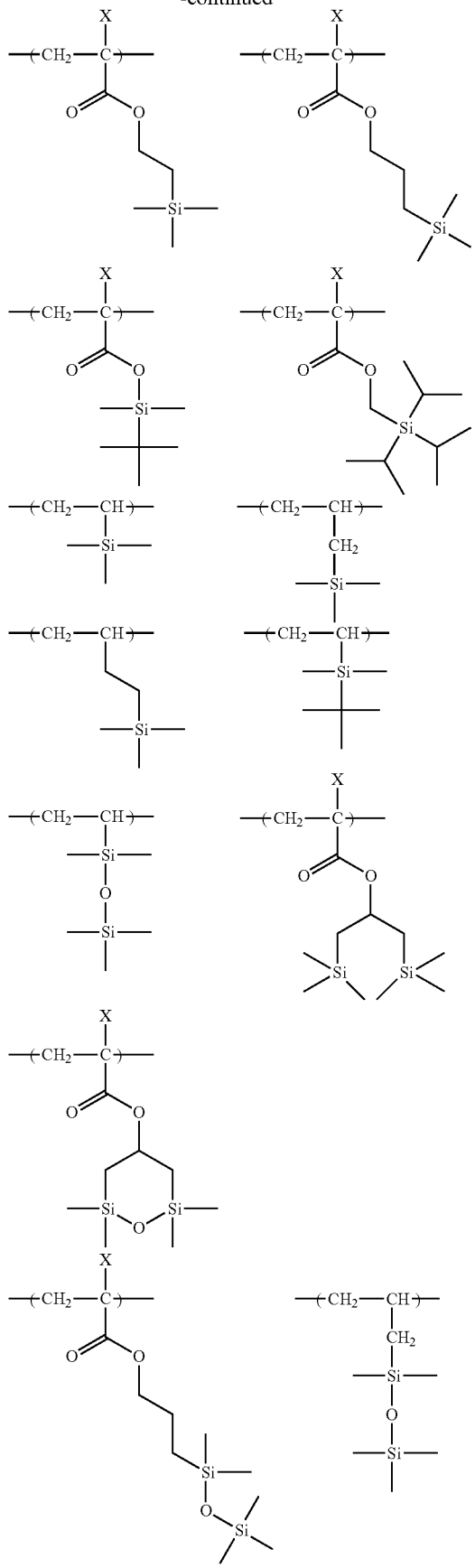
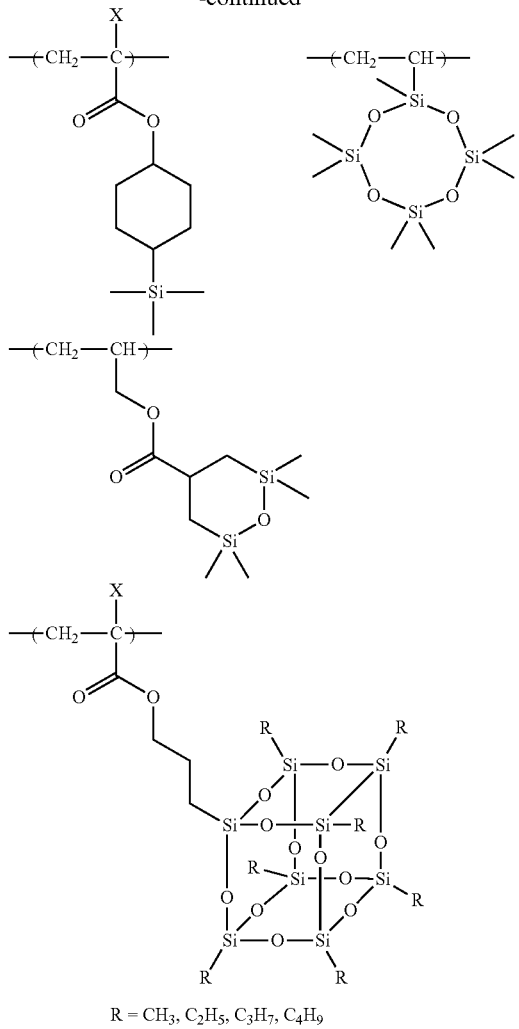

The resin (D) is preferably any one resin selected from the following (D-1) to (D-6):

(D-1) a resin containing (a) a repeating unit having a fluoroalkyl group (preferably having a carbon number of 1 to 4), more preferably a resin containing only the repeating unit (a), (D-2) a resin containing (b) a repeating unit having a trialkylsilyl group or a cyclic siloxane structure, more preferably a resin containing only the repeating unit (b), (D-3) a resin containing (a) a repeating unit having a fluoroalkyl group (preferably having a carbon number of 1 to 4) and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 4 to 20), more preferably a copolymerized resin of the repeating unit (a) and the repeating unit (c), (D-4) a resin containing (b) a repeating unit having a trialkylsilyl group or a cyclic siloxane structure and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 4 to 20), more preferably a copolymerized resin of the repeating unit (b) and the repeating unit (c), (D-5) a resin containing (a) a repeating unit having a fluoroalkyl group (preferably having a carbon number of 1 to 4) and (b) a repeating unit having a trialkylsilyl group or a cyclic siloxane structure, more preferably a copolymerized resin of the repeating unit (a) and the repeating unit (b), and (D-6) a resin containing (a) a repeating unit having a fluoroalkyl group (preferably having a carbon number of 1 to 4), (b) a repeating unit having a trialkylsilyl group or a cyclic siloxane structure, and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 4 to 20), more preferably a copolymerized resin of the repeating unit (a), the repeating unit (b) and the repeating unit (c).

As for the repeating unit (c) having a branched alkyl group, a cycloalkyl group, a branched alkenyl group, a cycloalkenyl group or an aryl group in the resins (D-3), (D-4) and (D-6), an appropriate functional group can be introduced considering the hydrophilicity/hydrophobicity, interaction and the like, but in view of followability of immersion liquid or receding contact angle, a functional group having no polar group is preferred.

In the resins (D-3), (D-4) and (D-6), the content of the repeating unit (a) having a fluoroalkyl group and/or the repeating unit (b) having a trialkylsilyl group or a cyclic siloxane structure is preferably from 20 to 99 mol %.

The resin (D) is preferably a resin having a repeating unit represented by the following formula (Ia):

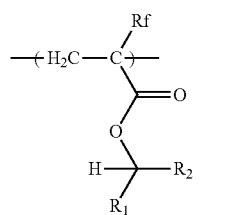

(Ia)

In formula (Ia), Rf represents a fluorine atom or an alkyl group with at least one hydrogen atom being replaced by a fluorine atom.

$R_1$ represents an alkyl group.

$R_2$ represents a hydrogen atom or an alkyl group.

In formula (Ia), the alkyl group with at least one hydrogen atom being replaced by a fluorine atom of Rf is preferably an alkyl group having a carbon number of 1 to 3, more preferably a trifluoromethyl group.

The alkyl group of $R_1$ is preferably a linear or branched alkyl group having a carbon number of 3 to 10, more preferably a branched alkyl group having a carbon number of 3 to 10.

$R_2$ is preferably a linear or branched alkyl group having a carbon number of 1 to 10, more preferably a linear or branched alkyl group having a carbon number of 3 to 10.

Specific examples of the repeating unit represented by formula (Ia) are set forth below, but the present invention is not limited thereto.

X=F or $CF_3$

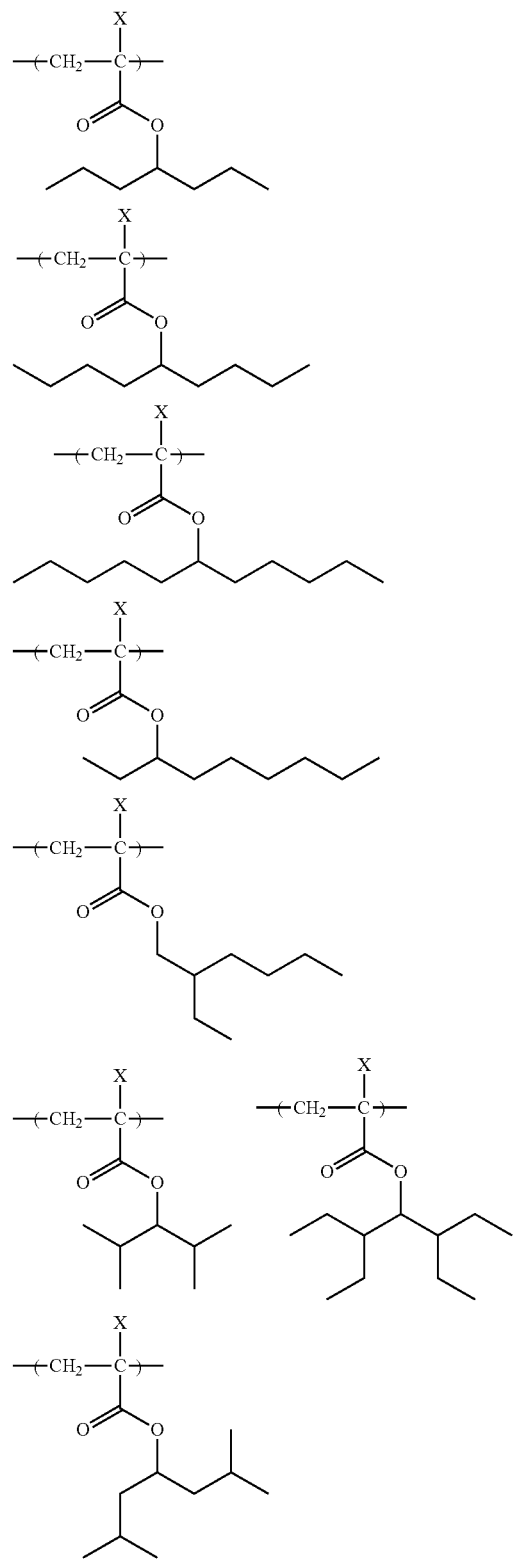

-continued

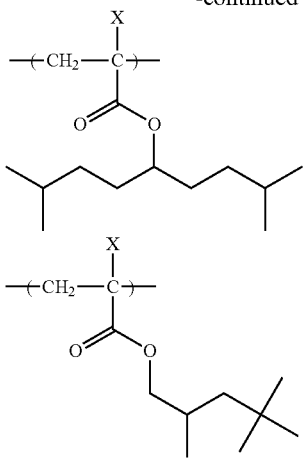

The repeating unit represented by formula (Ia) can be formed by polymerizing a compound represented by the following formula (I):

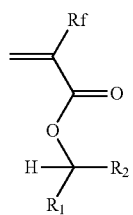

(I)

In formula (I), Rf represents a fluorine atom or an alkyl group with at least one hydrogen atom being replaced by a fluorine atom.

$R_1$ represents an alkyl group.

$R_2$ represents a hydrogen atom or an alkyl group.

Rf, $R_1$ and $R_2$ in formula (I) have the same meanings as Rf, $R_1$ and $R_2$ in formula (Ia).

As for the compound represented by formula (I), a commercially available product or a compound synthesized may be used. In the case of synthesizing the compound, this can be attained by converting a 2-trifluoromethyl methacrylic acid into an acid chloride and then esterifying the acid chloride.

The resin (D) containing a repeating unit represented by formula (Ia) preferably further contains a repeating unit represented by the following formula (III):

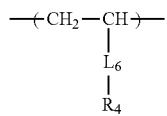

(III)

In formula (III), $R_4$ represents an alkyl group, a cycloalkyl group, an alkenyl group, a cycloalkenyl group, a trialkylsilyl group or a group having a cyclic siloxane structure.

$L_6$ represents a single bond or a divalent linking group.

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The trialkylsilyl group is preferably a trialkylsilyl group having a carbon number of 3 to 20.

The group having a cyclic siloxane structure is preferably a group containing a cyclic siloxane structure having a carbon number of 3 to 20.

The divalent linking group of $L_6$ is preferably an alkylene group (preferably having a carbon number of 1 to 5) or an oxy group.

Specific examples of the resin (D) having a repeating unit represented by formula (Ia) are set forth below, but the present invention is not limited thereto.

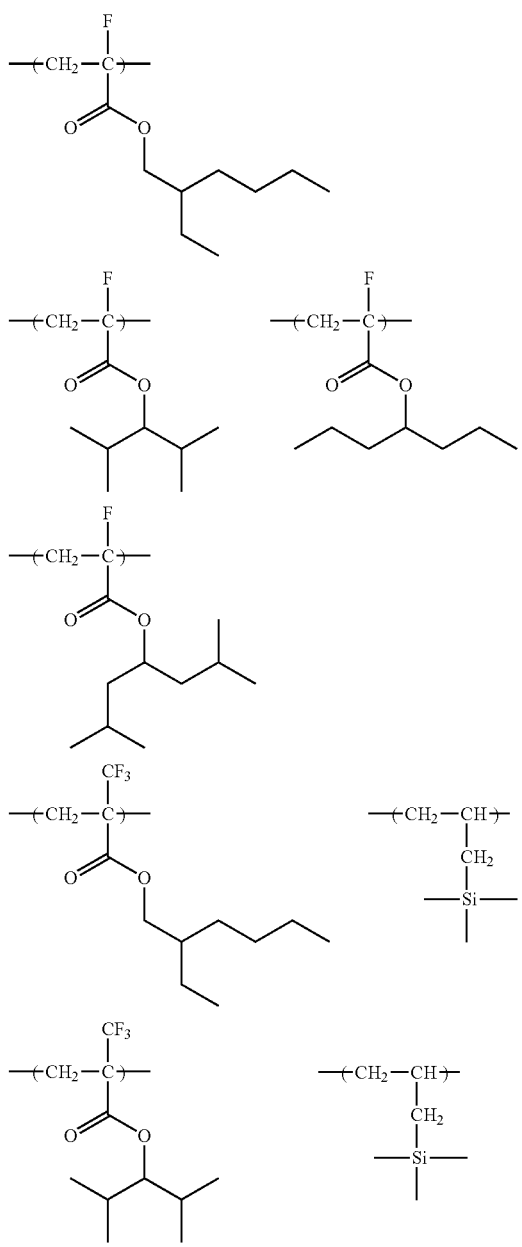

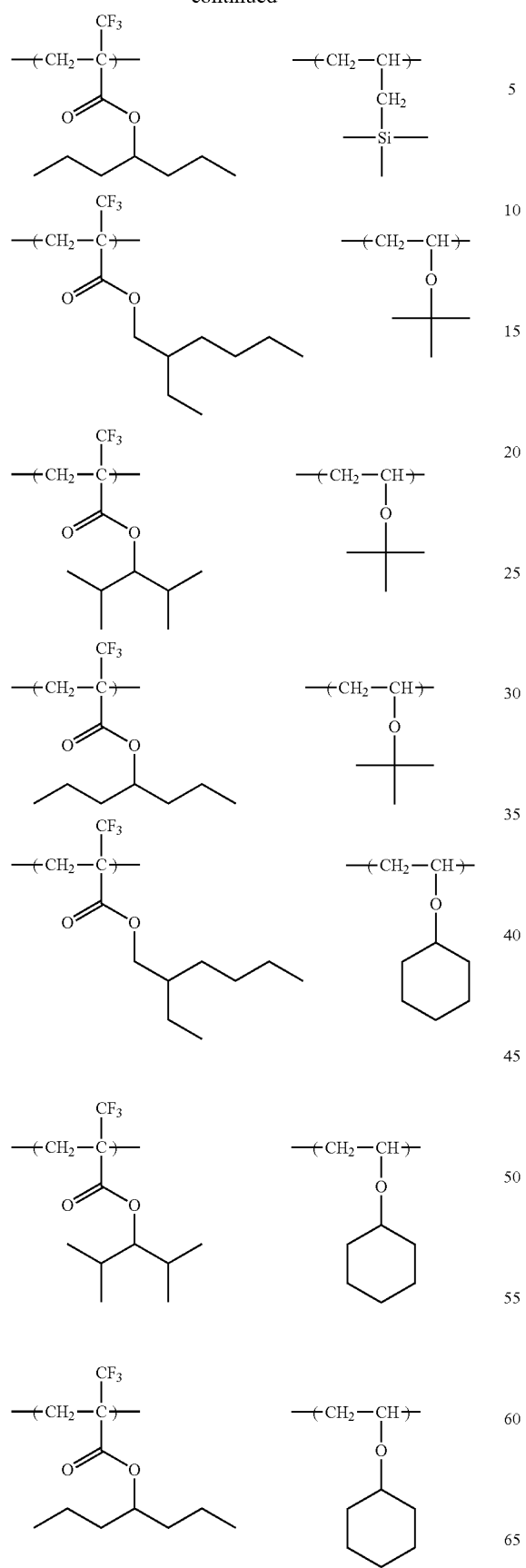
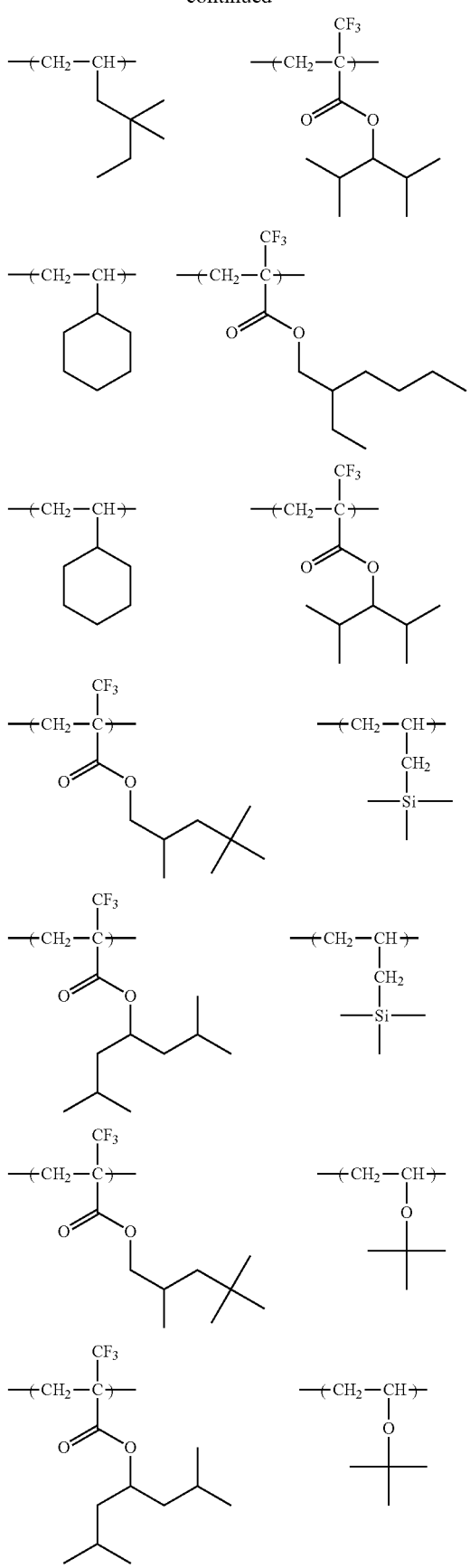

-continued
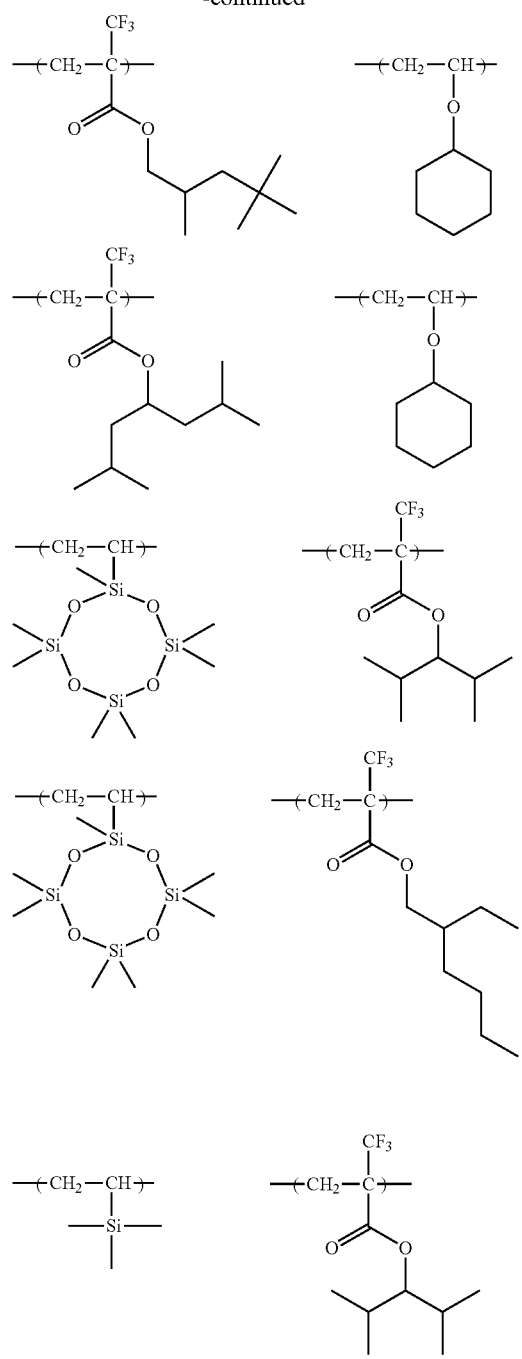
-continued
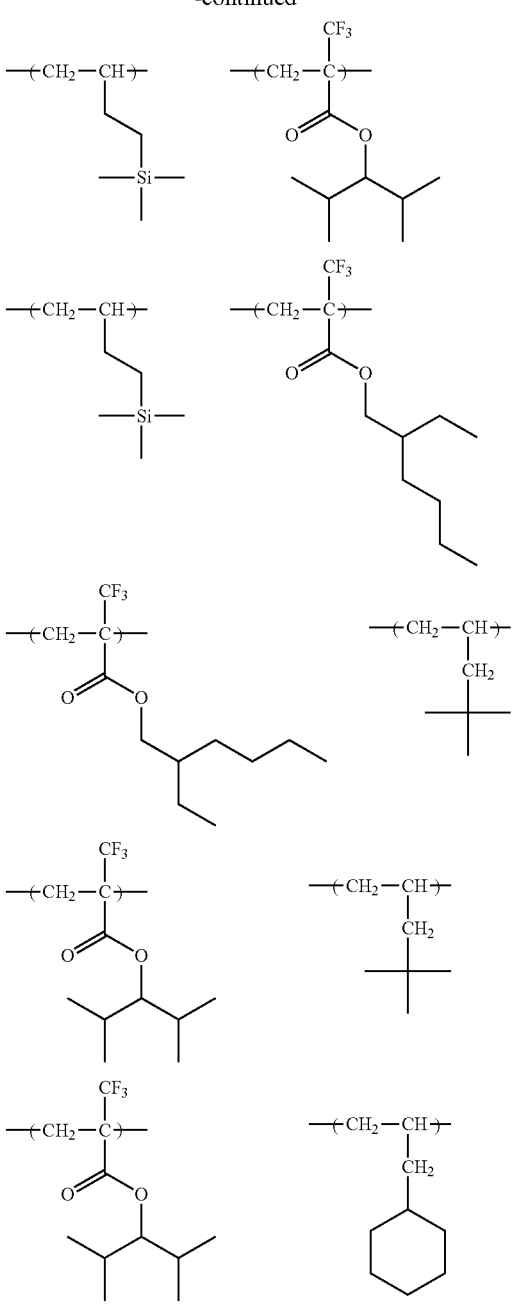
The resin (D) is preferably a resin containing a repeating unit represented by the following formula (II) and a repeating unit represented by the following formula (III):
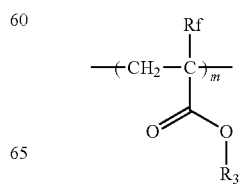
(II)

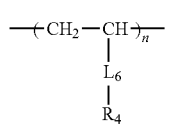
(III)

In formulae (II) and (III), Rf represents a fluorine atom or an alkyl group with at least one hydrogen atom being replaced by a fluorine atom.

$R_3$ represents an alkyl group, a cycloalkyl group, an alkenyl group, a cycloalkenyl group, or a group formed by combining two or more members thereof.

$R_4$ represents an alkyl group, a cycloalkyl group, an alkenyl group, a cycloalkenyl group, a trialkylsilyl group, a group having a cyclic siloxane structure, or a group formed by combining two or more members thereof.

$L_6$ represents a single bond or a divalent linking group.

Each of m and n represents a ratio of the repeating unit, and m and n are $0<m<100$ and $0<n<100$.

In formula (II), Rf has the same meaning as Rf in formula (Ia).

The alkyl group of $R_3$ and $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The trialkylsilyl group of $R_4$ is preferably a trialkylsilyl group having a carbon number of 3 to 20.

The group having a cyclic siloxane structure is preferably a group containing a cyclic siloxane structure having a carbon number of 3 to 20.

In the alkyl group, cycloalkyl group, alkenyl group, cycloalkenyl group and trialkylsilyl group of $R_3$ and $R_4$, a functional group can be introduced but in view of followability of immersion liquid, a functional group having no polar group is preferred, and an unsubstituted functional group is more preferred.

$L_6$ is preferably a single bond, a methylene group, an ethylene group or an ether group.

m and n are preferably from 30 to 70 and from 30 to 70, respectively, more preferably from 40 to 60 and from 40 to 60, respectively.

Specific examples of the resin (D) containing a repeating unit represented by formula (II) and a repeating unit represented by formula (III) are set forth below, but the present invention is not limited thereto.

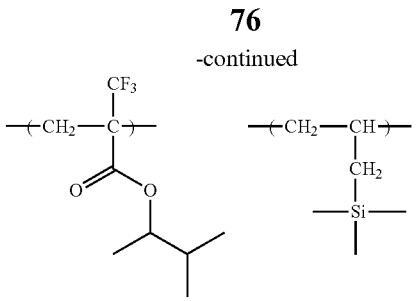

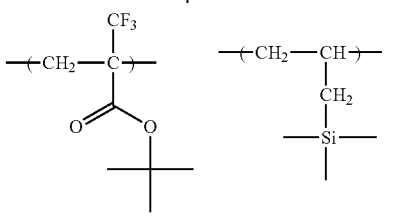

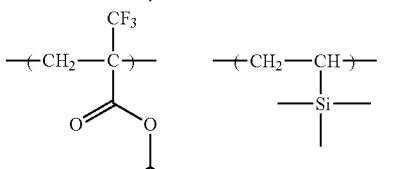

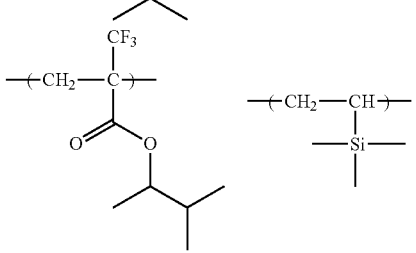

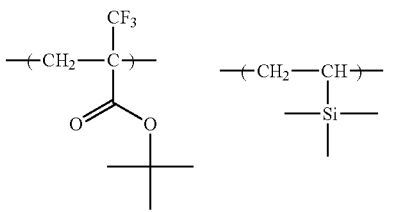

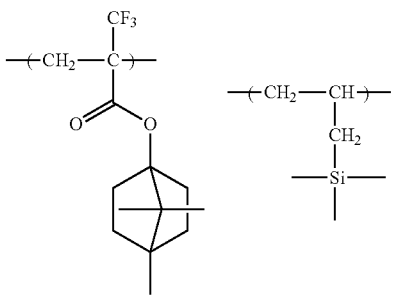

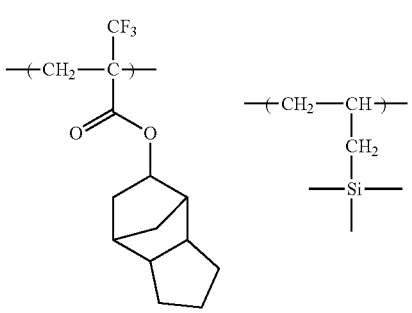

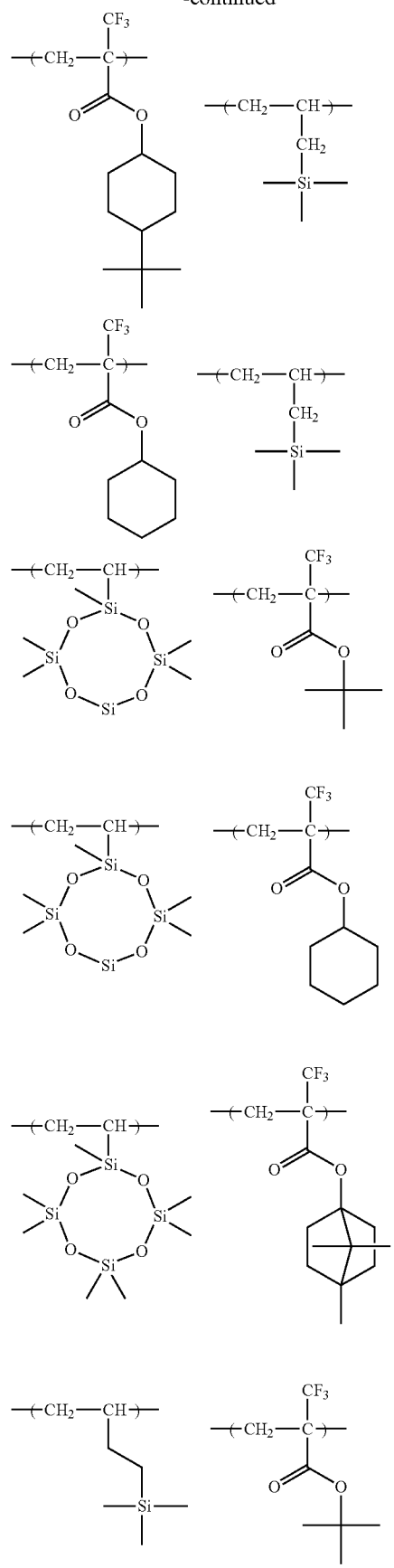
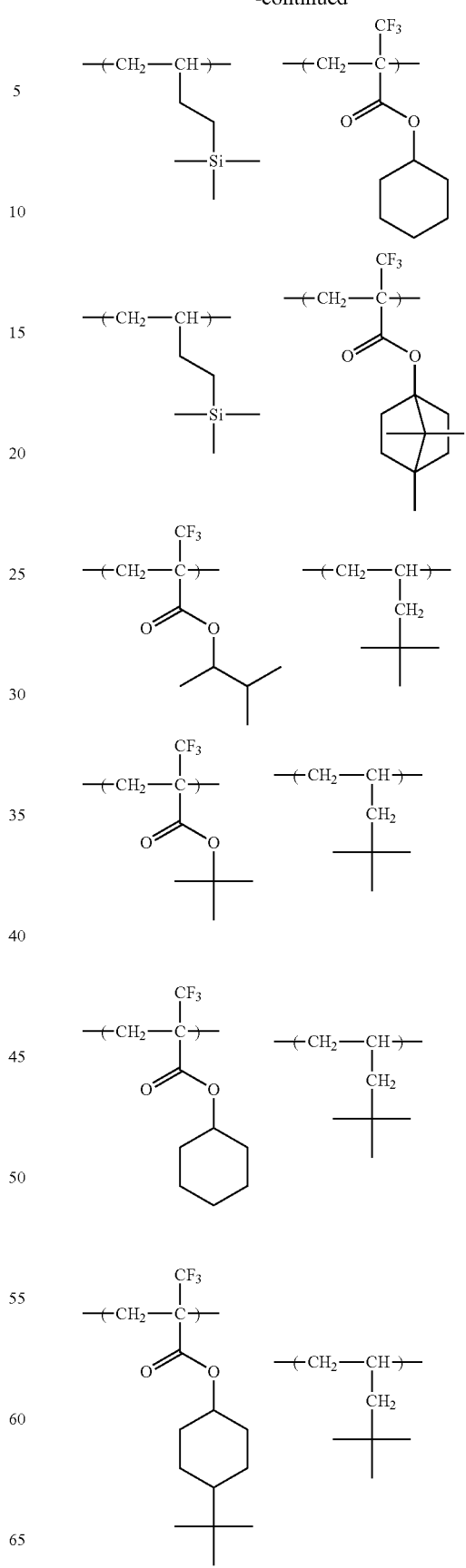

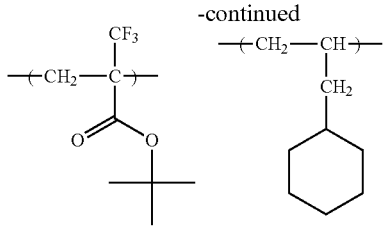

The resin (D) may contain a repeating unit represented by the following formula (VIII):

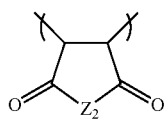

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

The resin (D) is preferably solid at ordinary temperature (25° C.). Furthermore, the glass transition temperature (Tg) is preferably from 50 to 200° C., more preferably from 80 to 160° C.

When the resin is solid at 25° C., this means that the melting point is 25° C. or more.

The glass transition temperature (Tg) can be measured by a scanning calorimeter (Differential Scanning Calorimeter). For example, the glass transition temperature can be measured by once heating and then cooling a sample, again raising the temperature at 5° C./min, and analyzing the value when the specific volume is changed.

The resin (D) is preferably stable to an acid and insoluble in an alkali developer.

In view of followability of immersion liquid, the resin (D) preferably contains none of (x) an alkali-soluble group, (y) a group capable of decomposing by the action of an alkali (alkali developer) to increase the solubility in an alkali developer, and (z) a group capable of decomposing by the action of an acid to increase the solubility in a developer.

In the resin (D), the total amount of repeating units having an alkali-soluble group or a group whose solubility in a developer increases by the action of an acid or alkali is preferably 20 mol % or less, more preferably from 0 to 10 mol %, still more preferably from 0 to 5 mol %, based on all repeating units constituting the resin (D).

Also, unlike a surfactant generally used for resists, the resin (D) does not have an ionic bond or a hydrophilic group such as (poly(oxyalkylene)) group. If the resin (D) contains a hydrophilic polar group, the followability of immersion water tends to decrease. Therefore, it is more preferred not to contain a polar group selected from a hydroxyl group, alkylene glycols and a sulfone group. Furthermore, an ether group bonded to the carbon atom of the main chain through a linking group is preferably not contained because the hydrophilicity increases and the followability of immersion liquid deteriorates. On the other hand, an ether group bonded directly to the carbon atom of the main chain as in formula (III) can sometimes express activity as a hydrophobic group and is preferred.

Examples of the alkali-soluble group (x) include groups having a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

Examples of the group (y) capable of decomposing by the action of an alkali (alkali developer) to increase the solubility in an alkali developer include a lactone group, an ester group, a sulfonamide group, an acid anhydride and an acid imide group.

Examples of the group (z) capable of decomposing by the action of an acid to increase the solubility in a developer include the same groups as those of the acid-decomposable group in the resin (A).

However, the repeating unit represented by the following formula (pA-C) is not or scarcely decomposed by the action of an acid as compared with the acid-decomposable group of the resin (A) and is regarded as substantially non-acid-decomposable.

(pA-c)

In formula (pA-c), $Rp_2$ represents a hydrocarbon group having a tertiary carbon atom bonded to the oxygen atom in the formula.

In the case where the resin (D) contains a silicon atom, the silicon atom content is preferably from 2 to 50 mass %, more preferably from 2 to 30 mass %, based on the molecular weight of the resin (D). Also, the silicon atom-containing repeating unit preferably occupies from 10 to 100 mass %, more preferably from 20 to 100 mass %, in the resin (D).

In the case where the resin (D) contains a fluorine atom, the fluorine atom content is preferably from 5 to 80 mass %, more preferably from 10 to 80 mass %, based on the molecular weight of the resin (D). Also, the fluorine atom-containing repeating unit preferably occupies from 10 to 100 mass %, more preferably from 30 to 100 mass %, in the resin (D).

The standard polystyrene-reduced weight average molecular of the resin (D) is preferably from 1,000 to 100,000, more preferably from 1,000 to 50,000, still more preferably from 2,000 to 15,000, yet still more preferably from 3,000 to 15,000.

The residual monomer amount in the resin (D) is preferably from 0 to 10 mass %, more preferably from 0 to 5 mass %, still more preferably from 0 to 1 mass %. Also, in view of the resolution, resist profile, and side wall, roughness or the like of the resist pattern, the molecular weight distribution (Mw/Mn, also called polydispersity) is preferably from 1 to 5, more preferably from 1 to 3, still more preferably from 1 to 1.5.

The amount added of the resin (D) in the resist composition is preferably from 0.1 to 20 mass %, more preferably from 0.1 to 10 mass %, still more preferably from 0.1 to 5 mass %, even still more preferably from 0.2 to 3.0 mass %, yet even still more preferably from 0.3 to 2.0 mass %, based on the entire solid content of the resist composition.

In the resin (D), similarly to the resin (A), it is of course preferred that impurities such as metal are little contained, and moreover, the content of residual monomers or oligomer components is preferably not more than a specific value, for example, is 0.1 mass % by HPLC. By satisfying these conditions, not only the resist can be improved in the sensitivity, resolution, process stability, pattern profile and the like but also a resist free from extraneous substances in liquid or change with aging in the sensitivity and the like can be obtained.

As for the resin (D), various commercially available products may be used or the resin may be synthesized by an ordinary method (for example, radical polymerization)). Examples of the synthesis method in general include a batch polymerization method of dissolving monomer species and a polymerization initiator in a solvent and heating the solution, thereby effecting the polymerization, and a dropping polymerization method of adding dropwise a solution containing monomer species and a polymerization initiator to a heated solvent over 1 to 10 hours. A dropping polymerization method is preferred. Examples of the reaction solvent include ethers such as tetrahydrofuran, 1,4-dioxane, diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the polymerization initiator include azobisisobutyronitrile, azobisdimethylvaleronitrile and dimethyl 2,2'-azobis(2-methylpropionate). A chain transfer agent may also be used, if desired. The concentration of the solute such as monomer, polymerization initiator and chain transfer agent in the reaction solution is usually from 5 to 50 mass %, preferably from 20 to 50 mass %, more preferably from 30 to 50 mass %, and the reaction temperature is usually from 10 to 150° C., preferably from 30 to 120° C., more preferably from 60 to 100° C.

After the completion of reaction, the reaction product is allowed to cool to room temperature and purified. The purification may be performed by a normal method, for example, a liquid-liquid extraction method of combining water washing or an appropriate solvent to remove residual monomers or oligomer components; a purification method in a solution sate, such as ultrafiltration of extracting and removing only those having a molecular weight lower than a specific molecular weight; a reprecipitation method of adding dropwise the resin solution in a poor solvent to solidify the resin in the poor solvent and thereby remove residual monomers and the like; or a purification method in a solid state, such as washing of the resin slurry with a poor solvent after separation by filtration. For example, the resin is precipitated as a solid through contact with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent used may be appropriately selected according to the kind of the polymer from, for example, a hydrocarbon (an aliphatic hydrocarbon such as pentane, hexane, heptane and octane; an alicyclic hydrocarbon such as cyclohexane and methylcyclohexane; and an aromatic hydrocarbon such as benzene, toluene and xylene), a halogenated hydrocarbon (a halogenated aliphatic hydrocarbon such as methylene chloride, chloroform and carbon tetrachloride; and a halogenated aromatic hydrocarbon such as chlorobenzene and dichlorobenzene), a nitro compound (e.g., nitromethane, nitroethane), a nitrile (e.g., acetonitrile, benzonitrile), an ether (a chain ether such as diethyl ether, diisopropyl ether and dimethoxyethane; and a cyclic ether such as tetrahydrofuran and dioxane), a ketone (e.g., acetone, methyl ethyl ketone, diisobutyl ketone), an ester (e.g., ethyl acetate, butyl acetate), a carbonate (e.g., dimethyl carbonate, diethyl carbonate, ethylene carbonate, propylene carbonate), an alcohol (e.g., methanol, ethanol, propanol, isopropyl alcohol, butanol), a carboxylic acid (e.g., acetic acid), water, and a mixed solvent containing such a solvent. Among these, the precipitation or reprecipitation solvent is preferably a solvent containing at least an alcohol (particularly methanol or the like) or water. In such a solvent containing at least an alcohol, the ratio of the alcohol (particularly methanol or the like) to other solvents (for example, esters such as ethyl acetate, and ethers such as tetrahydrofuran) is approximately, for example, the former/the latter (ratio by volume, at 25° C.)=from 10/90 to 99/1, preferably the former/the latter (ratio by volume, at 25° C.)=from 30/70 to 98/2, more preferably the former/the latter (ratio by volume, at 25° C.)=from 50/50 to 97/3.

The amount of the precipitation or reprecipitation solvent used may be appropriately selected by taking into account the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The nozzle bore diameter at the time of feeding the polymer solution into a precipitation or reprecipitation solvent (poor solvent) is preferably 4 mmφ or less (for example, from 0.2 to 4 mmφ), and the feeding rate (dropping rate) of the polymer solution into the poor solvent is, for example, in terms of the linear velocity, from 0.1 to 10 m/sec, preferably on the order of 0.3 to 5 msec.

The precipitation or reprecipitation operation is preferably performed under stirring. Examples of the stirring blade which can be used for stirring include a disc turbine, a fan turbine (including paddle), a curved vane turbine, a feathering turbine, a Pfaudler type, a bull margin type, an angled vane fan turbine, a propeller, a multistage type, an anchor type (or horseshoe type), a gate type, a double ribbon and a screw. The stirring is preferably further performed for 10 minutes or more, more preferably 20 minutes or more, after the completion of feeding of the polymer solution. If the stirring time is short, the monomer content in the polymer particle may not be sufficiently reduced. The mixing and stirring of the polymer solution and the poor solvent may also be performed using a line mixer instead of the stirring blade.

The temperature at the precipitation or reprecipitation may be appropriately selected by taking into account the efficiency or operability, but the temperature is usually on the order of 0 to 50° C., preferably in the vicinity of room temperature (for example, approximately from 20 to 35° C.). The precipitation or reprecipitation operation may be performed using a commonly employed mixing vessel such as stirring tank according to a known method such as batch system and continuous system.

The precipitated or reprecipitated particulate polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble.

More specifically, there may be used a method comprising, after the completion of the radical polymerization reaction above, precipitating a resin by bringing the polymer into contact with a solvent in which the polymer is sparingly soluble or insoluble (step a), separating the resin from the solution (step b), anew dissolving the resin in a solvent to prepare a resin solution A (step c), precipitating a resin solid by bringing the resin solution A into contact with a solvent in which the resin is sparingly soluble or insoluble and which is in a volumetric amount of less than 10 times (preferably a volumetric amount of 5 times or less) the resin solution A (step d), and separating the precipitated resin (step e).

As for the solvent used at the preparation of the resin solution A, a solvent similar to the solvent used for dissolving the monomer at the polymerization reaction may be used, and the solvent may be the same as or different from the solvent used at the polymerization reaction.

(E) Basic Compound

The resist composition of the present invention preferably contains (E) a basic compound for reducing the change of performance with aging from exposure to heating.

Preferred examples of the basic compound include compounds having a structure represented by any one of the following formulae (A) to (E):

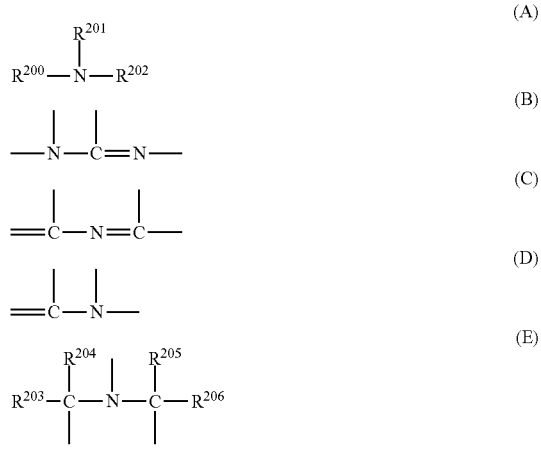

In formulae (A) to (E), each of $R^{200}$, $R^{201}$ and $R^{202}$ which may be the same or different represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine with each other to form a ring.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

Each of $R^{203}$, $R^{204}$, $R^{205}$ and $R^{206}$ which may be the same or different represents an alkyl group having a carbon number of 1 to 20.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undeca-7-ene. Examples of the compound having an onium hydroxide structure include triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is converted into a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

One of these basic compounds is used alone, or two or more kinds thereof are used in combination.

These basic compounds are preferably used in combination of two or more.

In the case of using basic compounds in combination, at least one kind of a polar group-containing basic compound (E1) is preferably contained. Above all, it is more preferred to contain at least one kind of a polar group-containing basic compound (E1) and at least one kind of a polar group-free basic compound (E2).

The polar group as used herein indicates a group containing at least one heteroatom or halogen atom and is specifically a group containing nitrogen atom, oxygen atom, sulfur atom, chlorine atom, bromine atom or the like. Specific examples of the polar group include a hydroxyl group, an ester group, an ether group, a carbonyl group, a cyano group, an acetal group, an alkoxy group, an alkoxycarbonyl group, an acyloxy group, an amino group, a pyridyl group and a chloro group. Among these, preferred are an ether group, a cyano group, a hydroxyl group, an amino group and a pyridyl group, more preferred are an ether group, a cyano group and a hydroxyl group. At least one or more of such polar groups are preferably contained in the nitrogen-containing structure represented by formulae (A) to (E).

The amount of the basic compound used is usually from 0.001 to 10 mass %, preferably from 0.01 to 5 mass %, based on the solid content of the resist composition.

The ratio between the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

(F) Surfactant

The resist composition of the present invention preferably further contains a surfactant, more preferably any one fluorine-containing and/or silicon-containing surfactant (a fluorine-containing surfactant, a silicon-containing surfactant or a surfactant containing both a fluorine atom and a silicon atom) or two or more kinds thereof.

When the resist composition of the present invention contains a surfactant, a resist pattern with good sensitivity, resolution and adherence as well as less development defects can be obtained in using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing or silicon-containing surfactant such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204D, 208G, 218G, 230E 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the copolymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.olyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or some of them may be used in combination.

The amount of the surfactant used is preferably from 0.01 to 10 mass %, more preferably from 0.1 to 5 mass %, based on the entire amount of the resist composition (excluding the solvent).

(G) Onium Carboxylate

The resist composition of the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably the carboxylate anion in which the alkyl group is partially or entirely fluorine-substituted. The alkyl chain may contain an oxygen atom. Thanks to such a construction, the transparency to light of 220 nm or less is ensured, the sensitivity and resolution are enhanced, and the iso/dense bias and exposure margin are improved.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

(H) Other Additives

The resist composition of the present invention may further contain, for example, a dye, a plasticizer, a photosensitizer, a light absorber, an alkali-soluble resin, a dissolution inhibitor and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

The solid content concentration of the resist composition of the present invention is usually from 1.0 to 10 mass %, preferably from 2.0 to 5.7 mass %, more preferably from 2.0 to 5.3 mass %. When the solid content concentration is in this range, the resist solution can be uniformly applied on a substrate and moreover, a resist pattern with excellent performance in terms of line edge roughness can be formed. The reason therefor is considered because by setting the solid content concentration to 10 mass % or less, preferably 5.7 mass % or less, the materials, particularly the photo-acid generator, in the resist solution, are probably prevented from aggregation, as a result, a uniform resist film can be formed.

In the pattern forming method of the present invention, the step of forming a film on a substrate by using a resin composition whose solubility in a positive tone developer increases and solubility in a negative tone developer decreases upon irradiation with an actinic ray or radiation, the step of exposing the film, the step of heating the film, and the step of applying positive tone development to the film may be performed by generally known methods.

The exposure apparatus for use in the present invention is not limited in the light source wavelength, but, for example, a KrF excimer laser wavelength (248 nm), an ArF excimer laser wavelength (193 nm) and an $F_2$ excimer laser wavelength (157 nm) can be applied.

In the step of performing exposure of the present invention, an immersion exposure method can be applied.

The immersion exposure method is a technique for raising the resolution, and this is a technique of performing the exposure by filling a high refractive-index liquid (hereinafter sometimes referred to as an "immersion liquid") between the projection lens and the sample.

As for the "effect of immersion", assuming that $NA_0 = \sin\theta$, the resolution and depth of focus when immersed can be expressed by the following formulae:

$$(\text{Resolution}) = k_1 \cdot (\lambda_0/n)/NA_0$$

$$(\text{Depth of focus}) = \pm k_2 \cdot (\lambda_0/n)/NA_0^2$$

wherein $\lambda_0$ is the wavelength of exposure light in air, n is the refractive index of the immersion liquid based on air, and $\theta$ is the convergence half-angle of beam.

That is, the effect of immersion is equal to use of an exposure wavelength of $1/n$. In other words, when the projection optical system has the same NA, the depth of focus can be made n times larger by the immersion. This is effective for all pattern profiles and can be combined with the super-resolution technology under study at present, such as phase-shift method and modified illumination method.

In the case of performing immersion exposure, a step of washing the film surface with an aqueous chemical solution may be performed (1) before the exposure step after forming the film on a substrate and/or (2) after the step of exposing the film through an immersion liquid but before the step of heating the film.

The immersion liquid is preferably a liquid being transparent to light at the exposure wavelength and having as small a temperature coefficient of refractive index as possible so as to minimize the distortion of an optical image projected on the film. Particularly, when the exposure light source is an ArF excimer laser (wavelength: 193 nm), water is preferably used in view of easy availability and easy handleability, in addition to the above-described aspects.

In the case of using water, an additive (liquid) capable of decreasing the surface tension of water and increasing the surface activity may be added in a small ratio. This additive is preferably a liquid that does not dissolve the resist layer on the wafer and at the same time, gives only a negligible effect on the optical coat at the undersurface of the lens element.

Such an additive is preferably, for example, an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small.

On the other hand, if a substance opaque to light at 193 nm or an impurity greatly differing in the refractive index from water is mingled, this incurs distortion of the optical image projected on the resist. Therefore, the water used is preferably distilled water. Pure water after further filtration through an ion exchange filter or the like may also be used.

In the present invention, the substrate on which the film is formed is not particularly limited, and an inorganic substrate such as silicon, SiN, $SiO_2$ and SiN, a coating-type inorganic substrate such as SOG, or a substrate generally used in the process of producing a semiconductor such as IC or producing a circuit board of liquid crystal, thermal head or the like or in the lithography process of other photo-fabrication processes can be used. If desired, an organic antireflection film may be formed between the film and the substrate.

At the time of performing positive tone development, an alkali developer is preferably used.

The alkali developer which can be used in performing positive tone development is, for example, an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

Furthermore, this alkaline aqueous solution may be used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous 2.38% tetramethylammonium hydroxide solution is preferred.

As for the rinsing solution in the rinsing treatment performed after positive tone development, pure water is used, and the pure water may be used after adding thereto a surfactant in an appropriate amount.

At the time of performing negative tone development, an organic developer containing an organic solvent is preferably used.

As for the organic developer which can be used in performing negative tone development, a polar solvent such as ketone-based solvent, ester-based solvent, alcohol-based solvent, amide-based solvent and ether-based solvent, and a hydrocarbon-based solvent can be used.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, actonylacetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxy methyl butanol.

Examples of the ether-based solvent include the glycol ether-based solvent cited above, dioxane and tetrahydrofuran.

Examples of the amide-based solvent include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or water.

The vapor pressure at 20° C. of the negative tone developer is preferably 5 kPa or less, more preferably 3 kPa or less, still more preferably 2 kPa or less. By setting the vapor pressure of the negative tone developer to 5 kPa or less, evaporation of the developer on a substrate or inside of a development cup is reduced and the temperature uniformity in the wafer plane is enhanced, as a result, dimensional uniformity in the wafer plane is improved.

Specific examples of the developer having a vapor pressure of kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the developer having a vapor pressure of 2 kPa or less which is a most preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the developer usable when performing negative tone development, a surfactant can be added in an appropriate amount, if desired.

The surfactant is not particularly limited but, for example, an ionic or nonionic fluorine-containing and/or silicon-containing surfactant can be used. Examples of such a fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. The surfactant is preferably a nonionic surfactant. The nonionic surfactant is not particularly limited, but a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on a substrate surface (spraying method), and a method of continuously ejecting the developer on the substrate spinning at a constant speed while scanning the developer ejecting nozzle at a constant rate (dynamic dispense method) may be applied.

After the step of performing negative tone development, a step of stopping the development by the replacement with another solvent may be practiced.

A step of washing the resist film with a rinsing solution for negative tone development containing an organic solvent is preferably provided after the negative tone development.

The rinsing solution for use in the rinsing step after negative tone development is not particularly limited as long as it does not dissolve the resist pattern, and a solution containing an organic solvent in general may be used. As for the rinsing solution, a rinsing solution containing at least one kind of an organic solvent selected from a hydrocarbon-based solvent, a ketone-based solvent, an ester-based solvent, an alcohol-based solvent, an amide-based solvent and an ether-based solvent is preferably used. More preferably, a step of washing the resist film by using a rinsing solution containing at least one kind of an organic solvent selected from a ketone-based solvent, an ester-based solvent, an alcohol-based solvent and an amide-based solvent is preformed after negative tone development; still more preferably, a step of washing the resist film by using a rinsing solution containing an alcohol-based solvent or an ester-based solvent is performed after negative tone development; yet still more preferably, a step of washing the resist film by using a rinsing solution containing a monohydric alcohol is performed after negative tone development. The monohydric alcohol used in the rinsing step after negative tone development includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol, with 1-hexanol, 2-hexanol, 1-pentanol and 3-methyl-1-butanol being preferred.

A plurality of these components may be mixed, or the solvent may be used by mixing it with an organic solvent other than those described above.

The water content in the rinsing solution is preferably 10 mass % or less, more preferably 5 mass % or less, still more preferably 3 mass % or less. By setting the water content to 10 mass % or less, good development characteristics can be obtained.

The vapor pressure at 20° C. of the rinsing solution used after negative tone development is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, dimensional uniformity in the wafer plane is improved.

The rinsing solution may also be used after adding thereto a surfactant in an appropriate amount.

In the rinsing step, the wafer after negative tone development is washed using the above-described organic solvent-containing rinsing solution. The method for washing treatment is not particularly limited but, for example, a method of continuously ejecting the rinsing solution on a substrate spinning at a constant speed (spin coating method), a method of dipping the substrate in a bath filled with the rinsing solution for a fixed time (dipping method), and a method of spraying the rinsing solution on a substrate surface (spraying method) may be applied. Above all, a method of performing the washing treatment by the spin coating method and after the washing, removing the rinsing solution from the substrate surface by spinning the substrate at a rotational speed of 2,000 to 4,000 rpm is preferred.

EXAMPLES

The present invention is described below by referring to Examples, but the present invention should not be construed as being limited thereto.

Synthesis Example 1

Synthesis of Resin (A1)

Under a nitrogen flow, 20 g of a mixed solvent of propylene glycol monomethyl ether acetate and propylene glycol monomethyl ether in a mass ratio of 6/4 was charged into a three-neck flask and heated at 80° C. (Solvent 1). Separately, γ-butyrolactone methacrylate, hydroxyadamantane methacrylate and 2-methyl-2-adamantyl methacrylate in a molar ratio of 40/25/35 were dissolved in a mixed solvent of propylene glycol monomethyl ether acetate and propylene glycol monomethyl ether in a mass ratio of 6/4 to prepare a monomer solution (200 g) having a concentration of 22 mass %. Subsequently, a polymerization initiator V-601 (produced by Wako Pure Chemical Industries, Ltd.) in a concentration of 8 mol % based on the monomers was added to and dissolved in the monomer solution, and the obtained solution was added dropwise to Solvent 1 over 6 hours. After the completion of dropwise addition, the reaction was further allowed to proceed at 80° C. for 2 hours. The resulting reaction solution was left standing to cool and then poured in 1,800 ml of hexane/200 ml of ethyl acetate, and the powder precipitated was collected by filtration and dried, as a result, 37 g of Resin (A1) was obtained. The weight average molecular weight of the obtained Resin (A1) was 5,500 and the polydispersity (Mw/Mn) was 1.65.

Resin (A1):

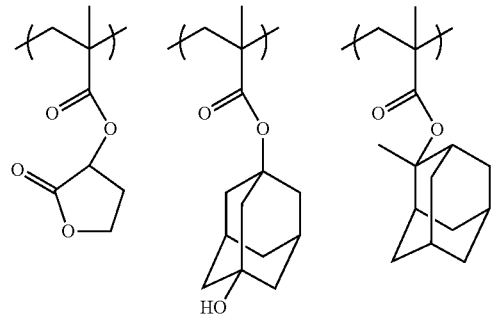

Mw = 5,500, Mw/Mn = 1.65

Molar compositional ratio: 40/25/35

Resins (A2) to (A15) were synthesized in the same manner.

Structures of Resins (A2) to (A15) are shown below. The compositional ratio (by mol), weight average molecular weight and polydispersity of each of Resins (A2) to (A15) are shown in Table 1.
(A2)
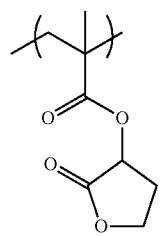
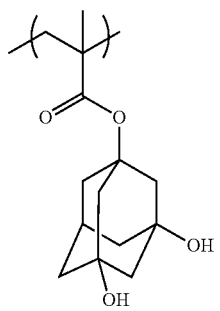
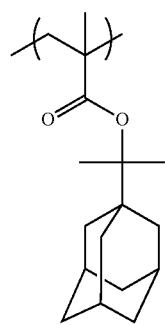
(A3)
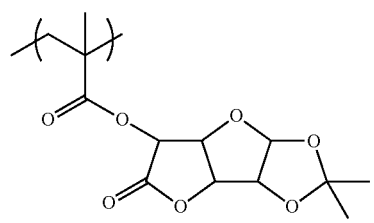
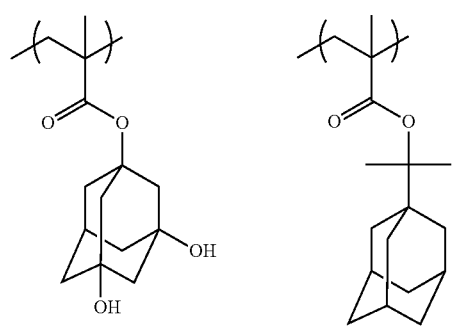
(A4)
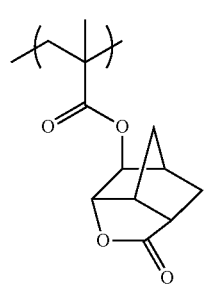
-continued
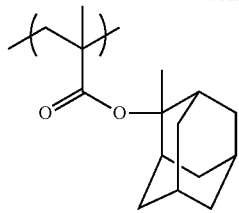
(A5)
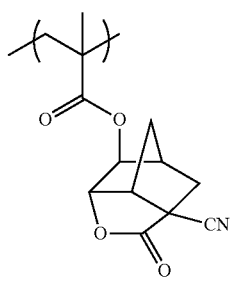
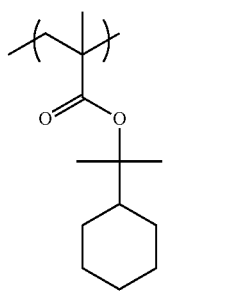
(A6)
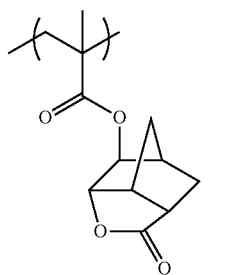
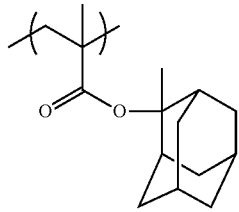
(A7)
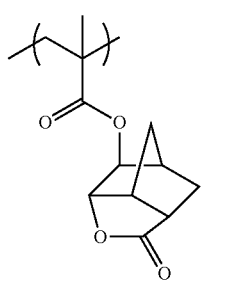

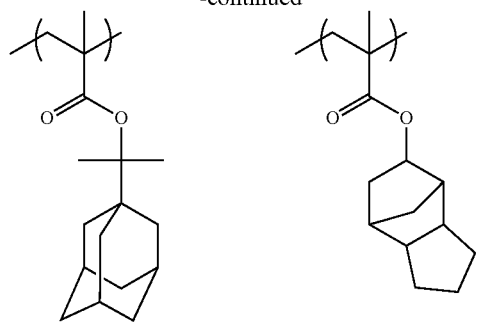
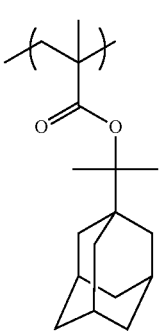
(A8)
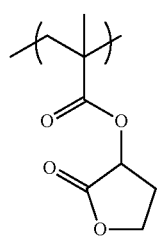
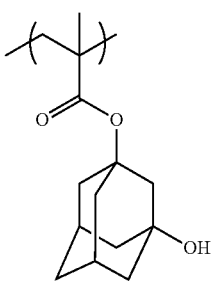
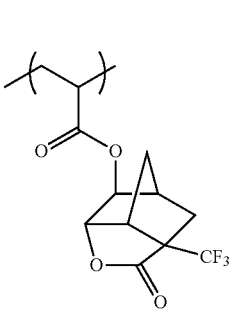
(A11)
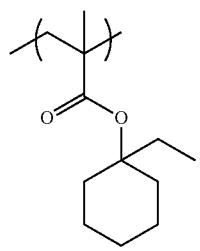
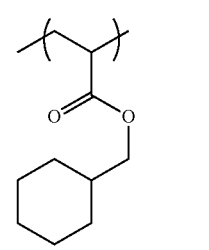
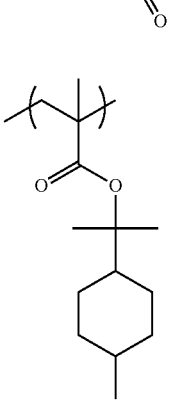
(A9)
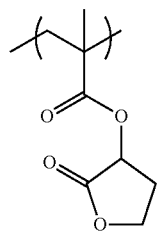
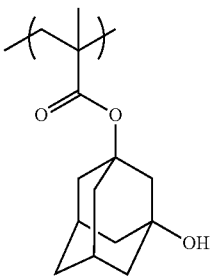
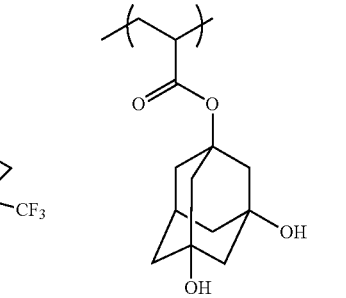
(A12)
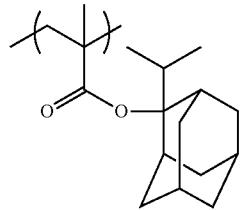
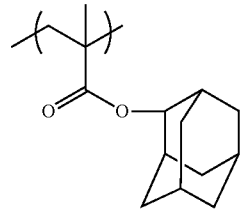
(A10)
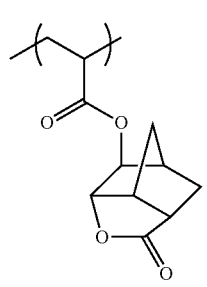
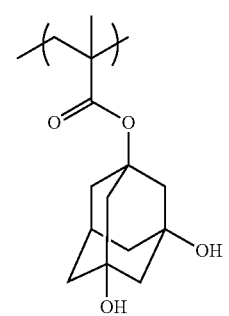
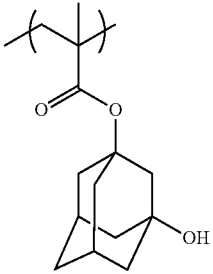
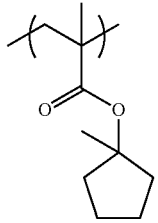

-continued

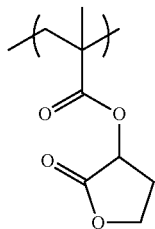
(A13)

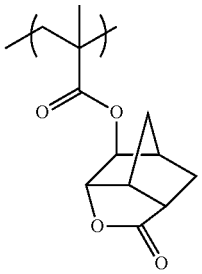

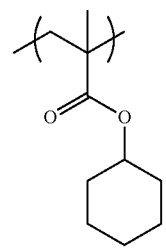

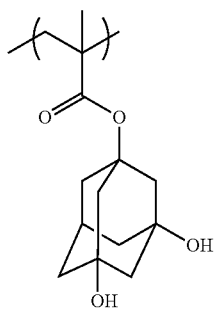

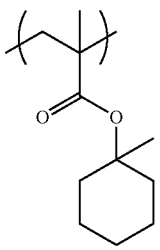

(A15)

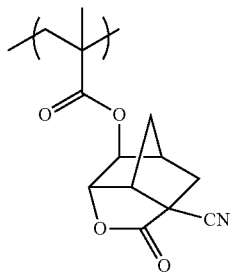

(A14)

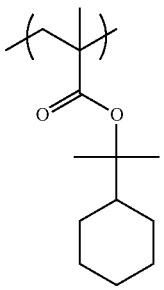

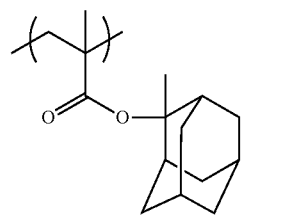

The compound capable of generating an acid represented by formula (P-1) was obtained by reacting a corresponding 2-halogen-substituted ketone and a sulfide compound in the absence of a catalyst or in the presence of a silver catalyst to synthesize a sulfonium skeleton and salt-exchanging the sulfonium skeleton with a corresponding anion.

<Preparation of Resist>

The components shown in Table 1 below were dissolved in a solvent shown in Table 1 to prepare a solution having a solid content concentration of 5.3 mass % for Resist Compositions (Ra1) to (Ra11), (Ra13) and (Ra14), a solid content concentration of 3.7 mass % for Resist Composition (Ra12), a solid content concentration of 5.7 mass % for Resist Compositions (Ra15) to (Ra17), and a solid content concentration of 7.5 mass % for Resist Compositions (Rb1) and (Rb2), and the obtained solutions each was filtered through a polyethylene filter having a pore size of 0.05 μm to prepare Resist Compositions (Ra1) to (Ra17), (Rb1) and (Rb2).

TABLE 1

| Resist Composition | Photo-Acid Generator Compound No. | (parts by mass) | pKa | Photo-Acid Generator Compound No. | (parts by mass) | pKa | Resin (A) Compound No. | Mw | Mw/Mn | Compositional Ratio (by mol) | (parts by mass) |
|---|---|---|---|---|---|---|---|---|---|---|---|
| Ra1 | A2-II-11 | 7.2 | −7.2 | | | | A-1 | 5500 | 1.65 | 40/25/35 | 92.30 |
| Ra2 | A2-II-3 | 5.0 | −8.7 | | | | A-1 | 5500 | 1.65 | 40/25/35 | 94.45 |
| Ra3 | A2-II-5 | 3.2 | −11.6 | | | | A-1 | 5500 | 1.65 | 40/25/35 | 96.30 |
| Ra4 | A2-II-21 | 9.0 | −4.6 | | | | A-2 | 8200 | 1.68 | 55/5/40 | 90.50 |
| Ra5 | A2-II-9 | 7.5 | −11.6 | | | | A-3 | 4000 | 1.71 | 35/20/45 | 92.05 |
| Ra6 | A2-II-20 | 6.0 | −9.2 | | | | A-4 | 15000 | 2.05 | 50/15/35 | 93.50 |
| Ra7 | A2-II-12 | 8.0 | −8.7 | | | | A-5 | 8500 | 1.85 | 35/15/50 | 91.50 |
| Ra8 | A2-II-14 | 7.0 | −11.6 | | | | A-6 | 12000 | 1.75 | 40/5/45/10 | 92.60 |
| Ra9 | A2-II-16 | 5.5 | −8.7 | | | | A-7 | 10000 | 1.75 | 20/15/45/20 | 94.00 |
| Ra10 | A2-II-10 | 5.0 | −8.7 | | | | A-8 | 9500 | 1.75 | 30/20/30/20 | 94.65 |
| Ra11 | A2-II-4 | 6.8 | −11.6 | | | | A-9 | 8200 | 1.75 | 30/30/35/5 | 92.60 |
| Ra12 | A2-II-19 | 6.9 | −6.6 | Pb | 1.0 | −3.6 | A-10 | 8300 | 1.81 | 60/5/35 | 91.50 |
| Ra13 | A2-II-18 | 2.5 | −8.0 | A2-II-16 | 2.0 | −8.7 | A-11 | 4500 | 1.81 | 25/20/55 | 94.70 |
| Ra14 | A2-II-1 | 4.8 | −10.4 | | | | A-12 | 6000 | 1.81 | 30/20/30/20 | 94.60 |
| Ra15 | A2-II-13 | 5.0 | −11.6 | Pb | 1.0 | −3.6 | A-13 | 7500 | 1.92 | 20/30/5/45 | 93.10 |
| Ra16 | A2-II-16 | 5.0 | −8.7 | | | | A-14 | 7500 | 1.55 | 45/45/10 | 94.85 |
| Ra17 | A2-II-17 | 4.5 | −8.7 | | | | A-15 | 13400 | 1.62 | 50/50 | 95.35 |
| Rb1 | Pa | 5.0 | −3.9 | | | | A-1 | 5500 | 1.65 | 40/25/35 | 94.45 |
| Rb2 | Pb | 5.0 | −3.6 | | | | A-1 | 5500 | 1.65 | 40/25/35 | 94.50 |

TABLE 1-continued

| Resist Composition | Basic Compound Compound No. | Basic Compound (parts by mass) | Basic Compound Compound No. | Basic Compound (parts by mass) | Surfactant Compound No. | Surfactant (100 ppm) | Solvent 1 | Solvent 2 | Solvent Mixing Ratio by Mass |
|---|---|---|---|---|---|---|---|---|---|
| Ra1 | N-1 | 0.50 | | | W-4 | | SL-1 | SL-2 | 70/30 |
| Ra2 | N-3 | 0.30 | N-6 | 0.25 | W-4 | | SL-1 | SL-2 | 70/30 |
| Ra3 | N-6 | 0.25 | N-9 | 0.25 | W-4 | | SL-1 | SL-2 | 70/30 |
| Ra4 | N-2 | 0.50 | | | W-3 | | SL-1 | SL-2 | 60/40 |
| Ra5 | N-4 | 0.30 | N-8 | 0.15 | W-2 | | SL-1 | SL-2 | 90/10 |
| Ra6 | N-5 | 0.40 | N-6 | 0.10 | W-1 | | SL-1 | SL-2 | 70/30 |
| Ra7 | N-5 | 0.10 | N-7 | 0.40 | W-1 | | SL-1 | SL-2 | 80/20 |
| Ra8 | N-5 | 0.20 | N-8 | 0.20 | W-4 | | SL-1 | SL-2 | 50/50 |
| Ra9 | N-3 | 0.30 | N-4 | 0.20 | W-3 | | SL-1 | SL-2 | 20/80 |
| Ra10 | N-9 | 0.20 | N-6 | 0.15 | W-2 | | SL-1 | SL-2 | 70/30 |
| Ra11 | N-5 | 0.45 | N-9 | 0.15 | W-1 | | SL-1 | SL-2 | 60/40 |
| Ra12 | N-3 | 0.60 | | | W-4 | | SL-1 | SL-2 | 60/40 |
| Ra13 | N-4 | 0.80 | | | W-4 | | SL-2 | | |
| Ra14 | N-5 | 0.40 | N-7 | 0.20 | W-1 | | SL-1 | | |
| Ra15 | N-5 | 0.80 | N-8 | 0.10 | W-2 | | SL-1 | SL-2 | 10/90 |
| Ra16 | N-6 | 0.05 | N-9 | 0.10 | W-2 | | SL-1 | SL-2 | 50/50 |
| Ra17 | N-6 | 0.08 | N-2 | 0.07 | W-2 | | SL-1 | SL-2 | 50/50 |
| Rb1 | N-1 | 0.55 | | | W-4 | | SL-1 | SL-2 | 70/30 |
| Rb2 | N-1 | 0.50 | | | W-4 | | SL-1 | SL-2 | 70/30 |

Abbreviations in Table 1 are as follows.
Pa and Pb: Compounds shown below.

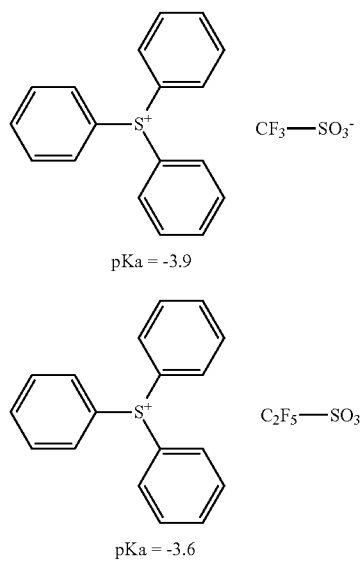

(Pa) pKa = −3.9

(Pb) pKa = −3.6

N-1: N,N-Diphenylaniline
N-2: Diazabicyclo[4.3.0]nonene
N-3: 4-Dimethylaminopyridine
N-4: Triethanolamine
N-5: Tris(methoxyethoxy)ethylamine
N-6: N-(2-Cyanoethyl)-N-ethylaniline
N-7: N,N-Dibutylaniline
N-8: Trioctylamine
N-9: 2-Phenylbenzimidazole
W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Polysiloxane Polymer KP-341 (produced by Shin-Etsu Chemical Co., Ltd.) (silicon-containing)
W-4: PF6320 (produced by OMNOVA) (fluorine-containing)
SL-1: Propylene glycol monomethyl ether acetate
SL-2: Propylene glycol monomethyl ether The resist compositions prepared were evaluated by the following methods.

Example 1

An organic antireflection film AR46 (produced by Rohm and Haas Company) was applied on a silicon wafer and baked at 215° C. for 60 seconds to form a 29 nm-thick antireflection film, and Resist Composition (Ra1) was applied thereon and baked at 120° C. for 60 seconds to form a 150 nm-thick resist film. The obtained wafer was subjected to pattern exposure using an ArF excimer laser scanner (NA: 0.75). Thereafter, the resist film was heated at 120° C. for 60 seconds, developed with butyl acetate (negative tone developer) for 30 seconds (negative tone development), and rinsed with 1-hexanol, and the wafer was then spun at a rotational speed of 4,000 rpm for 30 seconds to obtain a 150-nm (1:1) line-and-space resist pattern.

Examples 2 to 17 and Comparative Examples 1 and 2

In the same manner as in Example 1, 150-nm (1:1) line-and-space resist patterns were obtained using Resist Compositions (Ra2) to (Ra17), (Rb1) and (Rb2), respectively. Here, in Example 12, the thickness of the resist film was set to 100 nm.

Example 18

An organic antireflection film AR46 (produced by Rohm and Haas Company) was applied on a silicon wafer and baked at 215° C. for 60 seconds to form a 29 nm-thick antireflection film, and Resist Composition (Ra11) was applied thereon and baked at 120° C. for 60 seconds to form a 150 nm-thick resist film. The obtained wafer was subjected to pattern exposure using an ArF excimer laser scanner (NA: 0.75). Thereafter, the resist film was heated at 120° C. for 60 seconds, developed with an aqueous tetramethylammonium hydroxide solution (2.38 mass %) (positive tone developer) for 30 seconds (positive tone development), and rinsed with pure water to obtain a pattern having a pitch of 600 nm and a line width of 450 nm. Furthermore, the resist film was developed with butyl acetate (negative tone developer) for 30 seconds (negative tone development) and rinsed with 1-hexanol, and the wafer was then spun at a rotational speed of 4,000 rpm for 30 seconds to obtain a 150-nm (1:1) line-and-space resist pattern.

Example 19

An organic antireflection film AR46 (produced by Rohm and Haas Company) was applied on a silicon wafer and baked at 215° C. for 60 seconds to form a 29 nm-thick antireflection film, and Resist Composition (Ra11) was applied thereon and baked at 120° C. for 60 seconds to form a 150 nm-thick resist film. The obtained wafer was subjected to pattern exposure using an ArF excimer laser scanner (NA: 0.75). Thereafter, the resist film was heated at 120° C. for 60 seconds, developed with butyl acetate (negative tone developer) for 30 seconds (negative tone development), and rinsed with 1-hexanol, and the wafer was then spun at a rotational speed of 4,000 rpm for 30 seconds to obtain a pattern having a pitch of 600 nm and a line width of 450 nm. Furthermore, the resist film was developed with an aqueous tetramethylammonium hydroxide solution (2.38 mass %) (positive tone developer) for 30 seconds (positive tone development) and rinsed with pure water to obtain a 150-nm (1:1) line-and-space resist pattern.

Examples 20 to 29 and Comparative Examples 3 and 4

In the same manner as in Example 1, 150-nm (1:1) line-and-space resist patterns were obtained by changing the combination of the resist composition, negative tone developer and rinsing solution for negative tone development to the combination shown in Table 2.

TABLE 2

| | | Resist Composition | Negative Tone Developer | | Mass Ratio | Rinsing Solution for Negative Tone Development | | Mass Ratio |
|---|---|---|---|---|---|---|---|---|
| Example | 20 | Ra11 | butyl acetate | — | 100 | 3-methyl-1-butanol | — | 100 |
| | 21 | Ra11 | isoamyl acetate | — | 100 | 1-hexanol | — | 100 |
| | 22 | Ra11 | methyl isobutyl ketone | — | 100 | 1-hexanol | — | 100 |
| | 23 | Ra11 | 2-hexanone | — | 100 | 1-hexanol | — | 100 |
| | 24 | Ra11 | n-butyl ether | — | 100 | 1-hexanol | — | 100 |
| | 25 | Ra11 | butyl acetate | 2-hexanone | 80/20 | 1-hexanol | — | 100 |
| | 26 | Ra11 | isoamyl acetate | n-butyl ether | 70/30 | 1-hexanol | — | 100 |
| | 27 | Ra11 | isoamyl acetate | — | 100 | 2-heptanol | — | 100 |
| | 28 | Ra11 | isoamyl acetate | — | 100 | decane | — | 100 |
| | 29 | Ra11 | isoamyl acetate | — | 100 | 2-heptanol | decane | 50/50 |
| Comparative Example | 3 | Rb1 | methyl ethyl ketone | — | 100 | — | — | — |
| | 4 | Rb1 | dipropyl ether | — | 100 | dodecane | — | 100 |

In Table 2, the "mass ratio" indicates the mixing ratio by mass of two kinds of solvents when two kinds of organic solvents were used in combination as the negative tone developer or when two kinds of organic solvents were used in combination as the rinsing solution for negative tone development. At this time, when the negative tone developer or rinsing solution for negative tone development was composed of a sole organic solvent, the mass ratio is 100.

The vapor pressure and boiling point of each of the solvent for negative tone development and the solvent in the rinsing solution for negative tone development, used in Examples, are shown in Table 3 below.

TABLE 3

| Name of Solvent | Vapor Pressure (kPa, value at 20° C.) | Boiling Point (° C.) |
|---|---|---|
| Butyl acetate | 1.2 | 126 |
| Isoamyl acetate | 0.53 | 142 |
| Methyl isobutyl ketone | 2.1 | 117-118 |
| 2-Hexanone | 0.36 | 126-128 |
| Methyl ethyl ketone | 10.5 | 80 |
| Dipropyl ether | 8.33 | 88-90 |
| n-Butyl ether | 0.64 | 142 |
| 1-Hexanol | 0.13 | 157 |
| 1-Heptanol | 0.015 | 175 |
| 2-Heptanol | 0.133 | 150-160 |
| Decane | 0.17 | 174 |
| Dodecane | 0.04 | 216 |
| 3-Methyl-1-butanol | 0.4 | 132 |

Evaluation of Line Edge Roughness (LER):

The 150-nm (1:1) line-and-space resist patterns obtained in Examples 1 to 29 and Comparative Examples 1 to 4 were observed by a Critical Dimension scanning electron microscope (S-9260, manufactured by Hitachi Ltd.). With respect to the range of 2 μm edge in the longitudinal direction of the 150-nm line pattern, the distance from the reference line where the edge should be present was measured at 50 points and after determining the standard deviation, 3σ was computed. A smaller value indicates better performance. The results are shown in Table 4 below.

Evaluation of Dimensional In-Plane Uniformity:

The 150-nm (1:1) line-and-space resist patterns obtained in Examples 1 to 29 and Comparative Examples 1 to 4 were measured for the dimension at 50 portions at intervals of 2 μM by using a scanning microscope (S-9260, manufactured by Hitachi Ltd.). The standard deviation of 50 portions was determined, and 3σ was computed. A smaller value indicates better performance. The results are shown in Table 4.

Evaluation of Pattern Profile (Undercut in Lower Part of Pattern):

The 150-nm (1:1) line-and-space resist patterns obtained in Examples 1 to 29 and Comparative Examples 1 to 4 were observed by a scanning electron microscope (S4800, manufactured by Hitachi Ltd.). The pattern profile was rated A when no undercut was observed in the lower part of the resist pattern and the line width of the pattern bottom was from 99 to 101% based on the line width of the pattern top, rated B when a undercut was slightly observed in the resist pattern but the line width of the pattern bottom was in the range from 96% to less than 99% of the line width of the pattern top, and rated C when a undercut was observed in the resist pattern and the line width of the pattern bottom was less than 96% of the line width of the pattern top. The results are shown in Table 4.

the same are suitably used in the process of producing a semiconductor such as IC, in the production of a circuit board for liquid crystal, thermal head and the like, and in the lithography process of other photo-fabrication processes.

While the invention has been described in detail and with reference to specific embodiments thereof, it will be apparent to one skilled in the art that various changes and modifications can be made therein without departing from the spirit and scope of the present invention.

TABLE 4

| | | Photo-Acid Generator | | Photo-Acid Generator | | Evaluation Results | | |
|---|---|---|---|---|---|---|---|---|
| | Resist Composition | Compound No. | (parts by mass) | Compound No. | (parts by mass) | LER (nm) | Dimensional In-Plane Uniformity (nm) | Pattern Profile (under cut) |
| Example | | | | | | | | |
| 1 | Ra1 | A2-II-11 | 7.2 | | | 5.1 | 4.4 | B |
| 2 | Ra2 | A2-II-3 | 5.0 | | | 4.7 | 3.0 | A |
| 3 | Ra3 | A2-II-5 | 3.2 | | | 3.1 | 2.8 | A |
| 4 | Ra4 | A2-II-21 | 9.0 | | | 6.0 | 6.8 | B |
| 5 | Ra5 | A2-II-9 | 7.5 | | | 4.0 | 2.6 | A |
| 6 | Ra6 | A2-II-20 | 6.0 | | | 4.6 | 3.8 | A |
| 7 | Ra7 | A2-II-12 | 8.0 | | | 4.4 | 3.1 | A |
| 8 | Ra8 | A2-II-14 | 7.0 | | | 3.4 | 2.5 | A |
| 9 | Ra9 | A2-II-16 | 5.5 | | | 4.7 | 4.0 | A |
| 10 | Ra10 | A2-II-10 | 5.0 | | | 4.1 | 3.3 | A |
| 11 | Ra11 | A2-II-4 | 6.8 | | | 3.4 | 2.6 | A |
| 12 | Ra12 | A2-II-19 | 6.9 | Pb | 1.0 | 5.3 | 4.6 | B |
| 13 | Ra13 | A2-II-18 | 2.5 | A2-II-16 | 2.0 | 5.0 | 4.8 | B |
| 14 | Ra14 | A2-II-1 | 4.8 | | | 3.1 | 2.5 | A |
| 15 | Ra15 | A2-II-13 | 5.0 | Pb | 1.5 | 3.5 | 2.8 | A |
| 16 | Ra16 | A2-II-16 | 5.0 | | | 4.5 | 3.6 | A |
| 17 | Ra17 | A2-II-17 | 4.5 | | | 4.3 | 3.4 | A |
| 18 | Ra11 | A2-II-4 | 5.0 | | | 3.3 | 2.6 | A |
| 19 | Ra11 | A2-II-4 | 5.0 | | | 3.6 | 2.3 | A |
| 20 | Ra11 | A2-II-4 | 5.0 | | | 3.1 | 2.7 | A |
| 21 | Ra11 | A2-II-4 | 5.0 | | | 3.4 | 2.1 | A |
| 22 | Ra11 | A2-II-4 | 5.0 | | | 3.5 | 2.6 | A |
| 23 | Ra11 | A2-II-4 | 5.0 | | | 3.8 | 2.7 | A |
| 24 | Ra11 | A2-II-4 | 5.0 | | | 3.3 | 2.4 | A |
| 25 | Ra11 | A2-II-4 | 5.0 | | | 3.2 | 3.0 | A |
| 26 | Ra11 | A2-II-4 | 5.0 | | | 3.2 | 2.2 | A |
| 27 | Ra11 | A2-II-4 | 5.0 | | | 3.8 | 2.9 | A |
| 28 | Ra11 | A2-II-4 | 5.0 | | | 3.1 | 3.0 | A |
| 29 | Ra11 | A2-II-4 | 5.0 | | | 3.3 | 2.6 | A |
| Comparative Example | | | | | | | | |
| 1 | Rb1 | Pa | 5.0 | | | 10.5 | 10.5 | C |
| 2 | Rb2 | Pb | 5.0 | | | 11.4 | 11.2 | C |
| 3 | Rb1 | Pa | 5.0 | | | 12.5 | 11.1 | C |
| 4 | Rb1 | Pa | 5.0 | | | 12.2 | 11.3 | C |

As apparent from Table 4, when the resist composition for negative tone development of the present invention is used, the line edge roughness is reduced and a high-precision fine pattern with excellent dimensional in-plane uniformity as well as excellent profile free from biting in the lower part of the pattern can be stably formed.

INDUSTRIAL APPLICABILITY

According to the present invention, a resist composition for negative tone development, which can form a pattern having a good profile improved in the pattern undercut and moreover, can reduce the line edge roughness and enhance the in-plane uniformity of the pattern dimension, and a pattern forming method using the same can be provided.

The resist composition for negative tone development of the present invention and the pattern forming method using This application is based on Japanese Patent Application (Japanese Patent Application No. 2007-155083) filed on Jun. 12, 2007, the contents of which are incorporated herein by way of reference.

The invention claimed is:

1. A pattern forming method, comprising:
forming a resist film by applying a resist composition for negative tone development, which contains (A) a resin capable of increasing a polarity of the resin (A) by an action of an acid to increase the solubility of the resin (A) in a positive tone developer which is an alkali developer and decrease the solubility of the resin (A) in a negative tone developer containing an organic solvent, (B) a compound capable of generating an acid having an acid dissociation index pKa of −4.0 or less upon irradiation with an actinic ray or radiation, and (C) a solvent;

exposing the resist film; and developing the resist film after the exposing to form a negative tone pattern by using the negative tone developer, wherein in the developing step, unexposed parts of the resist film dissolve in the negative tone developer.

2. The pattern forming method according to claim 1, further comprising:

after the exposing, developing the resist film after the exposing by using the positive tone developer at least either one of before and after the developing by using the negative tone developer.

3. The pattern forming method according to claim 1, wherein the organic solvent contained in the negative tone developer is at least one solvent selected from the group consisting of a ketone-based solvent, an ester-based solvent, an alcohol-based solvent, an amide-based solvent, an ether-based solvent and a hydrocarbon-based solvent.

4. The pattern forming method according to claim 1, wherein the organic solvent contained in the negative tone developer is an ester-based solvent.

5. The pattern forming method according to claim 4, wherein the ester-based solvent is butyl acetate or isoamyl acetate.

6. The pattern forming method according to claim 1, wherein the negative tone developer contains at least one kind of a solvent selected from the group consisting of organic solvents having a vapor pressure at 20° C. of 5 kPa or less.

7. The pattern forming method according to claim 1, wherein (B) the compound capable of generating an acid having an acid dissociation index pKa of −4.0 or less upon irradiation with an actinic ray or radiation is a sulfonium salt compound or an iodonium salt compound.

8. The pattern forming method according to claim 1, wherein the resin (A) is a resin having a group capable of decomposing by an action of an acid to produce an alkali-soluble group on either one or both of the main chain and the side chain of the resin (A).

9. The pattern forming method according to claim 1, wherein the resin (A) contains at least one kind of a repeating unit having an alicyclic hydrocarbon-containing partial structure represented by any one of the following formulae (pI) to (pV):

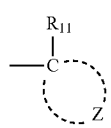

(pI)

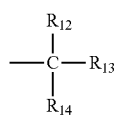

(pII)

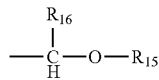

(pIII)

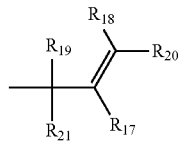

(pIV)

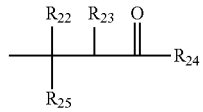

(pV)

wherein in formulae (pI) to (pV), $R_{11}$ represents a methyl group, an ethyl group, an n-propyl group, an isopropyl group, an n-butyl group, an isobutyl group or a sec-butyl group;

Z represents an atomic group necessary for forming a cycloalkyl group together with the carbon atom;

each of $R_{12}$ to $R_{16}$ independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group;

each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group; and each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group, and $R_{23}$ and $R_{24}$ may combine with each other to form a ring.

10. The pattern forming method according to claim 9, wherein the resin (A) further has a lactone group.

11. The pattern forming method according to claim 10, wherein the lactone group contained in the resin (A) is the following lactone group:

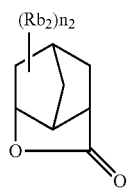

(LC1-4)

wherein $n_2$ represents an integer of 0 to 4; and $Rb_2$ represents a substituent, and when $n_2$ is an integer of 2 or more, a plurality of $Rb_2$'s may be the same or different, and the plurality of $Rb_2$'s may combine with each other to form a ring.

12. The pattern forming method according to claim 3, wherein (B) the compound capable of generating an acid having an acid dissociation index pKa of −4.0 or less upon irradiation with an actinic ray or radiation is a sulfonium salt compound or an iodonium salt compound.

13. The pattern forming method according to claim 3, wherein the resin (A) contains at least one kind of a repeating unit having an alicyclic hydrocarbon-containing partial structure represented by any one of the following formulae (pI) to (pV):

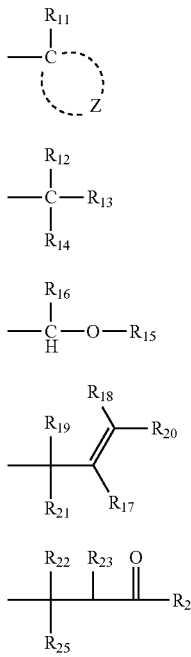

wherein in formulae (pI) to (pV), $R_{11}$ represents a methyl group, an ethyl group, an n-propyl group, an isopropyl group, an n-butyl group, an isobutyl group or a sec-butyl group;

Z represents an atomic group necessary for forming a cycloalkyl group together with the carbon atom;

each of $R_{12}$ to $R_{16}$ independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group;

each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group; and each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group, and $R_{23}$ and $R_{24}$ may combine with each other to form a ring.

14. The pattern forming method according to claim 4, wherein (B) the compound capable of generating an acid having an acid dissociation index pKa of −4.0 or less upon irradiation with an actinic ray or radiation is a sulfonium salt compound or an iodonium salt compound.

15. The pattern forming method according to claim 4, wherein the resin (A) contains at least one kind of a repeating unit having an alicyclic hydrocarbon-containing partial structure represented by any one of the following formulae (pI) to (pV):

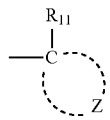

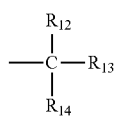

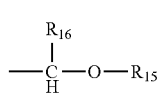

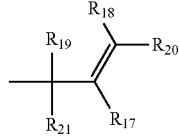

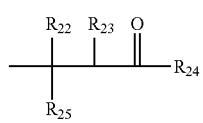

wherein in formulae (pI) to (pV), $R_{11}$ represents a methyl group, an ethyl group, an n-propyl group, an isopropyl group, an n-butyl group, an isobutyl group or a sec-butyl group;

Z represents an atomic group necessary for forming a cycloalkyl group together with the carbon atom;

each of $R_{12}$ to $R_{16}$ independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group;

each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group; and each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group, and $R_{23}$ and $R_{24}$ may combine with each other to form a ring.

16. The pattern forming method according to claim 3, wherein the organic solvent contained in the negative tone developer is at least one solvent selected from the group consisting of ketone-based solvents.

17. The pattern forming method according to claim 1, wherein the negative tone developer substantially consists of one or more organic solvents.

18. The pattern forming method according to claim 1, wherein the negative tone developer consists essentially of one or more organic solvents and optionally a surfactant.

19. A method for manufacturing an electronic device, comprising the pattern forming method according to claim 1.

* * * * *